US009921255B2

United States Patent
Bowers et al.

(10) Patent No.: US 9,921,255 B2
(45) Date of Patent: Mar. 20, 2018

(54) SENSING RADIATION METRICS THROUGH MODE-PICKUP SENSORS

(71) Applicant: California Institute of Technology, Pasadena, CA (US)

(72) Inventors: Steven Bowers, Duarte, CA (US); Amirreza Safaripour Tabbalvandani, Pasadena, CA (US); Seyed Ali Hajimiri, La Canada, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 727 days.

(21) Appl. No.: 13/766,667

(22) Filed: Feb. 13, 2013

(65) Prior Publication Data

US 2014/0062805 A1    Mar. 6, 2014

Related U.S. Application Data

(60) Provisional application No. 61/598,237, filed on Feb. 13, 2012.

(51) Int. Cl.
*G01R 29/10*    (2006.01)
*G01R 29/08*    (2006.01)
(Continued)

(52) U.S. Cl.
CPC ........... *G01R 29/0878* (2013.01); *H01Q 1/38* (2013.01); *H01Q 13/10* (2013.01); *H01Q 21/061* (2013.01);
(Continued)

(58) Field of Classification Search
CPC ........ H01Q 1/38; H01Q 13/10; H01Q 21/061; H01Q 21/28; H01Q 21/24; G01R 29/0878; G01R 31/308
(Continued)

(56) References Cited

U.S. PATENT DOCUMENTS 5,014,070 A      5/1991  Stock et al.
5,030,962 A  *   7/1991  Rees .................. H01Q 1/247
                                              343/700 MS
(Continued)

FOREIGN PATENT DOCUMENTS

DE    10200601003 A1   6/2007
EP        0791878 A2   8/1997
(Continued)

OTHER PUBLICATIONS

U.S. Appl. No. 13/654,420, filed Oct. 18, 2012, California Institute of Technology, unpublished.
(Continued)

*Primary Examiner* — Khai M Nguyen
(74) *Attorney, Agent, or Firm* — Alston & Bird LLP

(57) ABSTRACT

A sensing structure includes an integrated circuit substrate, and a first sensor formed on or above the integrated circuit substrate adapted to detect a first part of an electromagnetic field in the integrated circuit substrate. A sensing structure includes a dielectric substrate and a first sensor formed on or above the dielectric substrate adapted to detect a first part of an electromagnetic field in the integrated circuit substrate. A sensing structure includes an integrated circuit substrate and a multitude of sensors formed on or above the integrated circuit substrate adapted to detect a multitude of parts of an electromagnetic field in the integrated circuit substrate. A method for sensing a first part of an electromagnetic field includes providing an integrated circuit substrate, forming a first sensor on or above the integrated circuit substrate, and detecting the first part of the electromagnetic field in the integrated circuit substrate.

45 Claims, 45 Drawing Sheets

(51) Int. Cl.
*H01Q 1/38* (2006.01)
*H01Q 13/10* (2006.01)
*H01Q 21/06* (2006.01)
*H01Q 21/24* (2006.01)
*H01Q 21/28* (2006.01)
*G01R 31/308* (2006.01)

(52) U.S. Cl.
CPC ............. *H01Q 21/24* (2013.01); *H01Q 21/28* (2013.01); *G01R 31/308* (2013.01)

(58) Field of Classification Search
USPC .................................. 343/703, 702, 700 MS
See application file for complete search history.

(56) References Cited

U.S. PATENT DOCUMENTS

| | | | |
|---|---|---|---|
| 5,164,985 | A | 11/1992 | Nysen et al. |
| 5,886,671 | A | 3/1999 | Riemer et al. |
| 5,999,128 | A | 12/1999 | Stephens et al. |
| 6,140,972 | A | 10/2000 | Johnston et al. |
| 6,313,792 | B1 | 11/2001 | Merlet et al. |
| 6,469,822 | B1 | 10/2002 | Zhu |
| 6,927,745 | B2 | 8/2005 | Brown et al. |
| 7,208,940 | B2 | 4/2007 | Withanawasam |
| 7,352,328 | B2 * | 4/2008 | Moon .................... H01Q 1/521 343/700 MS |
| 7,372,406 | B2 | 5/2008 | Shiotsu et al. |
| 7,557,758 | B2 * | 7/2009 | Rofougaran ........... 343/700 MS |
| 7,609,971 | B1 | 10/2009 | Zhou |
| 7,894,777 | B1 * | 2/2011 | Rofougaran ..................... 455/73 |
| 7,911,402 | B2 | 3/2011 | Rowson et al. |
| 8,319,549 | B2 | 11/2012 | Sengupta et al. |
| 8,432,326 | B2 * | 4/2013 | Rofougaran et al. ......... 343/777 |
| 8,909,170 | B2 | 12/2014 | Rofougaran |
| 9,225,069 | B2 | 12/2015 | Bowers et al. |
| 2001/0003442 | A1 | 6/2001 | Smith |
| 2003/0035610 | A1 | 2/2003 | Keys et al. |
| 2003/0080899 | A1 | 5/2003 | Lee et al. |
| 2003/0184479 | A1 | 10/2003 | Collins |
| 2003/0202801 | A1 | 10/2003 | Izadpanah |
| 2004/0184556 | A1 | 9/2004 | Kubo et al. |
| 2005/0242993 | A1 | 11/2005 | Hein |
| 2007/0047966 | A1 | 3/2007 | Hironishi et al. |
| 2007/0176836 | A1 | 8/2007 | Abramov et al. |
| 2008/0136720 | A1 | 6/2008 | Parsche et al. |
| 2009/0128413 | A1 | 5/2009 | Crouch et al. |
| 2009/0140724 | A1 | 6/2009 | Kentsch |
| 2009/0168818 | A1 | 7/2009 | Gollier et al. |
| 2009/0179798 | A1 | 7/2009 | Chiaretti et al. |
| 2009/0220030 | A1 | 9/2009 | Uhl et al. |
| 2010/0019332 | A1 | 1/2010 | Taylor |
| 2010/0045565 | A1 | 2/2010 | Izadpanah |
| 2010/0156747 | A1 | 6/2010 | Montgomery |
| 2010/0231452 | A1 | 9/2010 | Babakhani et al. |
| 2010/0265146 | A1 | 10/2010 | Montgomery et al. |
| 2011/0057712 | A1 | 3/2011 | Bowers et al. |
| 2011/0068807 | A1 | 3/2011 | Kesil et al. |
| 2011/0103801 | A1 | 5/2011 | Breunig et al. |
| 2011/0115677 | A1 | 5/2011 | Rao et al. |
| 2011/0170869 | A1 | 7/2011 | Mandai et al. |
| 2013/0278473 | A1 | 10/2013 | Bowers et al. |
| 2013/0279631 | A1 | 10/2013 | Bowers et al. |
| 2014/0161464 | A1 | 6/2014 | Bowers et al. |
| 2016/0336660 | A1 | 11/2016 | Bowers et al. |

FOREIGN PATENT DOCUMENTS

| | | |
|---|---|---|
| KR | 10-2001-0096244 A | 11/2001 |
| RU | 2414051 C1 | 3/2011 |
| WO | 2010-015365 A2 | 2/2010 |
| WO | 2012/094051 A2 | 7/2012 |
| WO | 2013/112214 A2 | 8/2013 |
| WO | 2013/123090 A1 | 8/2013 |
| WO | 2013/123520 A1 | 8/2013 |
| WO | 2013/172896 A2 | 11/2013 |
| WO | 2014/018927 A1 | 1/2014 |

OTHER PUBLICATIONS

International Search Report for International Application No. PCT/US2012/060698 dated Jul. 18, 2013, 2 pages.
International Preliminary Report on Patentability for PCT Application No. PCT/US2013/026749 dated Aug. 28, 2014, 10 pages.
International Search Report and Written Opinion for International Application No. PCT/US2013/025989 dated Jun. 3, 2013, 12 pages.
International Preliminary Report on Patentability for International Application No. PCT/US2012/060698 dated Apr. 22, 2014, 6 pages.
Babakhani et al., "Transmitter Architectures based on Near-Field Direct Antenna Modulation," IEEE Journal of Solid-State Circuits, vol. 43, No. 12, Dec. 2008, pp. 2674-2692.
Laskin et al., "170-GHz Transceiver with On-Chip Antennas in SiGe Technology," IEEE Radio Frequency Integrated Circuits Symposium Digest, Jun. 2008, pp. 637-640.
Park et al., "A 0.38THz Fully Integrated Transceiver utilizing Quadrature Push-Push Circuitry," Symposium on VLSI Circuits Digest of Technical Papers, Jun. 2011, pp. 22-23.
Sengupta et al., "A 0.28THz 4×4 Power-Generation and Beam-Steering Array," International Solid State Circuits Conference Digest, Feb. 2012, pp. 9-11.
Sengupta et al., "Distributed Active Radiation for THz Signal Generation," International Solid State Circuits Conference Digest, Feb. 2011, pp. 288-289.
Sengupta et al., "Sub-THz Beam-Forming using Near-Field Coupling of Distributed Active Radiator Arrays," Radio Frequency Integrated Circuits Symposium, Jun. 2011, 4 pages.
Tang et al., "A 144GHz 0.76cm-Resolution Sub-Carrier SAR Phase Radar for 3D Imaging in 65nm CMOS," International Solid State Circuits Conference Digest, Feb. 2012, pp. 264-266.
International Search Report and Written Opinion for International Application No. PCT/US2013/052396 dated Nov. 21, 2013, 12 pages.
International Search Report and Written Opinion for International Application No. PCT/US2013/026749 dated Dec. 10, 2013, 11 pages.
International Preliminary Report on Patentability for International Application No. PCT/US2013/052396 dated Feb. 5, 2015, 9 pages.
Non-Final Office Action for U.S. Appl. No. 13/654,420 dated Jan. 21, 2015, 22 pages.
Non-Final Office Action for U.S. Appl. No. 13/952,493 dated Mar. 2, 2015, 29 pages.
Non-Final Office Action for U.S. Appl. No. 13/770,935 dated Apr. 8, 2015, 8 pages.
PCT International Preliminary Report on Patentability for application PCT/US2013/025989 dated Aug. 19, 2014.
PCT Written Opinion of the International Searching Authority for application PCT/US2012/060698 dated Jul. 18, 2013.
U.S. Appl. No. 13/654,420, Notice of Allowance dated Aug. 19, 2015.
U.S. Appl. No. 13/654,420, Response to Non-Final Office Action dated Jul. 21, 2015.
U.S. Appl. No. 14/944,089, Non-Final Office Action dated Sep. 22, 2017.

* cited by examiner

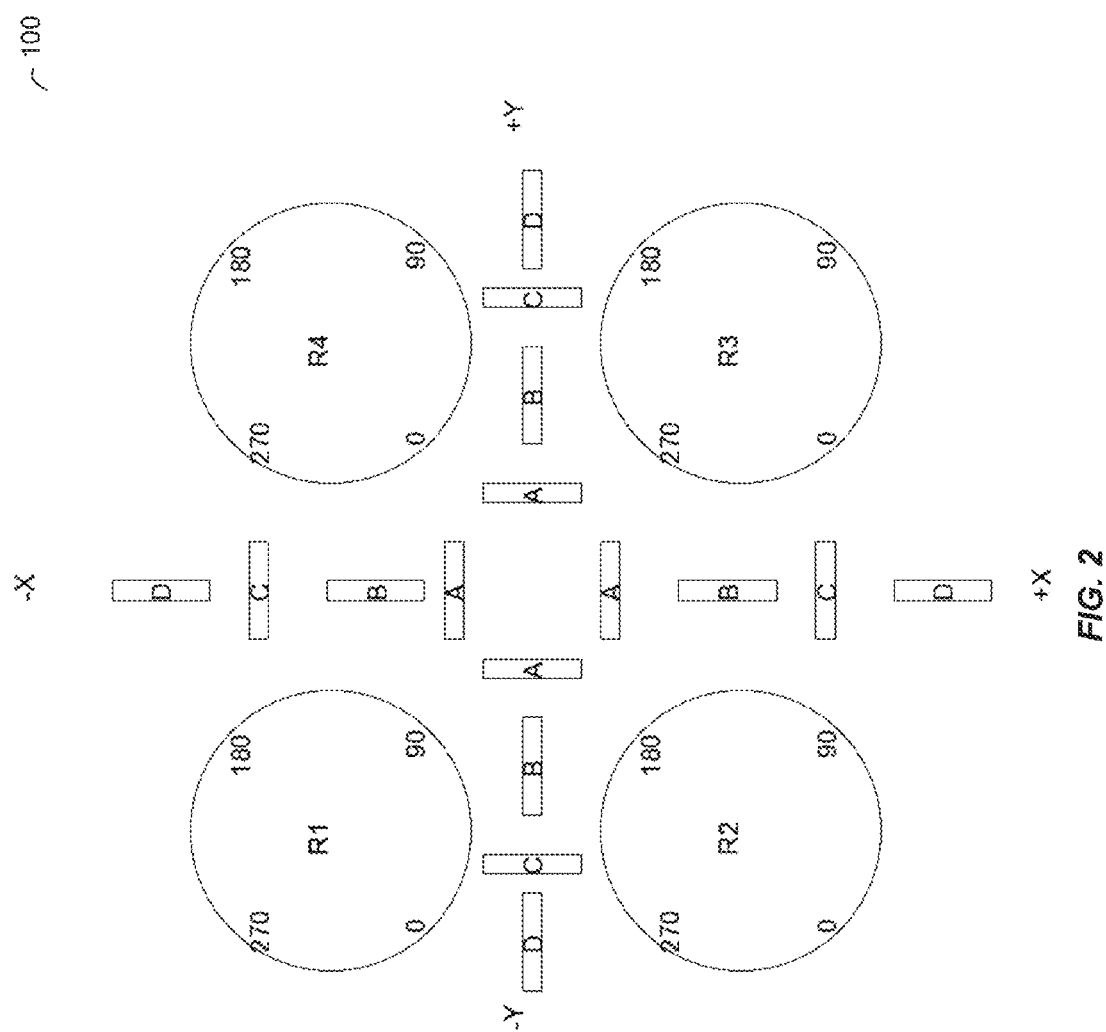

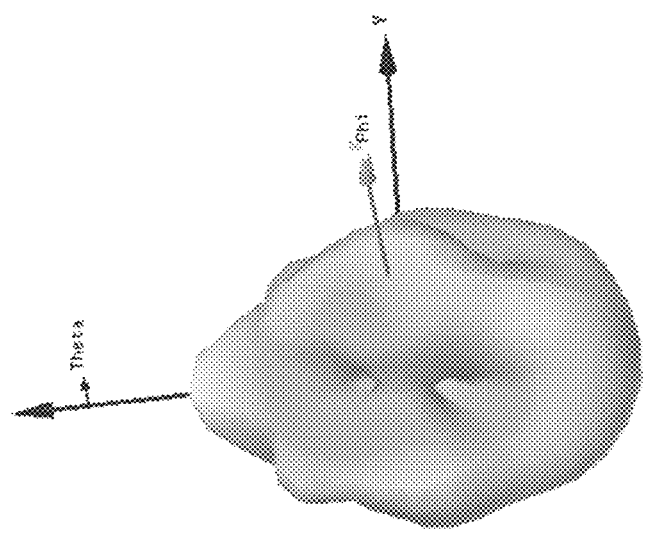
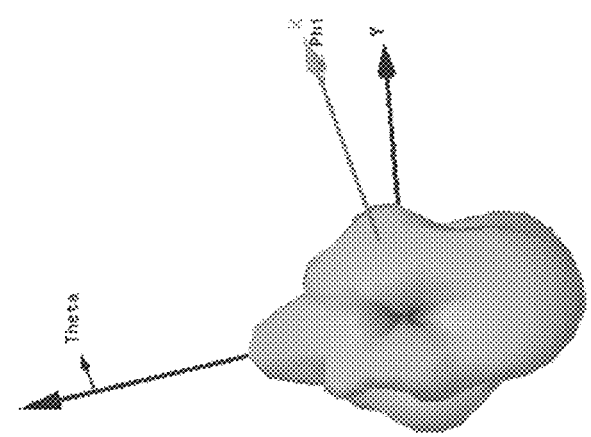
FIG. 7B
FIG. 7A

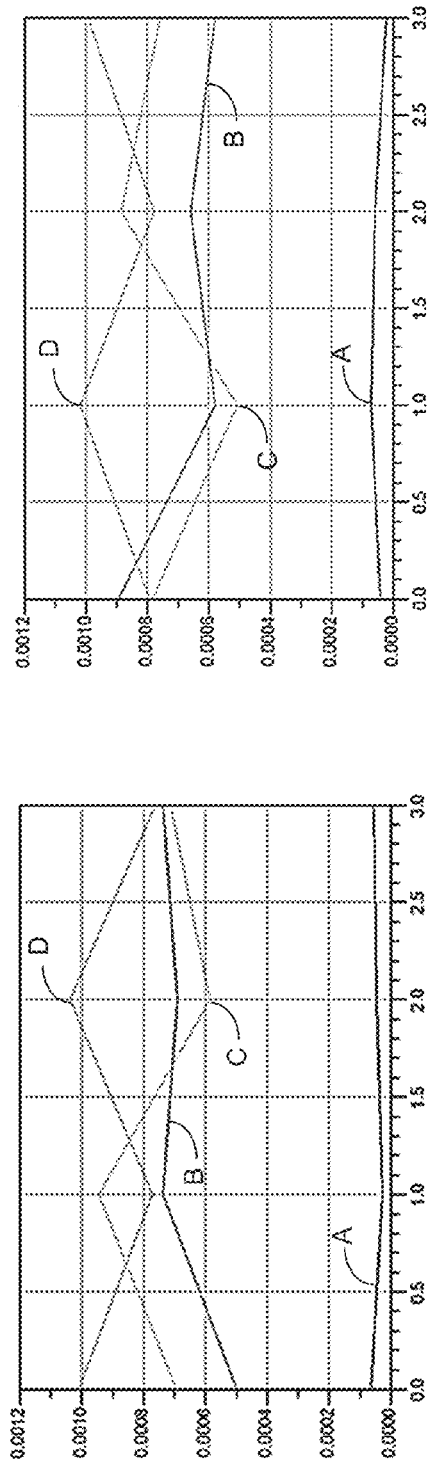
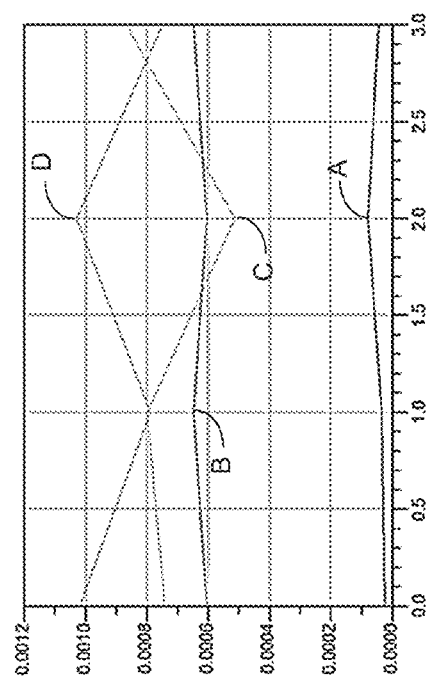
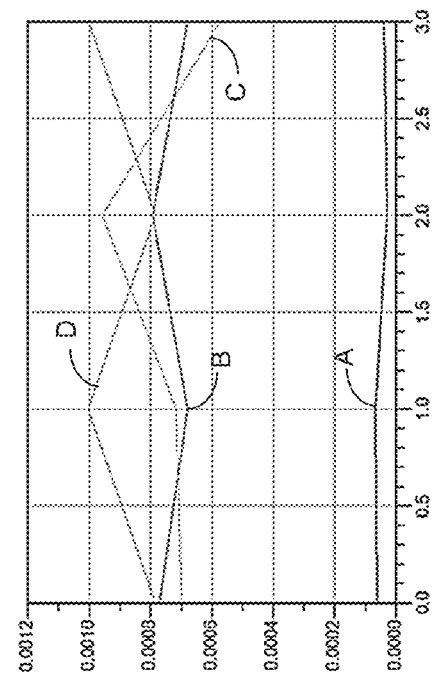
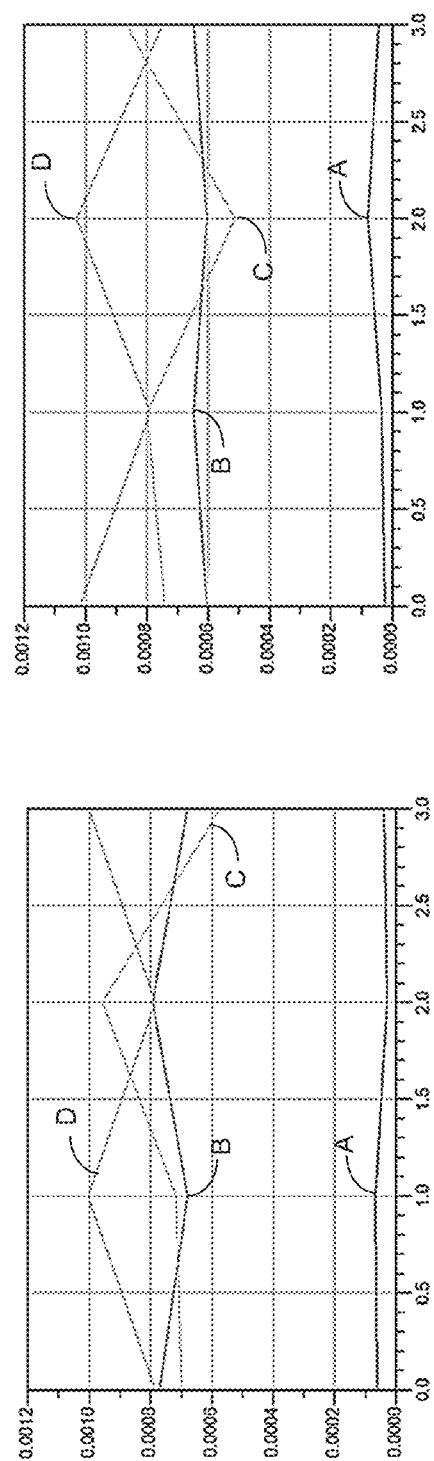
FIG. 10A
FIG. 10B
FIG. 10C
FIG. 10D

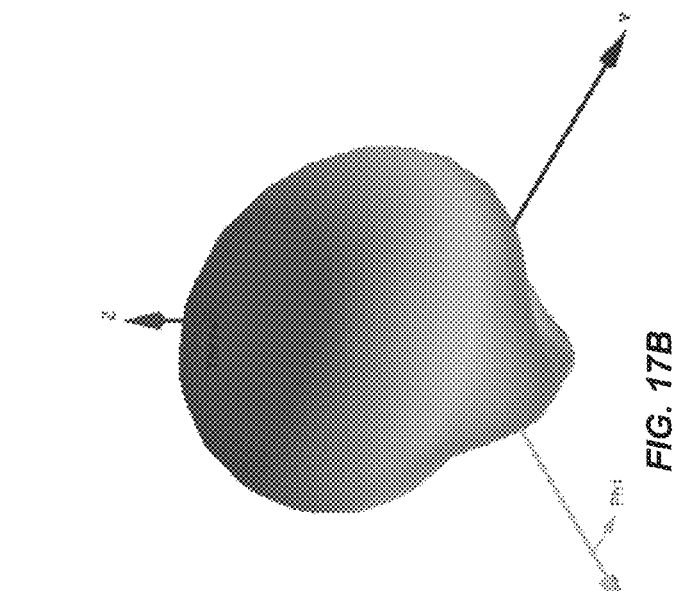
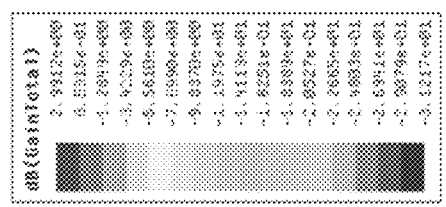
FIG. 17B
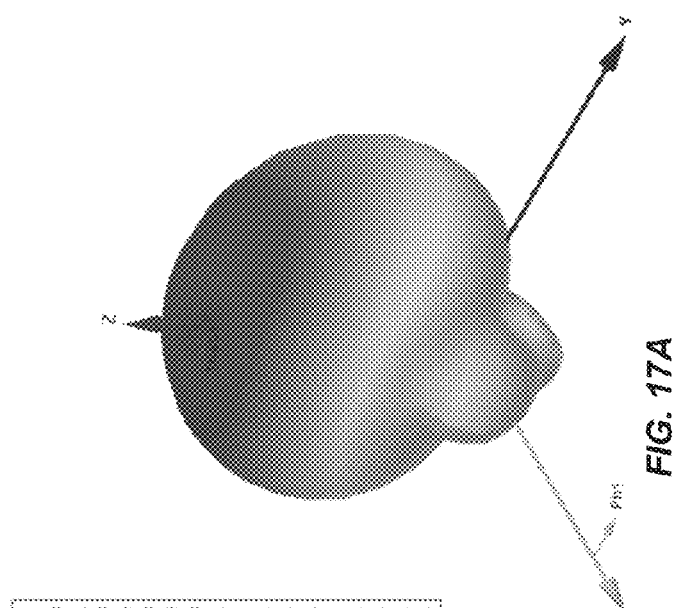
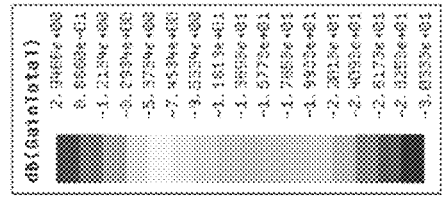
FIG. 17A
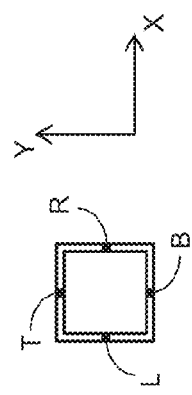
FIG. 18

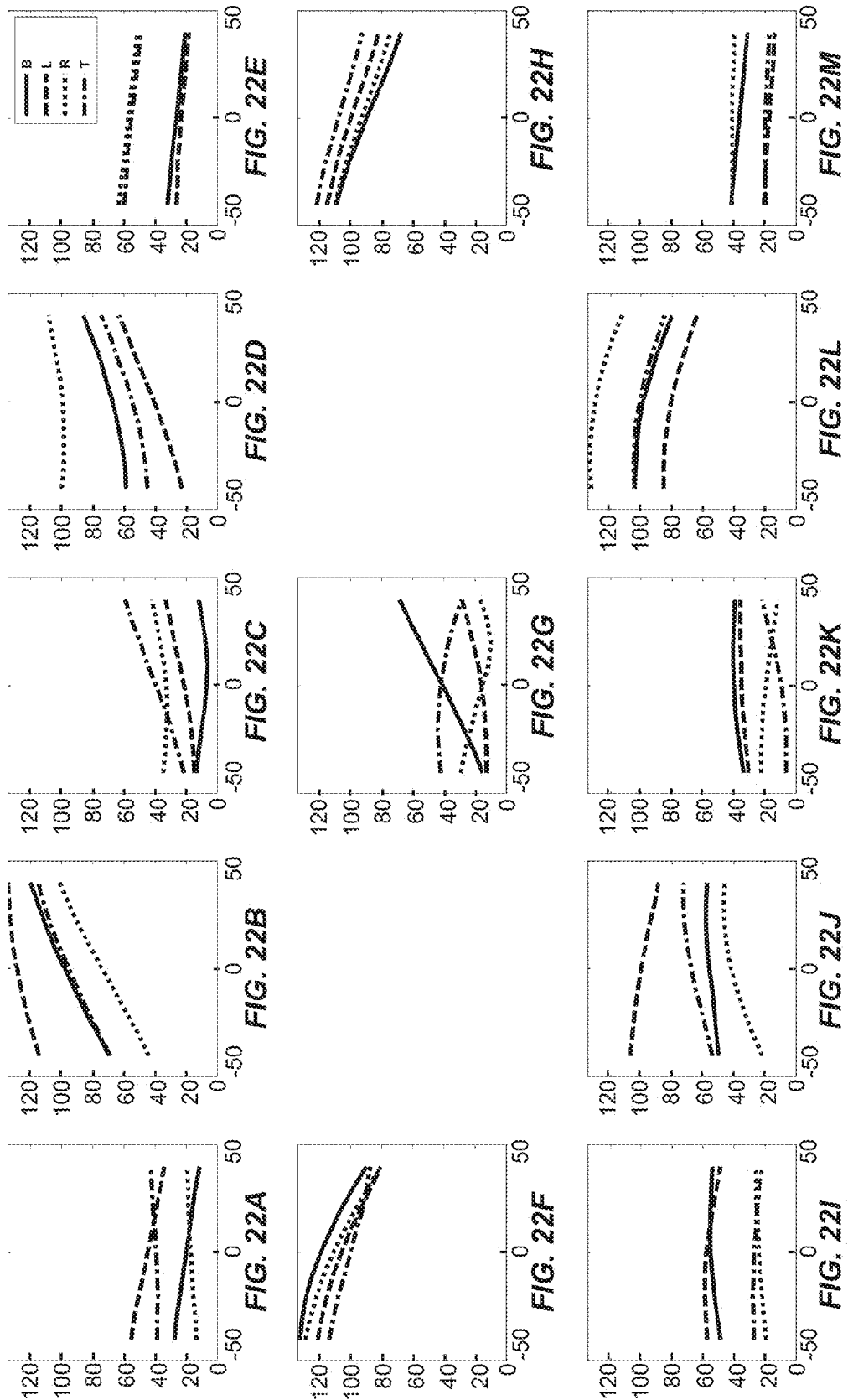

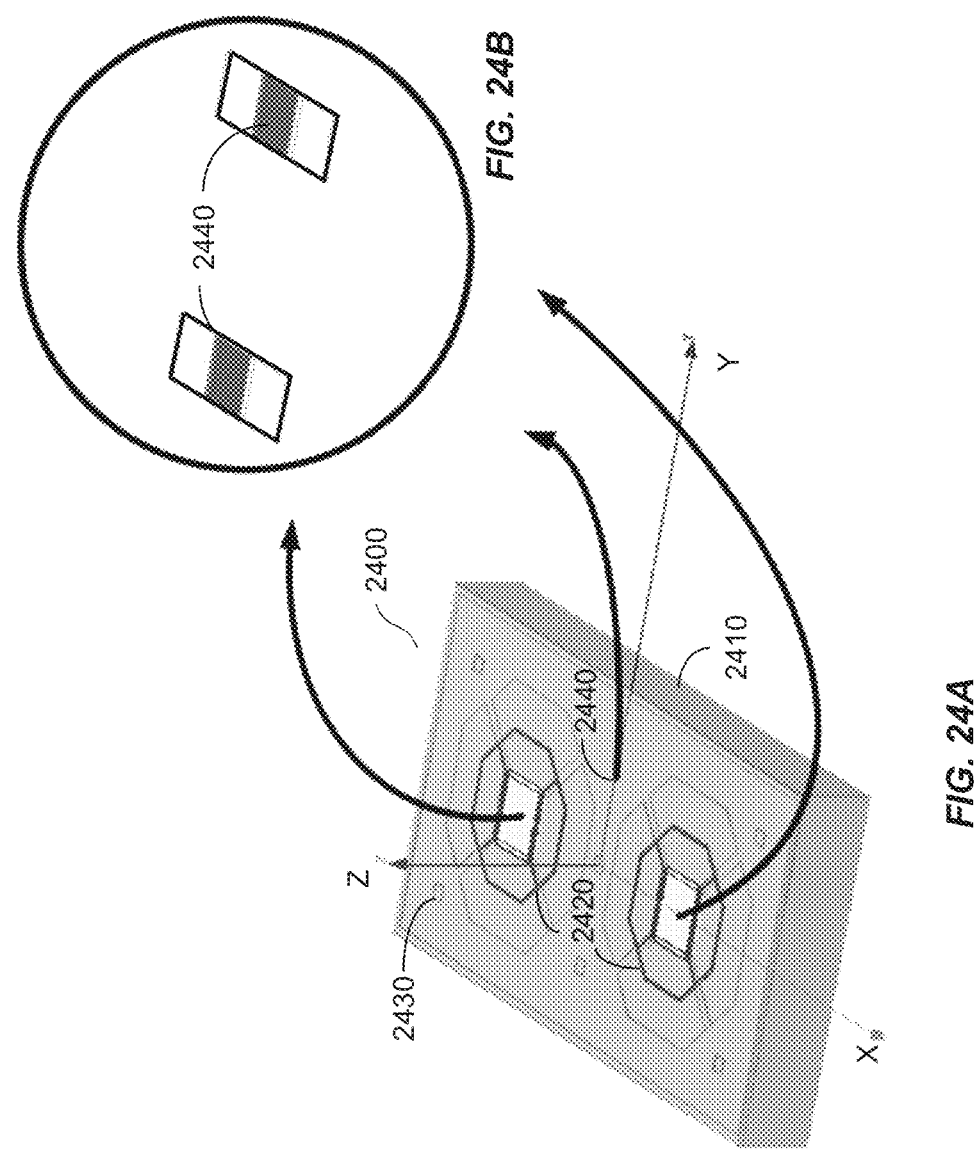

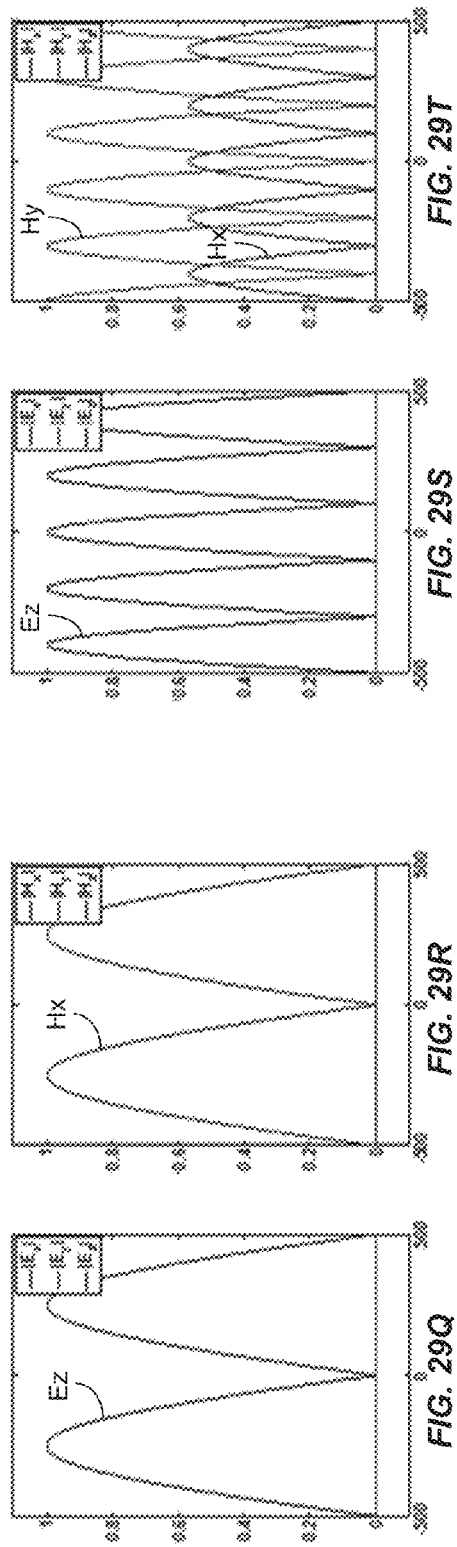
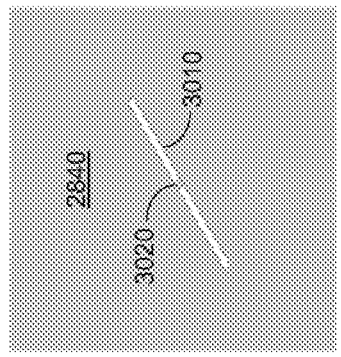
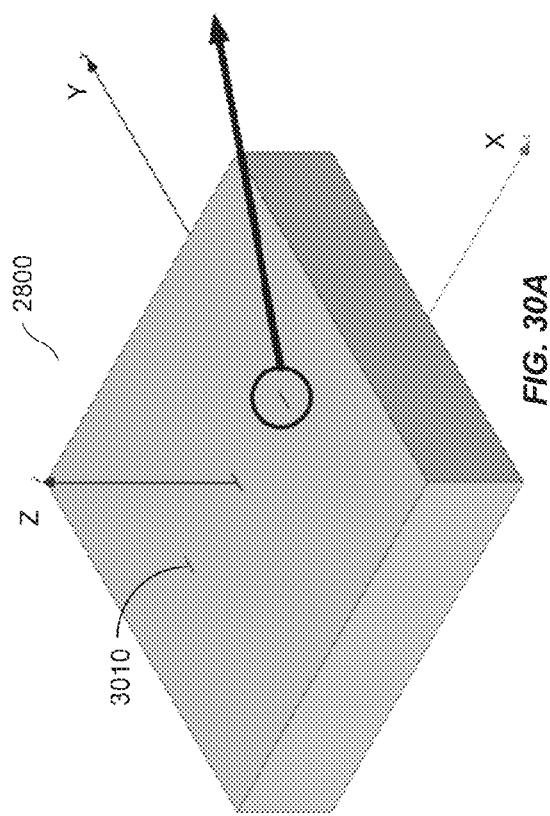

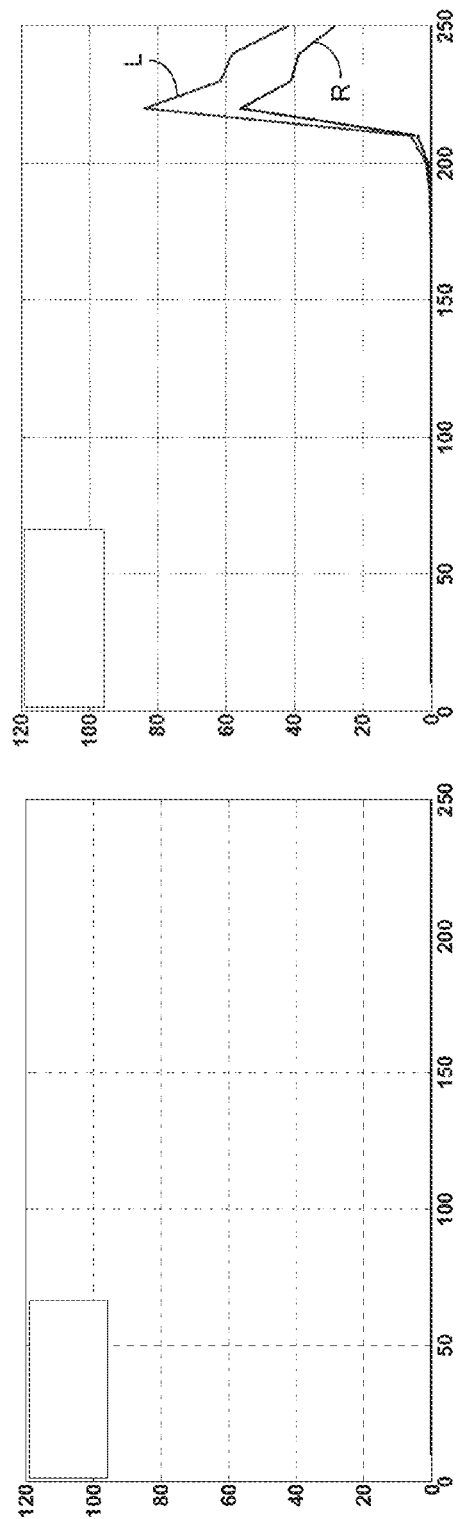
FIG. 31I
FIG. 31J
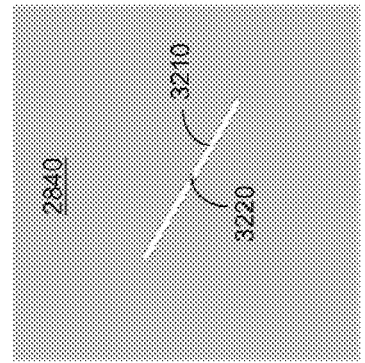
FIG. 32B
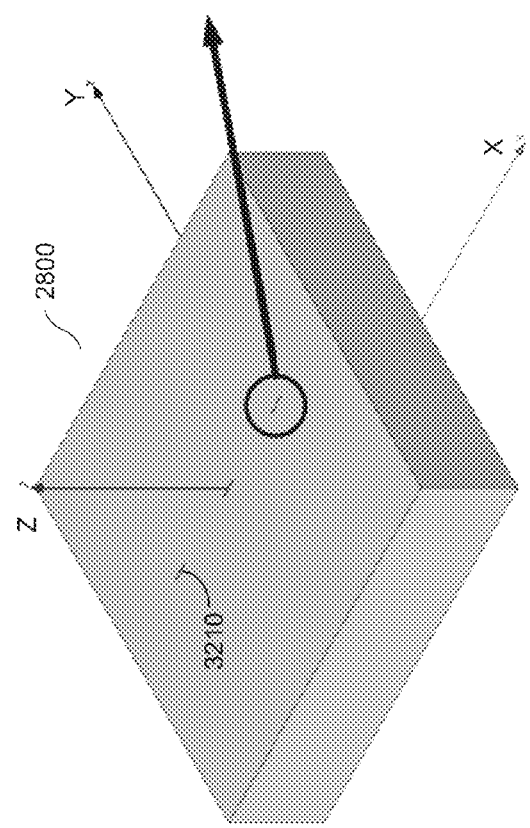
FIG. 32A

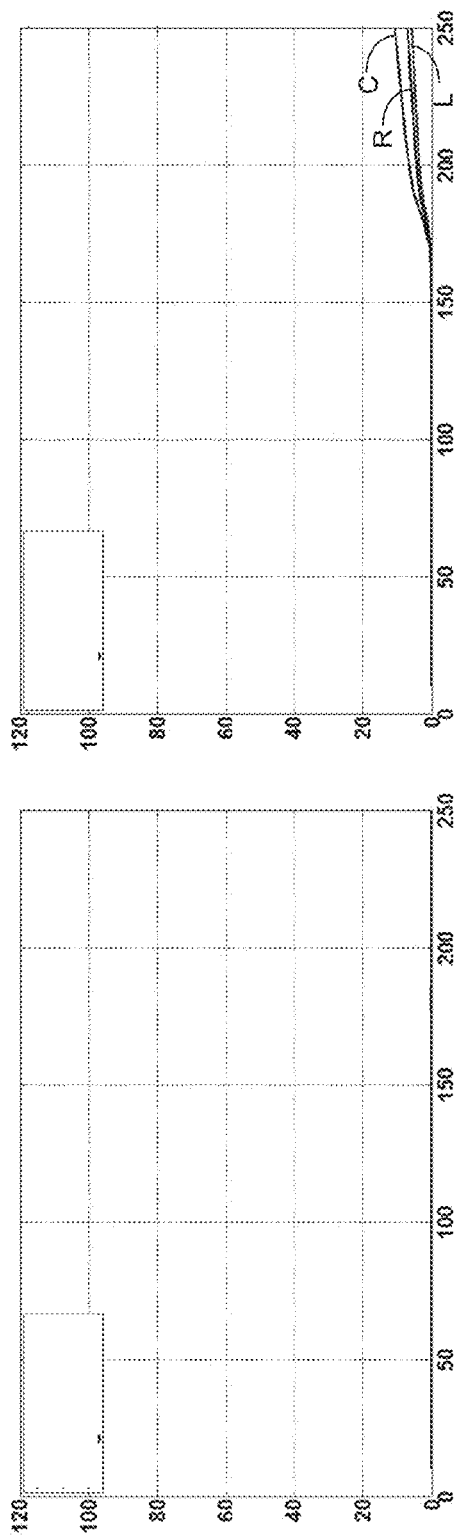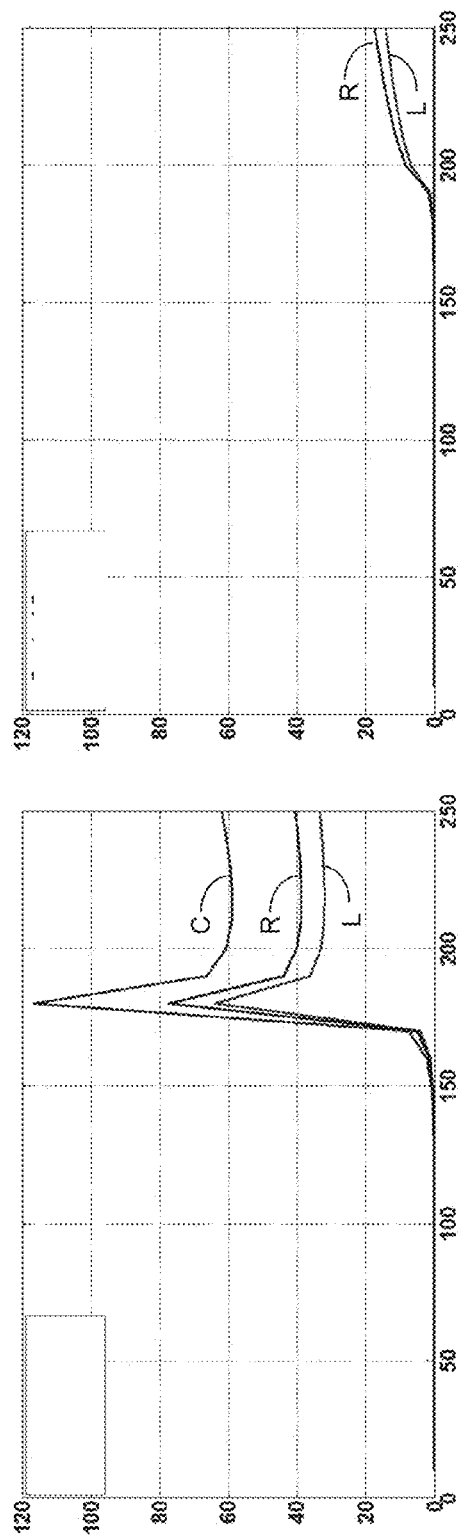

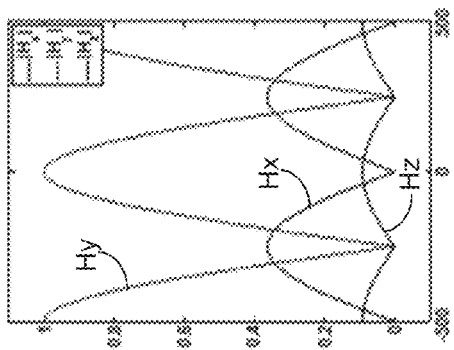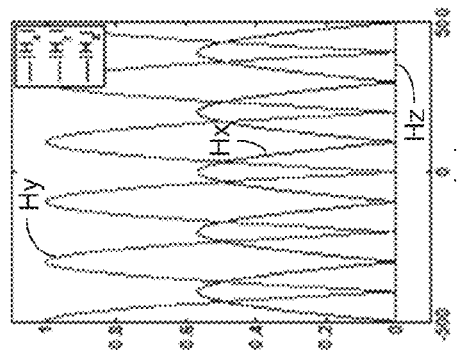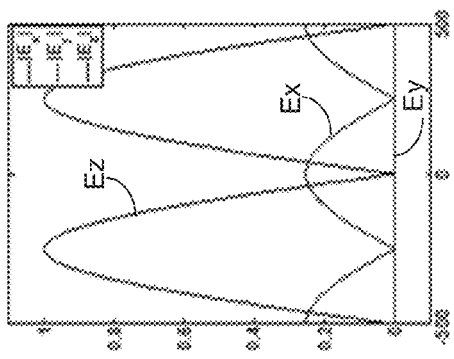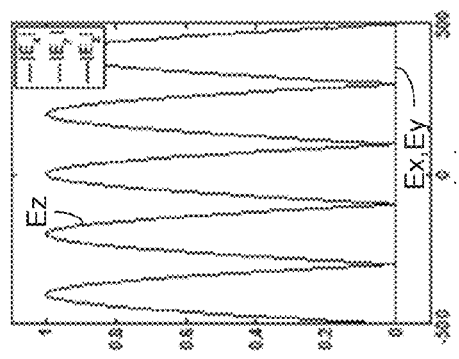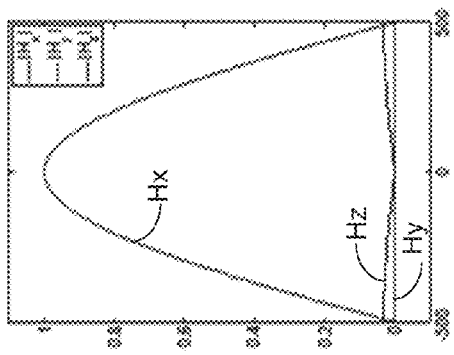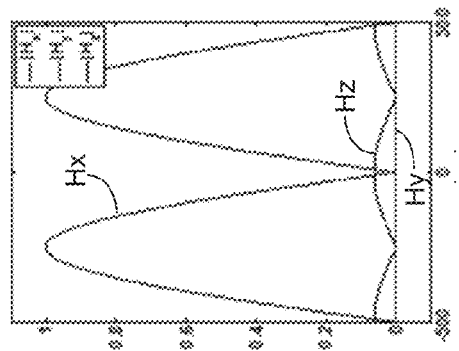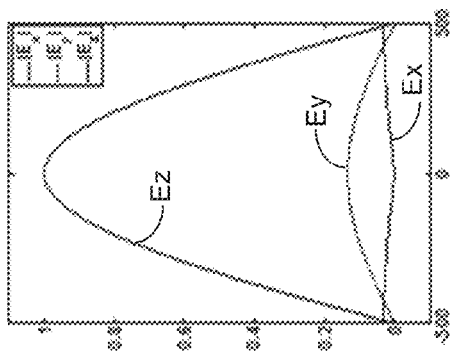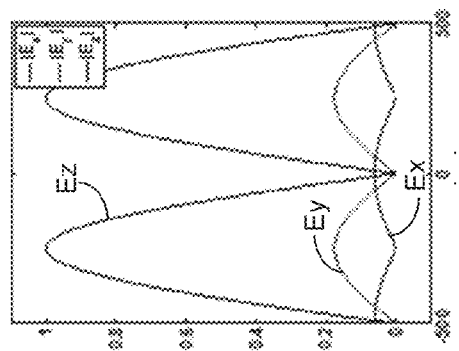

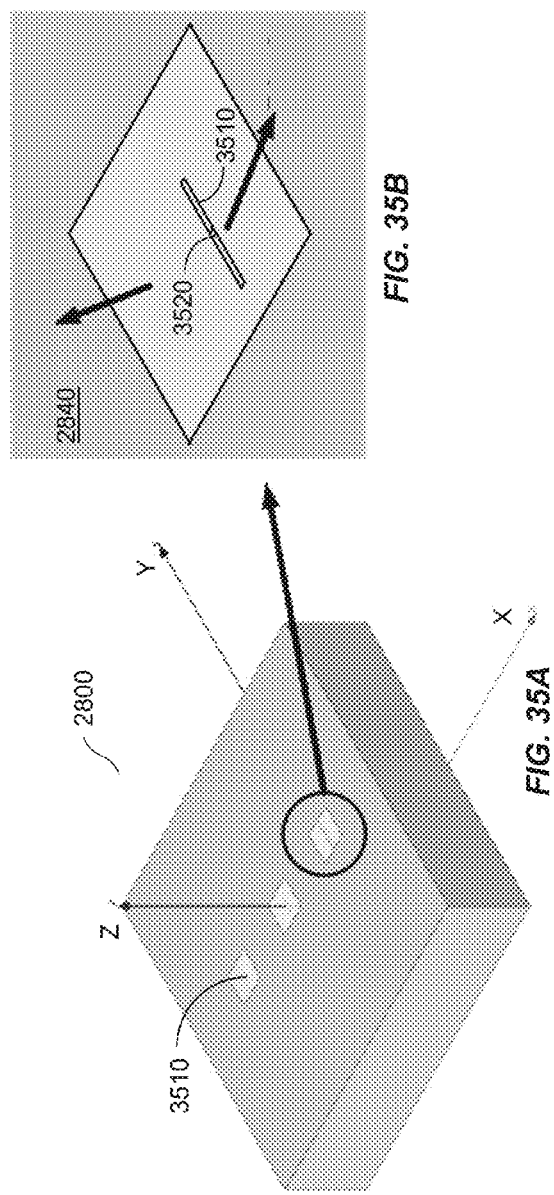
FIG. 35A
FIG. 35B
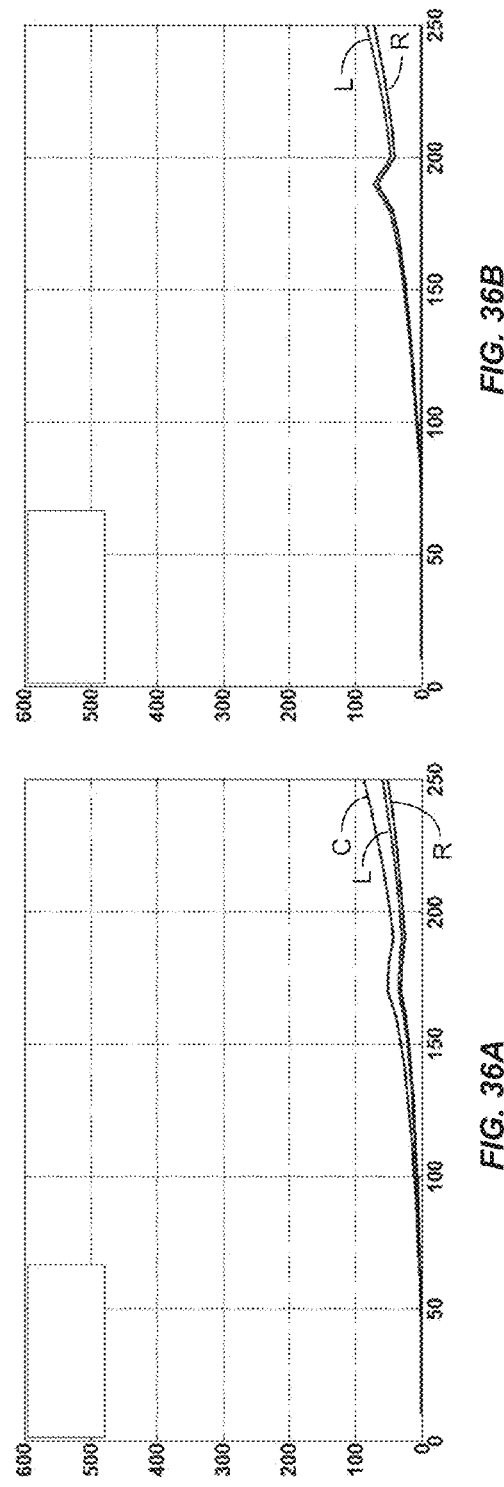
FIG. 36A
FIG. 36B

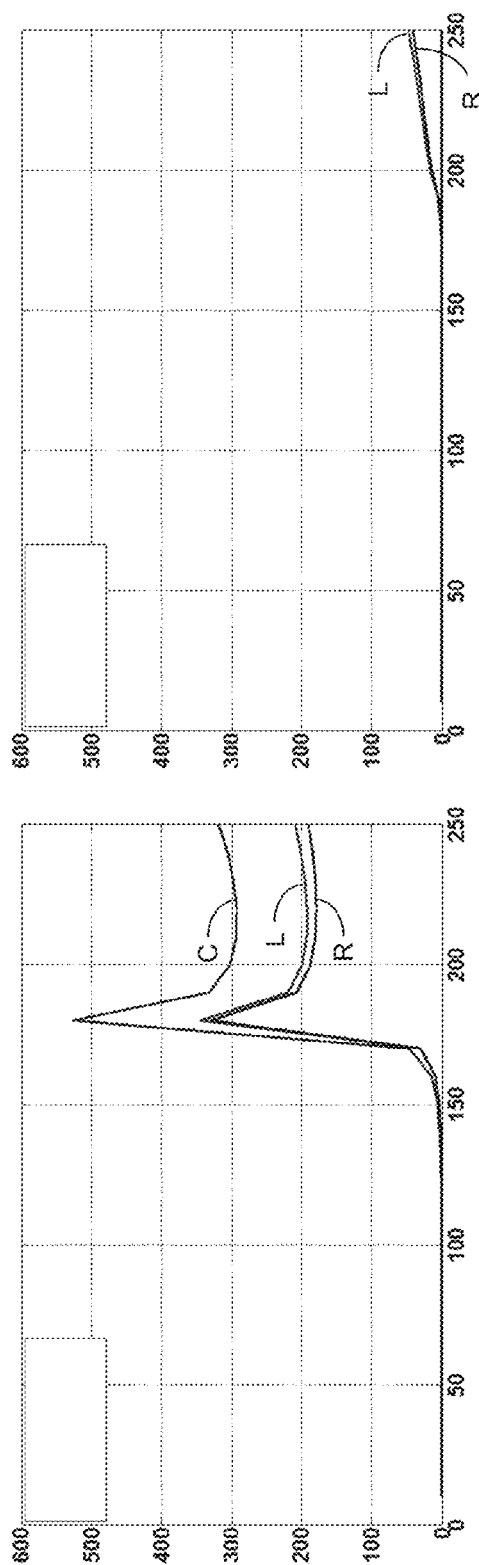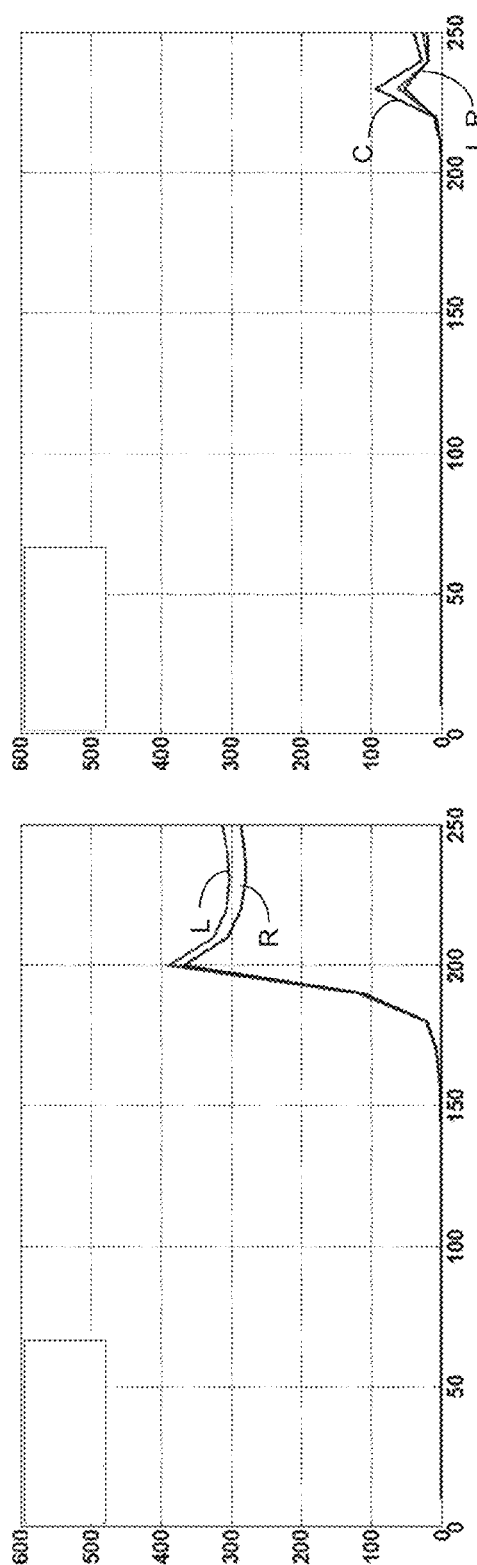

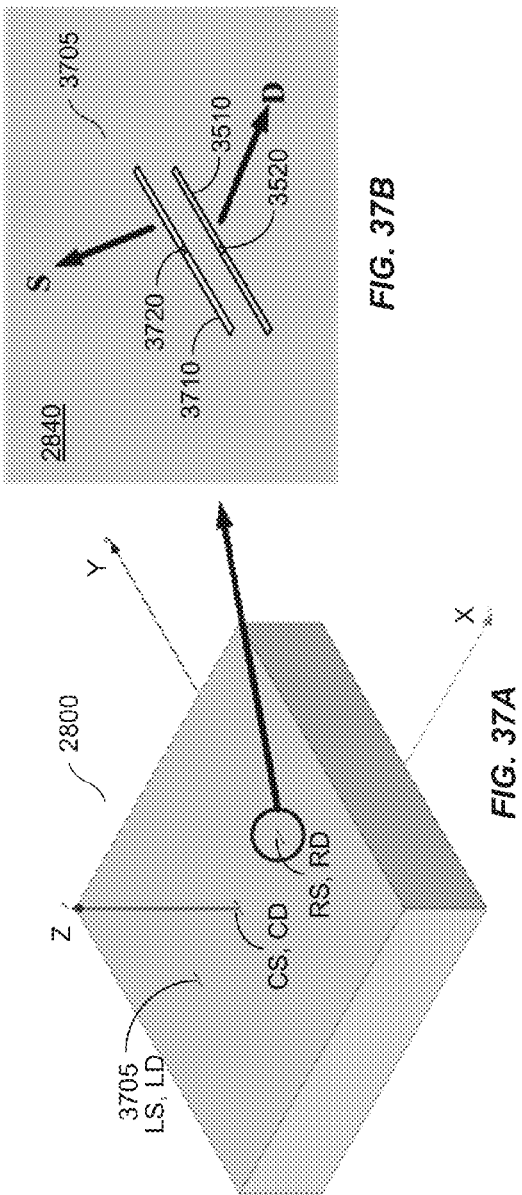
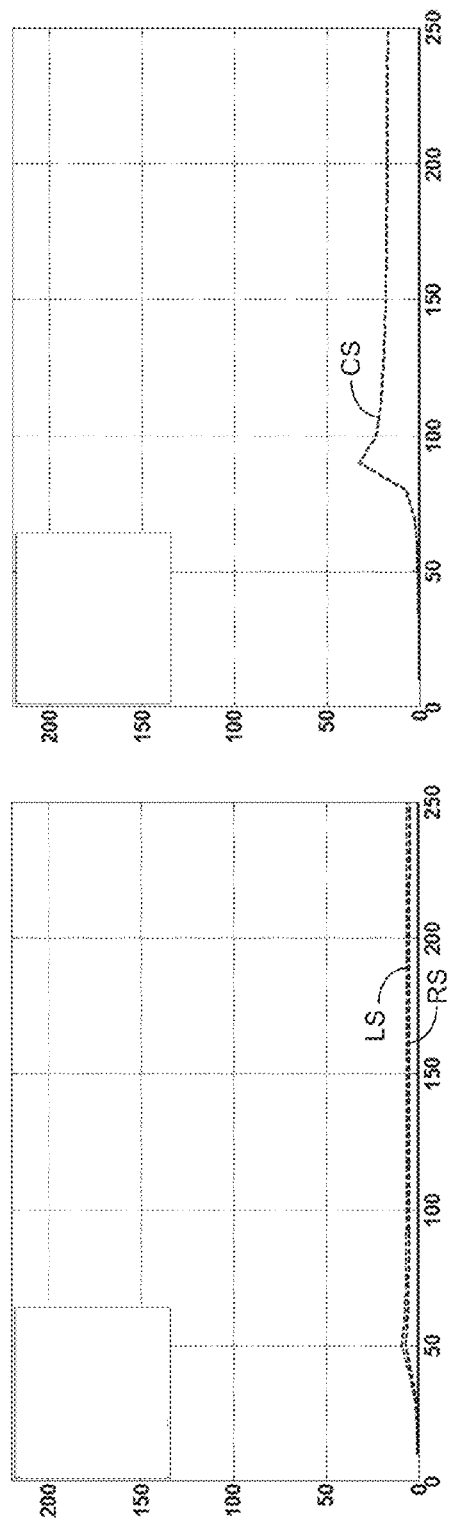
FIG. 37A
FIG. 37B
FIG. 38A
FIG. 38B

SENSING RADIATION METRICS THROUGH MODE-PICKUP SENSORS

CROSS-REFERENCE TO RELATED APPLICATIONS

The present application claims the benefit under 35 § U.S.C 119(e) of U.S. Provisional Patent Application No. 61/598,237, filed Feb. 13, 2012, entitled "SELF HEALING OF RADIATION METRICS THROUGH PICKUP SENSORS", the content of which is incorporated herein by reference in its entirety. The present application is related to U.S. patent application Ser. No. 13/654,420, filed Oct. 18, 2012, entitled "EFFICIENT ACTIVE MULTI-DRIVE RADIATOR", the content of which is incorporated herein by reference in its entirety.

STATEMENT AS TO RIGHTS TO INVENTIONS MADE UNDER FEDERALLY SPONSORED RESEARCH AND DEVELOPMENT

This invention was made with government support under FA8650-09-C-7924 awarded by USAF/ESC. The government has certain rights in the invention.

BACKGROUND

The present invention relates generally to electromagnetic sensors and in particular, to electromagnetic sensors on or above a substrate that detect part of an electromagnetic field in the substrate.

Due to an increasing demand for greater wireless bandwidth, as well as emerging markets in electromagnetic (EM) imaging, the frequency and complexity of EM radios continues to increase, leading to smaller, more complex radiating elements. Similarly, the driving mechanisms such as radio circuitry have moved to smaller, faster processes as they are implemented in more advanced technology nodes. This has caused increased variation between units that necessitates solutions that can be utilized after all fabrication and production of the devices to correct for mismatch between elements, inaccuracy of simulation models, changing environments, and other unknown variables that can change performance.

BRIEF SUMMARY

According to one embodiment of the present invention, a sensing structure includes an integrated circuit substrate, and a first sensor formed on or above the integrated circuit substrate adapted to detect a first part of an electromagnetic field in the integrated circuit substrate.

According to one embodiment, the first part of the electromagnetic field is selected from the group consisting of a substrate mode, a surface mode, a radiation direction, a polarization, a phase, and an electromagnetic power. According to one embodiment, the electromagnetic field includes a portion guided in the integrated circuit substrate and the first sensor is adapted to detect a mode selected from the group consisting of a transverse magnetic mode, a transverse electric mode, and a transverse electromagnetic mode.

According to one embodiment, the sensor is selected from the group consisting of a slot, a ring, a monopole, and a dipole. According to one embodiment, the sensor includes a loop antenna. According to one embodiment, the sensor includes a slot formed into a loop. According to one embodiment, the sensing structure includes a ground plane formed on or above the integrated circuit substrate, wherein the first sensor is formed in the ground plane.

According to one embodiment, the first part of the electromagnetic field is in a near field of one or more radiators formed on or above the integrated circuit substrate, the one or more radiators adapted to generate the electromagnetic field. According to one embodiment, the sensing structure includes a second sensor adapted to detect a second part of the electromagnetic field. According to one embodiment, the second part is different than the first part. According to one embodiment, the first part is a first polarization and the second part is a second polarization different than the first polarization.

According to one embodiment, the first sensor and the second sensor are substantially symmetrically positioned with respect to the integrated circuit substrate. According to one embodiment, the first sensor and the second sensor are substantially symmetrically positioned with respect to one or more radiators formed on or above the integrated circuit substrate, the one or more radiators adapted to generate the electromagnetic field.

According to one embodiment, the sensing structure includes a first circuit coupled to the first sensor and to the second sensor, the first circuit adapted to detect a first signal generated by the first sensor and to detect a second signal generated by the second sensor. The sensing structure further includes a second circuit coupled to one or more radiators and adapted to drive the one or more radiators, the one or more radiators formed on or above the integrated circuit substrate and adapted to generate the electromagnetic field. The sensing structure further includes a third circuit coupled between the first circuit and the second circuit and adapted to control the second circuit in response to the first circuit so as to maintain the electromagnetic field in a predetermined state according to an algorithm.

According to one embodiment, the sensing structure includes one or more radiators formed on or above the integrated circuit substrate, the one or more radiators adapted to generate the electromagnetic field. According to one embodiment, the one or more radiators include a phased array of radiators. According to one embodiment, the one or more radiators includes a multitude of drive ports. According to one embodiment, the one or more radiators each includes a first drive port having a first drive phase and a second drive port having a second drive phase, wherein the first drive phase is different than the second drive phase.

According to one embodiment, the sensing structure includes a first metal region formed on or above the integrated circuit substrate and adapted to form a ground plane, wherein a first portion of the ground plane is removed to form a first portion of the first sensor. The sensing structure further includes a second metal region formed on or above the integrated circuit substrate, a portion of the one or more radiators formed in the second metal region, a second portion of the ground plane being removed adjacent the one or more radiators, the first portion of the ground plane being smaller than the second portion of the ground plane.

According to one embodiment, the sensing structure includes a third metal region formed on or above the integrated circuit substrate below the first metal region and adapted to form a second portion of the first sensor smaller than the first portion of the first sensor. According to one embodiment, the second portion of the first sensor is a dipole and the first portion of the first sensor is a region larger than the dipole. According to one embodiment, the sensing structure includes a third metal region formed on or above the integrated circuit substrate below the first metal region and adapted to form a second portion of the first sensor, wherein the first portion is a slot and the second portion is a dipole.

According to one embodiment, the sensing structure includes a first circuit coupled to the first sensor and adapted to detect a first signal generated by the first sensor. The sensing structure further includes a second circuit coupled to the one or more radiators and adapted to drive the one or more radiators. The sensing structure further includes a third circuit coupled between the first circuit and the second circuit and adapted to control the second circuit in response to the first circuit so as to maintain the electromagnetic field in a predetermined state according to an algorithm.

According to one embodiment, the second circuit includes a fourth circuit coupled between the one or more radiators and the third circuit and adapted to control a power level of the one or more radiators. According to one embodiment, the second circuit includes a fifth circuit coupled between the one or more radiators and the third circuit and adapted to control a phase of the one or more radiators.

According to one embodiment, the third circuit includes an analog to digital converter coupled to the first circuit, and a digital to analog converter circuit coupled to the second circuit. The sensing structure further includes a digital controller coupled between the analog to digital converter and the digital to analog converter, the digital controller adapted to execute the algorithm digitally.

According to one embodiment of the present invention, a sensing structure includes a dielectric substrate and a first sensor formed on or above the dielectric substrate adapted to detect a first part of an electromagnetic field in the integrated circuit substrate.

According to one embodiment of the present invention, a sensing structure includes an integrated circuit substrate and a multitude of sensors formed on or above the integrated circuit substrate adapted to detect a multitude of parts of an electromagnetic field in the integrated circuit substrate.

According to one embodiment of the present invention, a method for sensing a first part of an electromagnetic field includes providing an integrated circuit substrate, forming a first sensor on or above the integrated circuit substrate, and detecting the first part of the electromagnetic field in the integrated circuit substrate.

According to one embodiment, the method for sensing includes forming a ground plane on or above the integrated circuit substrate, wherein the first sensor is formed in the ground plane. According to one embodiment, the method for sensing includes detecting a second part of the electromagnetic field by a second sensor. According to one embodiment, the method for sensing includes positioning the first sensor and the second sensor substantially symmetrically with respect to the integrated circuit substrate.

According to one embodiment, the method for sensing includes forming one or more radiators on or above the integrated circuit substrate, generating the electromagnetic field by the one or more radiators, and positioning the first sensor and the second sensor substantially symmetrically with respect to the one or more radiators. According to one embodiment, the method for sensing includes forming one or more radiators on or above the integrated circuit substrate, and generating the electromagnetic field by the one or more radiators.

According to one embodiment, the method for sensing includes forming a first metal region on or above the integrated circuit substrate to form a ground plane and removing a first portion of the ground plane to form a first portion of the first sensor. The method for sensing further includes forming a second metal region on or above the integrated circuit substrate, a portion of the one or more radiators formed in the second metal region. The method for sensing further includes removing a second portion of the ground plane adjacent the one or more radiators, the first portion of the ground plane being smaller than the second portion of the ground plane.

According to one embodiment, the method for sensing includes forming a third metal region on or above the integrated circuit substrate below the first metal region to form a second portion of the first sensor smaller than the first portion of the first sensor. According to one embodiment, the method for sensing includes forming a third metal region on or above the integrated circuit substrate below the first metal region to form a second portion of the first sensor, wherein the first portion is a slot and the second portion is a dipole.

According to one embodiment, the method for sensing includes detecting a first signal generated by the first sensor, driving the one or more radiators, and controlling the driving so as to maintain the electromagnetic field in a predetermined state according to an algorithm. According to one embodiment, driving includes controlling a power level. According to one embodiment, driving includes controlling a phase. According to one embodiment, controlling includes converting an analog signal from the detected first signal to a digital signal, executing the algorithm digitally, and converting a digital signal from the executed algorithm to an analog signal.

According to one embodiment of the present invention, a method for sensing a first part of an electromagnetic field includes providing a dielectric substrate, forming a first sensor on or above the dielectric substrate, and detecting the first part of the electromagnetic field in the dielectric substrate. According to one embodiment of the present invention, a method for sensing a multitude of parts of an electromagnetic field includes providing an integrated circuit substrate, forming a multitude of sensors on or above the integrated circuit substrate, and detecting the multitude of parts of the electromagnetic field in the integrated circuit substrate.

A better understanding of the nature and advantages of the embodiments of the present invention may be gained with reference to the following detailed description and the accompanying drawings.

BRIEF DESCRIPTION OF THE DRAWINGS

FIG. 2 is a simplified block diagram of the electromagnetic radiator system shown in FIG. 1, in accordance with an embodiment of the present invention.

FIG. 7A and FIG. 7B are simulation results of the gain and directivity respectively of the electromagnetic radiator system shown in FIG. 1 and FIG. 2 with the integrated circuit substrate thickness equal to 275 µm.

FIG. 10A to FIG. 10H are plots of the simulation results showing the voltage generated at each sensor of the electromagnetic radiator system shown in FIG. 1 and FIG. 2 when an individual port within all the four radiator rings is off in phase from the other three ports with the integrated circuit substrate thickness equal to 175 µm.

FIG. 17A and FIG. 17B are simulation results of the gain and directivity respectively of the electromagnetic radiator system with the radiators driven as described in FIG. 16 with +/−40° of relative phase error.

FIG. 18 is a simplified plan view of the slot-ring sensor shown in FIG. 12 showing port identification coding.

FIG. 22A to FIG. 22M are plots of the simulation results showing the voltage generated at each port of each sensor of the electromagnetic radiator system shown in FIG. 12 versus the quadrature phase error, $\Phi_{QA}$, in radiator A when both radiators are driven counter-clockwise.

FIG. 24A is a simplified perspective view of an electromagnetic radiator system in an integrated circuit substrate including a pair of radiators similar to FIG. 12 and including six slot-ring sensors and three pairs of metallic contacts to the integrated circuit substrate, in accordance with an embodiment of the present invention.

FIG. 24B is a simplified perspective view of one of the pairs of metallic contacts to the integrated circuit substrate shown in FIG. 24A, in accordance with an embodiment of the present invention.

FIG. 30A is a simplified perspective view of three linear slot antenna provided as MP sensors with their longitudinal axes oriented in the Y direction of the simulated rectangular waveguide shown in FIG. 28, in accordance with an embodiment of the present invention.

FIG. 30B is a simplified perspective view of one of the three linear slot antenna provided as MP sensors shown in FIG. 30A, in accordance with an embodiment of the present invention.

FIG. 31A to FIG. 31J are plots of the simulation results showing the voltage picked up by each of the linear slot sensors shown in FIG. 30A plotted versus the frequency of excitation for each of the first ten propagating modes.

FIG. 32A is a simplified perspective view of three linear slot antenna provided as MP sensors with their longitudinal axes oriented in the X direction of the simulated rectangular waveguide shown in FIG. 28, in accordance with an embodiment of the present invention.

FIG. 32B is a simplified perspective view of one of the three linear slot antenna provided as MP sensors shown in FIG. 32A, in accordance with an embodiment of the present invention.

FIG. 33A to FIG. 33J are plots of the simulation results showing the voltage picked up by each of the linear slot sensors shown in FIG. 32A plotted versus the frequency of excitation for each of the first ten propagating modes.

FIG. 35A is a simplified perspective view of three dipole antenna provided as MP sensors with their longitudinal axes oriented in the Y direction of the simulated rectangular waveguide shown in FIG. 28, in accordance with an embodiment of the present invention.

FIG. 35B is a simplified perspective view of one of the three dipole antenna provided as a MP sensor shown in FIG. 35A, in accordance with an embodiment of the present invention.

FIG. 36A to FIG. 36J are plots of the simulation results showing the voltage picked up by each of the linear slot sensors shown in FIG. 35A plotted versus the frequency of excitation for each of the first ten propagating modes.

FIG. 37A is a simplified perspective view of three combined TE/TM sensors with their longitudinal axes oriented in the Y direction of the simulated rectangular waveguide shown in FIG. 28, in accordance with an embodiment of the present invention.

FIG. 37B is a simplified perspective view of one of the three combined TE/TM sensors shown in FIG. 37A, in accordance with an embodiment of the present invention.

FIG. 38A to FIG. 38J are plots of the simulation results showing the voltage picked up by each of the combined TE/TM sensors shown in FIG. 37A plotted versus the frequency of excitation for each of the first ten propagating modes.

DETAILED DESCRIPTION

Figure 1:
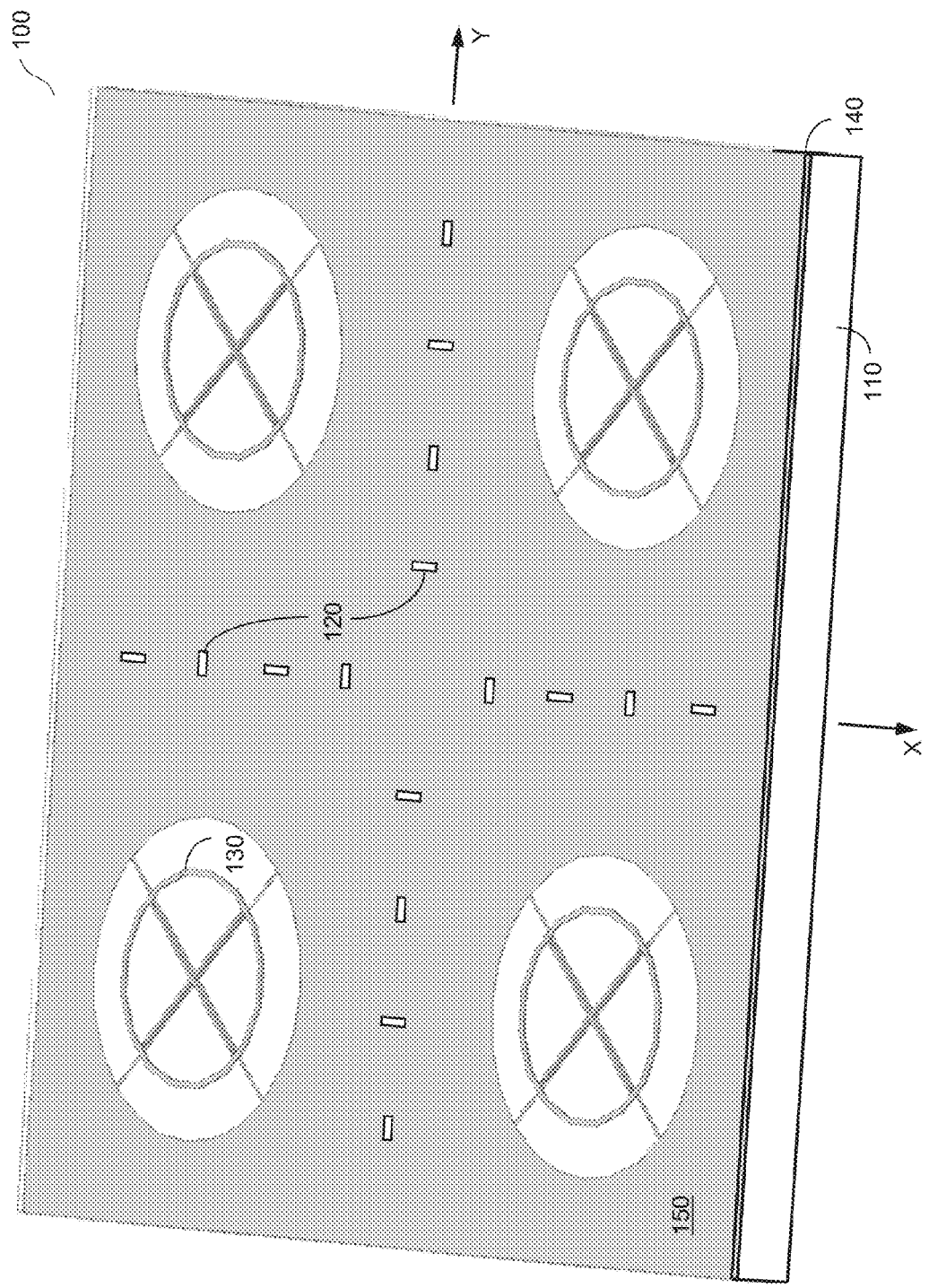
FIG. 1 is a simplified perspective view of an electromagnetic radiator system in an integrated circuit substrate with a multitude of slot sensors and a multitude of radiators, in accordance with an embodiment of the present invention.

Radio circuitry units implemented on chip in advanced technology nodes have caused increased variation between units. That variability needs solutions that can be utilized after fabrication and production of the devices in order to correct for mismatch between elements, inaccuracy of simulation models, changing environments, and other unknown variables that can change radio performance.

According to an embodiment of the present invention, one or more sensors are placed strategically and are used to actuate the radiator circuit to self-heal for degrading variations, thereby improving system performance. These sensors may detect parts of the radiation field that contain enough data to predict the desired field parameters to control the radiated field. Further, the sensors may be formed to detect modes of the radiation and guided field and are thus called mode-pickup (MP) sensors (hereinafter alternatively referred to as pickup sensors or sensors). An algorithm is used to modify the state of the radiation parameters based on the collected data from the sensors. This process can occur once or be used as an iterative optimization, until an optimum actuation state is found for all actuators. If variables in the system such as the environment change, then the healing can be run again.

One embodiment of such a self-healing system includes the example where, the radiation field is electromagnetic, and the system may be an RF radio with one or more antenna radiators. In one such system, these radiators are integrated with the driving circuitry in a single integrated circuit chip with the pickup sensors on or above the same substrate. The radiator circuit may generate the radiated EM field (far field) that may exit the system and may generate the power directed in the substrate (near field). The sensors may be located near the radiator so as to be in the near field. The substrate may be an integrated circuit substrate or a dielectric substrate. One implementation of this system may use an Efficient Active Multi-drive Radiator (S. Bowers, A. Hajimiri) referenced above.

Radiator antenna may be formed on the same metal layer as the ground plane or on metal layers above the ground plane. Metal layers may be positioned or attached to or overlay the chip and be spaced apart from each other and from the substrate by dielectric layers. In other words, dielectric layers and metal layers may overlay each other forming a stack, which generally overlays or is attached or positioned to the integrated circuit substrate as is common in modern integrated circuit processes. Because of the ground plane in this particular implementation, pickup sensors may be chosen to be small slot antennas in the ground plane. Other sensors such as patch, ring, monopole, and dipole antennas may be used as well. In this system, the slot antennas will pick up power being lost in or directed in the substrate mode radiation as well as radiation in undesired directions. The sensors may pickup near field power directed into the substrate to provide a sense signal, without affecting the far field overall radiation pattern or radiation efficiency prohibitively. Proof-of-concept EM simulations have been performed to validate the viability of these pickup sensors. Sensors may be placed symmetrically with respect to the substrate or with respect to the radiator. Alternatively, sensors may be placed asymmetrically since the system may be experimentally characterized to determine sensor behavior with respect to desired radiated field parameters.

FIG. 1 is a simplified perspective view of an electromagnetic radiator system 100 in an integrated circuit substrate 110 with a multitude of slot sensors 120 and a multitude of radiators 130, in accordance with an embodiment of the present invention. Slot sensors 120 are placed symmetrically with respect to the radiators in a ground plane 150.

Slot sensors 120 are formed in a metal layer 140, which also serves as the ground plane on integrated circuit substrate 110. Each slot includes a longitudinal axis longer relative to a narrow width perpendicular to the longitudinal axis. The slot is made by cutting entirely through metal layer 140 using a mask and photolithographic techniques.

FIG. 2 is a simplified block diagram of electromagnetic radiator system 100 shown in FIG. 1, in accordance with an embodiment of the present invention. Referring to FIG. 2, electromagnetic radiator system 100 includes a 2×2 element phased array of active radiators R1, R2, R3 and R4, designed to radiate at 94 GHz, with 16 pickup sensors placed in sets of 4 along each of the positive and negative x and y axes, and rotated in alternating orientation to detect different polarizations. The sensor slots may be small compared to the wavelength, meaning that they may not affect the far field radiation pattern much, while picking up enough power directed into the substrate to sense effectively. Each pickup sensor includes a single port, which may couple to power detection circuitry. In the simulations, the pickup sensor ports were terminated with a 50 Ohm load to represent the input impedance of the power detection circuitry they may be attached to.

The following nomenclature is defined for EM simulations of this system. The 4 pickup sensors along each axis (+X, +Y, −X, −Y) are labeled A, B, C, and D. The 4 active radiator rings are labeled R1, R2, R3 and R4, and are each driven by 4 ports normally with equal magnitude and with phases of 0°, 90°, 180° and 270° as noted in FIG. 2. The relative phase of the 0° ports of all 4 radiator rings is p0, and similarly defined for p90, p180, and p270.

R1Ph is the relative phase of all ports of ring 1 compared to the other 3 rings, and similarly defined for R2Ph, R3Ph, and R4Ph. Thus the phase of the 0° port of ring 1 is p0+R1Ph, with the other 15 ports following the formula: the phase of the X° port of ring Y is pX+RYPh. When driven with all phases correct, p0=0°, p90=90°, p180=180°, p270=270°, and RYPh=0 for all Y. Unless otherwisespecified, all drives are nominally set to correct phase.

To demonstrate the ability of these sensors to detect change in substrate height, which will affect substrate modes, substrate heights (zsub) of 175 µm, 225 µm and 275 µm were simulated, and sensor outputs compared. Power directed from the radiators into a substrate mode reduces the power radiated in desired directions and reduces system efficiency.

Figure 3B:
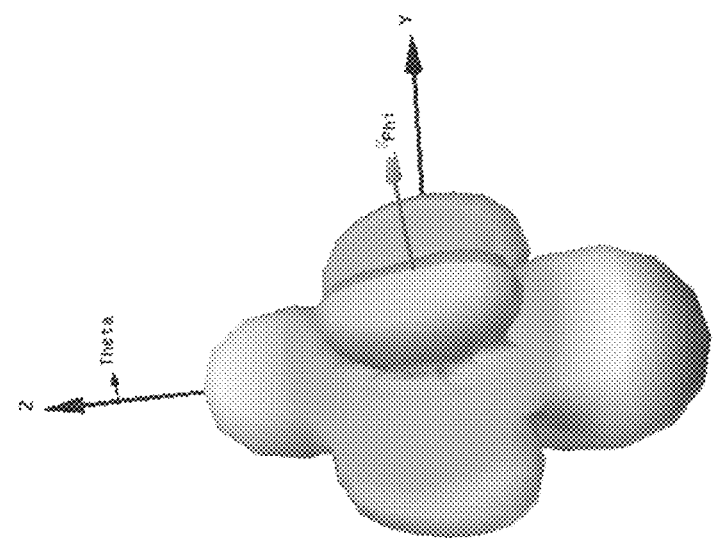
FIG. 3A and FIG. 3B are simulation results of the gain and directivity respectively of the electromagnetic radiator system shown in FIG. 1 and FIG. 2 with the integrated circuit substrate thickness equal to 175 μm.
Figure 3A:
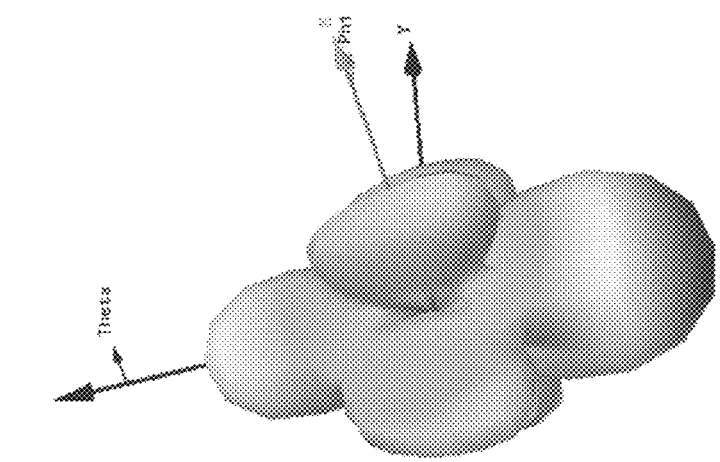

FIG. 3A and FIG. 3B are simulation results of the gain and directivity respectively of electromagnetic radiator system 100 shown in FIG. 1 and FIG. 2 with the integrated circuit substrate thickness equal to 175 µm. The radiation efficiency is 45%. FIG. 3A and FIG. 3B show a maximum gain of 9 dB and directivity of 13 dB respectively, which is the optimum condition for radiation for this system.

Figure 4:
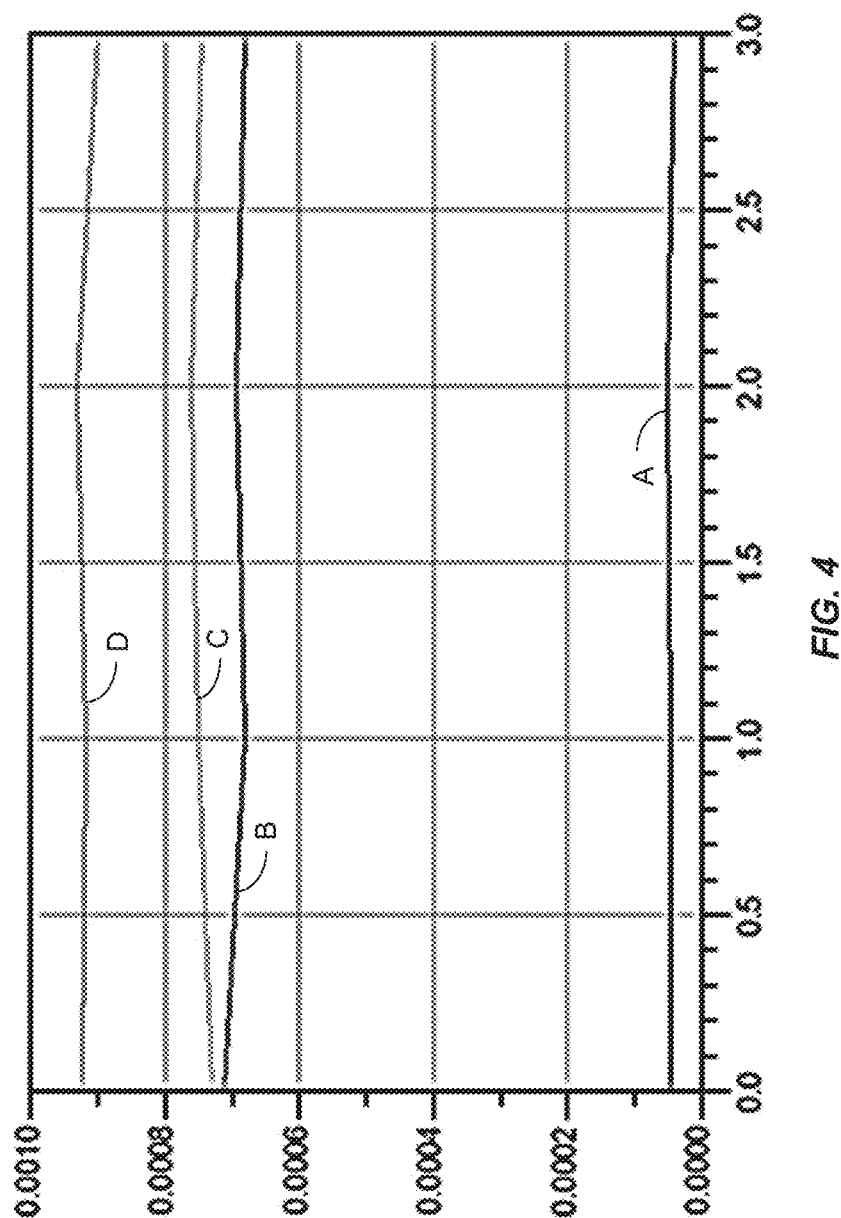
FIG. 4 is a plot of the simulation results showing the voltage generated at each sensor of the electromagnetic radiator system shown in FIG. 1 and FIG. 2 with the integrated circuit substrate thickness equal to 175 μm.

FIG. 4 is a plot of the simulation results showing the voltage generated at each sensor of electromagnetic radiator system 100 shown in FIG. 1 and FIG. 2 with the integrated circuit substrate thickness equal to 175 µm. The plot in FIG. 4 shows the voltage generated at each sensor on the Y axis of the plot, while the position of the sensor on the chip is on the X axis of the plot. Sensors on the +X axis of the structure are plotted as 0, +Y as 1, −X as 2, and −Y as 3. The data from the A sensors, which are indicated on FIG. 2, are plotted in FIG. 4 as a line marked A, similarly B sensors as a line marked B, C sensors as a line marked C, and D sensors as a line marked D. This format of plot will be used to consider the sensor output in FIG. 6, FIG. 8, FIGS. 9A-9H, and FIGS. 10A-10H, which will be described below. In FIG. 4, the total input power into the four radiators is 17.804 dBm. Note that when the sensors are positioned symmetrically with respect to the radiators, which are positioned symmetrically with respect to the edges of the chip, the sensors at the same position (A, B, C, or D) are all roughly picking up the same voltage.

Figure 5B:
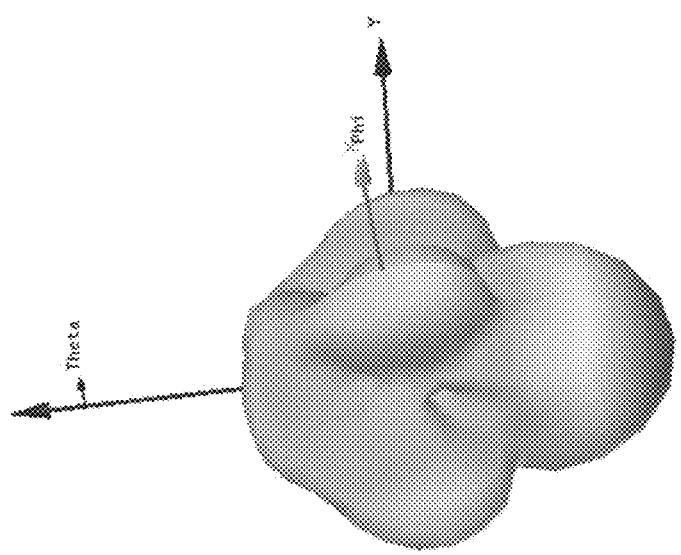
FIG. 5A and FIG. 5B are simulation results of the gain and directivity respectively of the electromagnetic radiator system shown in FIG. 1 and FIG. 2 with the integrated circuit substrate thickness equal to 225 μm.
Figure 5A:
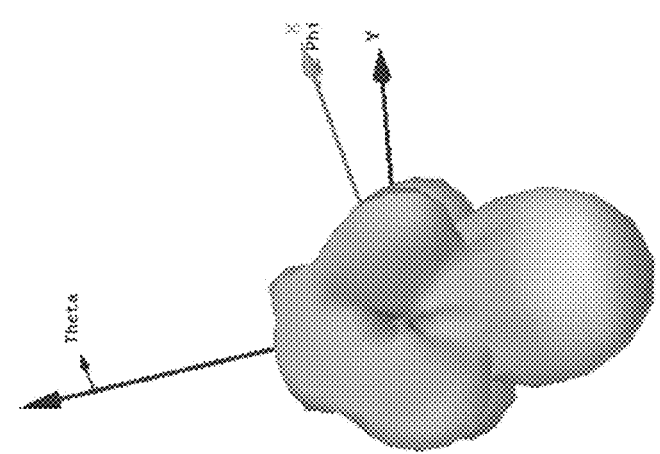
Figure 6:
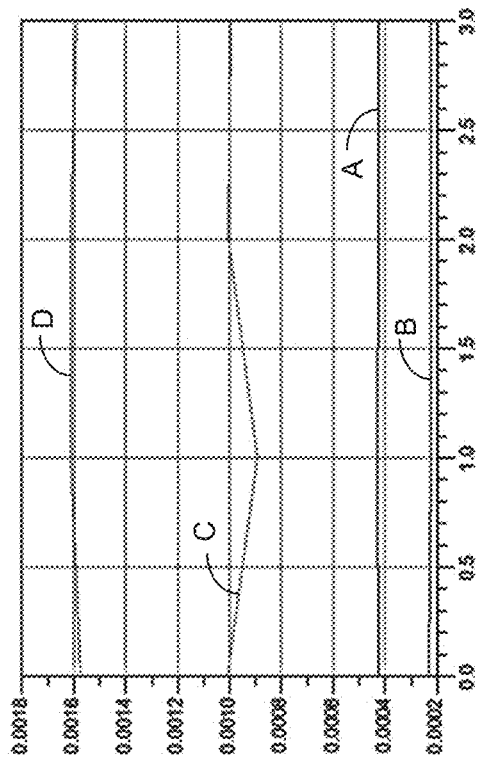
FIG. 6 is a plot of the simulation results showing the voltage generated at each sensor of the electromagnetic radiator system shown in FIG. 1 and FIG. 2 with the integrated circuit substrate thickness equal to 225 µm.

FIG. 5A and FIG. 5B are simulation results of the gain and directivity respectively of electromagnetic radiator system 100 shown in FIG. 1 and FIG. 2 with the integrated circuit substrate thickness equal to 225 µm. The radiation efficiency is reduced compared to the earlier example and equal to 27%. FIG. 5A and FIG. 5B show the peak gain decreased to 6 dB, and peak directivity decreased to 10 dB, showing a decrease from optimum performance. FIG. 6 is a plot of the simulation results showing the voltage generated at each sensor of electromagnetic radiator system 100 shown in FIG. 1 and FIG. 2 with the integrated circuit substrate thickness equal to 225 µm. FIG. 6 shows that the pickup sensors have changed significantly compared to the earlier example, with D sensors increasing by 60% and B sensors falling by more than a factor of 3. The total input power into the four radiators is 18.834 dBm. Because the entire system is still symmetric, similar sensors along different axes still pick up close to the same voltage.

Figure 8:
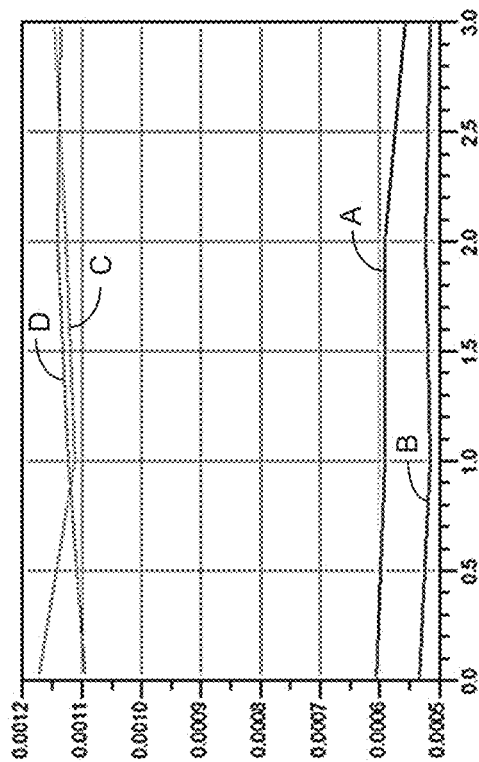
FIG. 8 is a plot of the simulation results showing the voltage generated at each sensor of the electromagnetic radiator system shown in FIG. 1 and FIG. 2 with the integrated circuit substrate thickness equal to 275 µm.

Setting substrate thickness to 275 µm de-tunes the system even farther. FIG. 7A and FIG. 7B are simulation results of the gain and directivity respectively of electromagnetic radiator system 100 shown in FIG. 1 and FIG. 2 with the integrated circuit substrate thickness equal to 275 µm. The radiation efficiency is further reduced compared to the two earlier examples and equal to 12%. FIG. 7A and FIG. 7B show the peak gain has now dropped below 0 dB, with peak directivity down to 6 dB. FIG. 8 is a plot of the simulation results showing the voltage generated at each sensor of electromagnetic radiator system 100 shown in FIG. 1 and FIG. 2 with the integrated circuit substrate thickness equal to 275 µm. FIG. 8 shows the voltage on D sensors has gone back down, but a trend in A sensors is seen where they change from 0.00005 V to 0.0004 V to 0.0006 V as substrate height increased from 175 µm, to 225 µm and to 275 µm, respectively. B sensors are also somewhat higher than when zsub=225 µm. The total input power into the four radiators is 18.657 dBm. These simulations show there is enough information that can be detected by the pickup sensors to determine when variations, such as substrate thickness, that may lead to increased substrate mode power, thus providing the ability to sense when the far field output is affected.

In another embodiment, a parameter that experiences significant variation is the drive phase. For the following simulations, the optimum Zsub=175 um is used. All phases not explicitly mentioned are set to their default optimum values, while certain selected phases are set to non-optimal settings.

FIG. 9A to FIG. 9H are plots of the simulation results showing the voltage generated at each sensor of electromagnetic radiator system 100 shown in FIG. 1 and FIG. 2 when a single radiator ring is off in phase from the other three radiator rings with the integrated circuit substrate thickness equal to 175 µm. This is accomplished by changing the RYPh variable described above, which will shift the phase of all 4 ports in Ring Y. In terms of the nomenclature defined above, the radiator phases and total power into the four radiators for FIG. 9A to FIG. 9H are given in Table 1 below.

TABLE 1

Figure 9A:
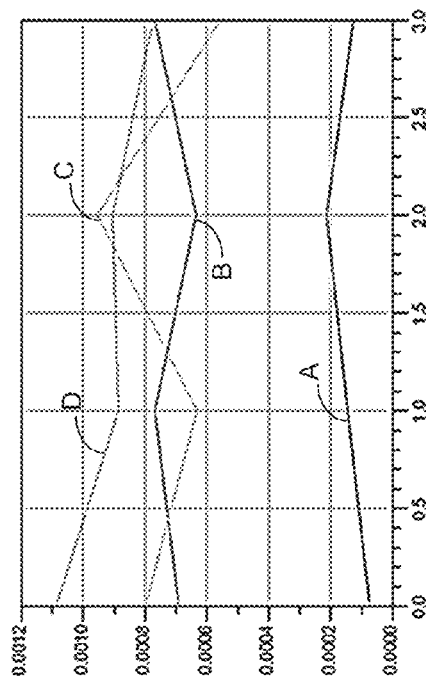
FIG. 9A to FIG. 9H are plots of the simulation results showing the voltage generated at each sensor of the electromagnetic radiator system shown in FIG. 1 and FIG. 2 when a single radiator ring is off in phase from the other three radiator rings with the integrated circuit substrate thickness equal to 175 µm.
Figure 9B:
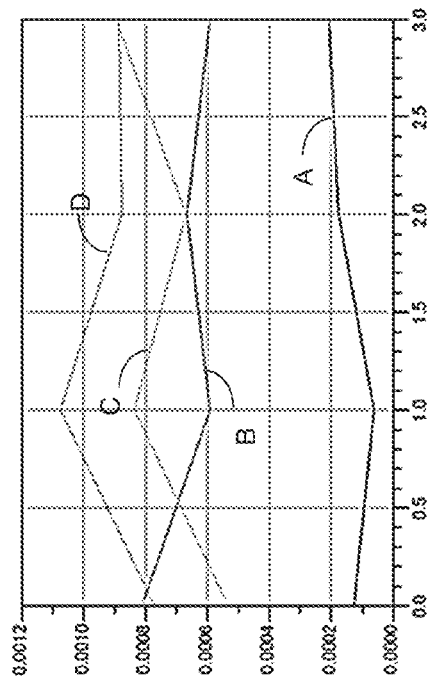
Figure 9C:
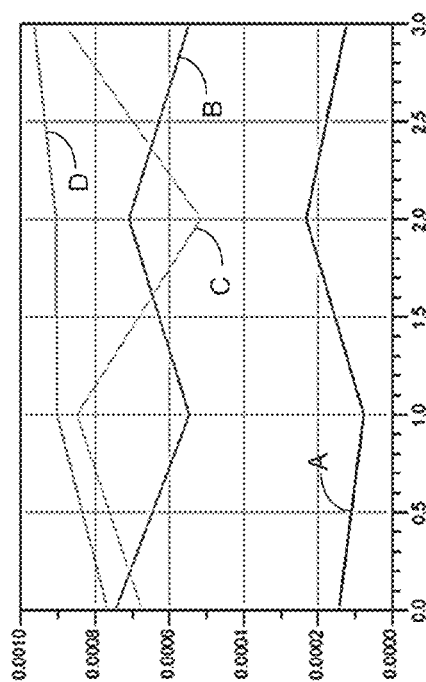
Figure 9D:
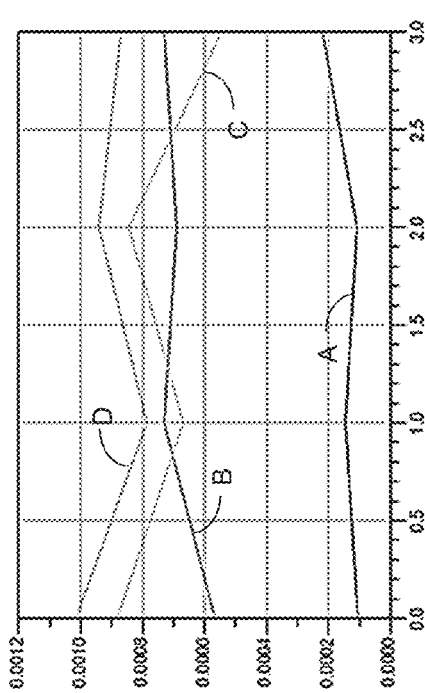
Figure 9E:
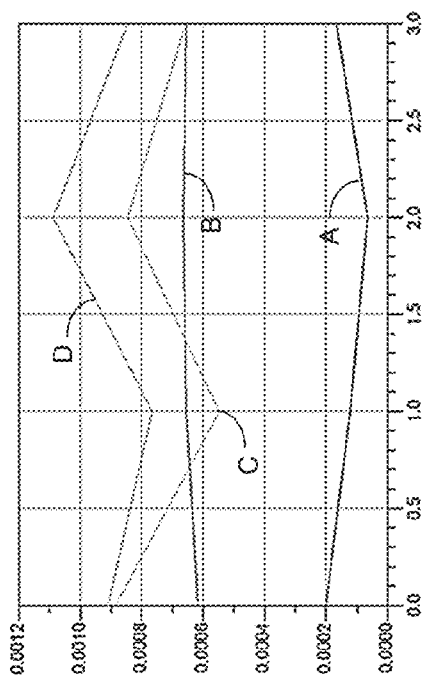
Figure 9F:
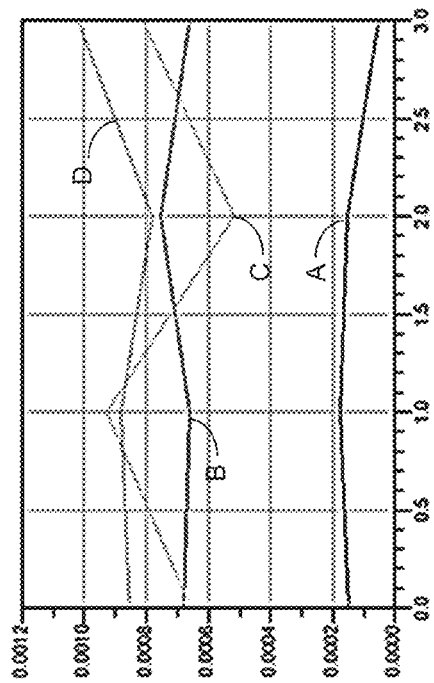
Figure 9G:
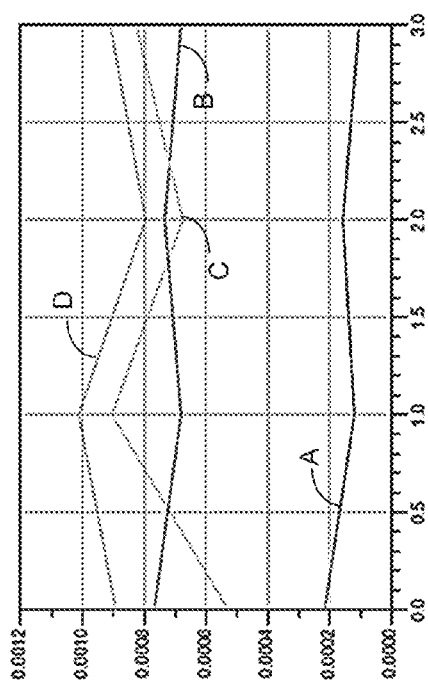
Figure 9H:
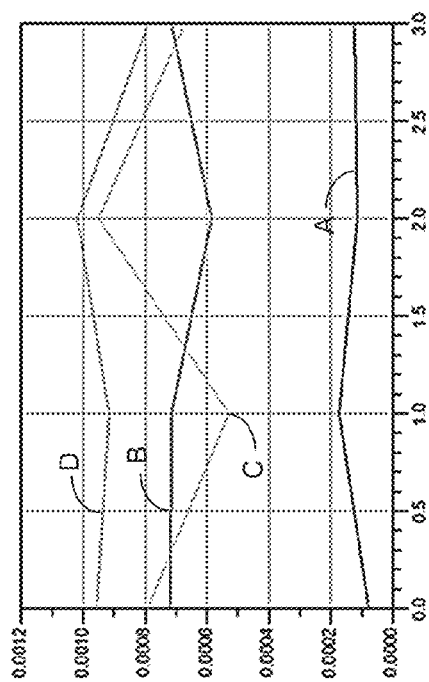

| FIG. | Phase | Power (dBm) |
|---|---|---|
| FIG. 9A | R1Ph = +30° | 17.779 |
| FIG. 9B | R1Ph = −30° | 17.777 |
| FIG. 9C | R2Ph = +30° | 17.795 |
| FIG. 9D | R2Ph = −30° | 17.799 |
| FIG. 9E | R3Ph = +30° | 17.798 |
| FIG. 9F | R3Ph = −30° | 17.796 |
| FIG. 9G | R4Ph = +30° | 17.784 |
| FIG. 9H | R4Ph = −30° | 17.784 |

FIG. 9A to FIG. 9H show that all 4 plots where a ring leads by +30° are similar, with a shift of 1 unit (axis) to the right as the plots go from ring 1 to 4, i.e. from FIG. 9A to 9C to 9E to 9G respectively. The shift of 1 unit corresponds to a 90° counter clockwise shift in the physical system, the same 90° counter clockwise shift of changing the perturbed ring from ring 1 to ring 2, and so on. Thus a unique signature for a 30° phase leading shift can be obtained, and the individual ring that is shifted can be seen by the relative horizontal shift in the plots above. A similar signature can be seen for a 30° phase lagging shift shown in the plots in FIGS. 9B, 9D, 9F and 9H. The same pattern of 90° counter clockwise shifts from the first to the 4th plot is observed. This shows that these sensors can accurately detect enough information to determine the relative phases of the rings in the phased array, and through proper actuation may be healed back to the optimum case where all 4 rings are in phase.

In another embodiment, a variation that may cause degradation in the system is if an individual port within the rings is out of phase. This will degrade the system as the traveling wave along the radiator ring will encounter a drive point that is not adding coherently, which will lower the efficiency and also increase power lost to substrate modes. As stated above changing pX will change the relative phase of the X° ports in each of the rings, so p0=30° will perturb the 0° ports to 30° in each of the radiator rings.

FIG. 10A to FIG. 10H are plots of the simulation results showing the voltage generated at each sensor of the electromagnetic radiator system shown in FIG. 1 and FIG. 2 when an individual port within all the four radiator rings is off in phase from the other three ports with the integrated circuit substrate thickness equal to 175 μm. In terms of the nomenclature defined above, the radiator phases and total power into the four radiators for FIG. 10A to FIG. 10H are given in Table 2 below.

TABLE 2

Figure 10E:
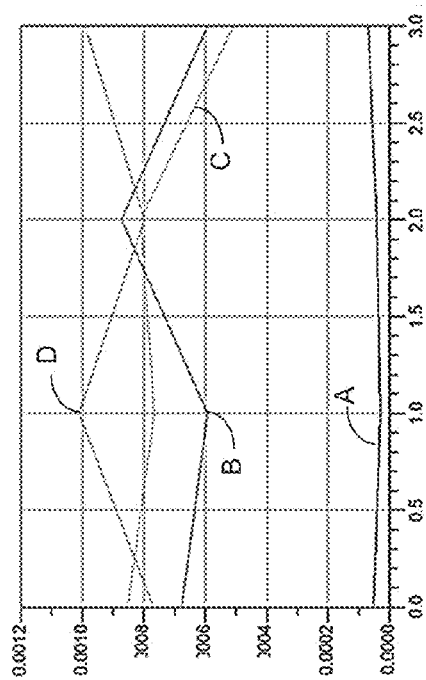
Figure 10F:
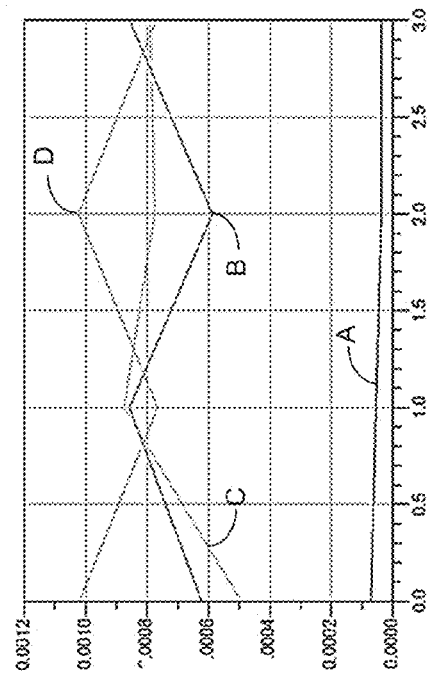
Figure 10G:
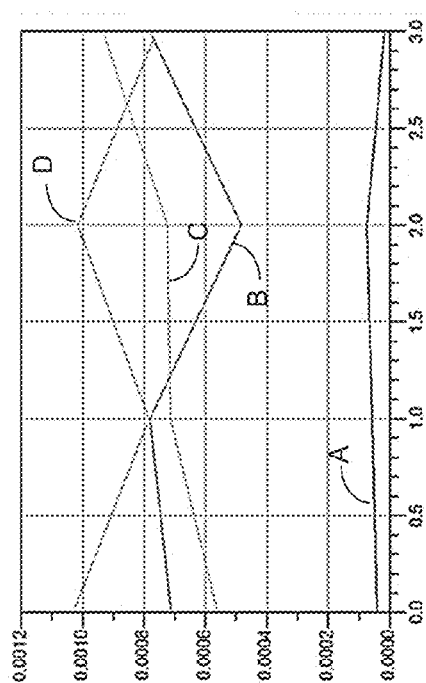
Figure 10H:
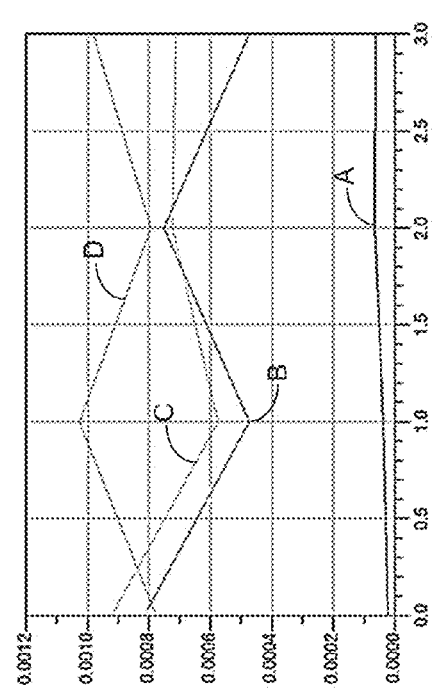

| FIG. | Phase | Power (dBm) |
| --- | --- | --- |
| FIG. 10A | p0 = +30° | 17.729 |
| FIG. 10B | p0 = −30° | 17.724 |
| FIG. 10C | p90 = +120° | 17.723 |
| FIG. 10D | p90 = +60° | 17.729 |
| FIG. 10E | p180 = +210° | 17.730 |
| FIG. 10F | p180 = +150° | 17.723 |
| FIG. 10G | p270 = +300° | 17.723 |
| FIG. 10H | p270 = +240° | 17.729 |

FIG. 10A to FIG. 10H show these phase variations also produce a unique signature similar to the ones when an entire ring is perturbed. A pattern where each plot is shifted 1 unit to the right between plots is also observed, as the ports being perturbed rotate 90° counter clockwise between each plot. This shows that individual perturbations in driver phase may be sensed by these pickup sensors.

According to an embodiment of the present invention, the ability of the sensors to sense radiated variations is not limited to variation in driver phase, but is applicable to any variation that affects the radiation of the system. MP sensors may detect various modes such as TE, TM and TEM directed into the substrate as will be discussed in detail below. Thus, with the proper self-healing algorithm circuit block and actuator space, knowing the cause of the variation is no longer necessary to correct for the variation. Instead, the self healing system senses that a variation occurred, finds an actuation that counters the perturbation, and then senses that the system is once again operating at a predetermined optimal state.

Figure 11:
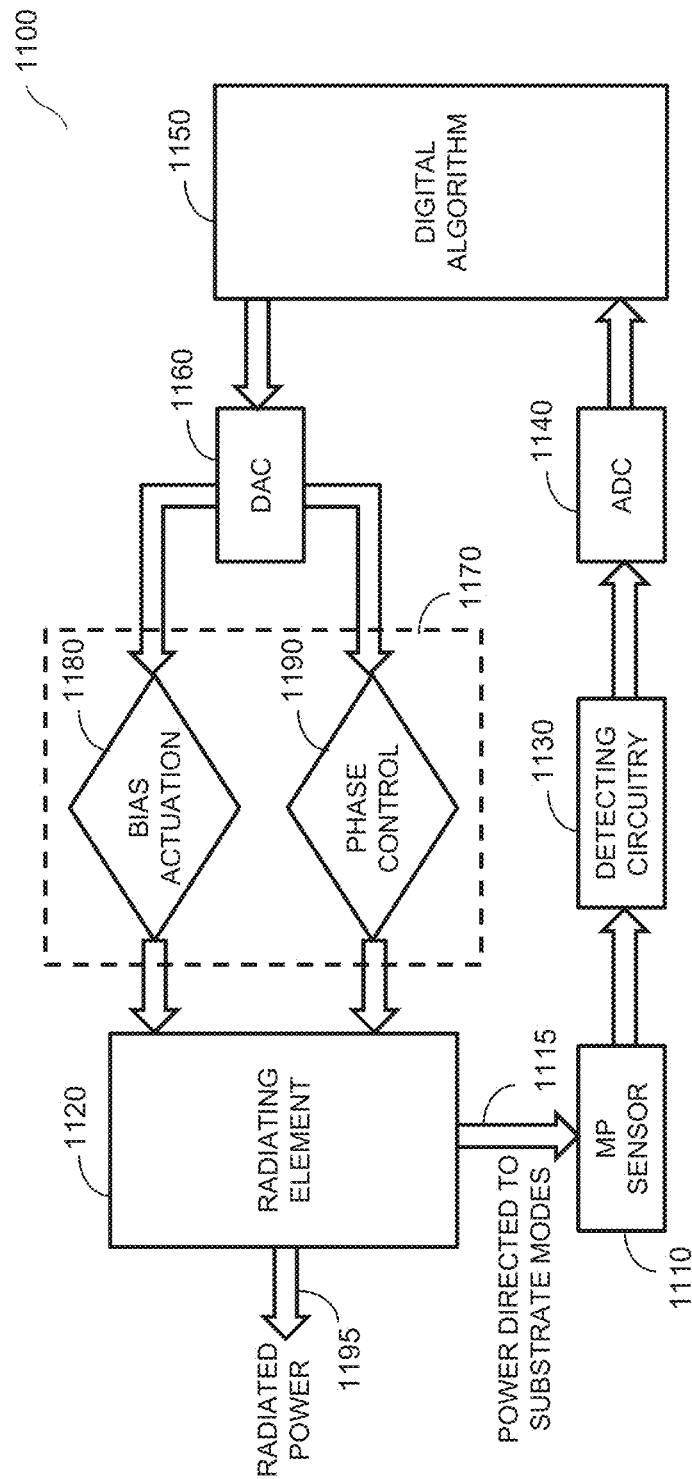
FIG. 11 is a simplified block diagram of a self-healing electromagnetic radiator system, in accordance with an embodiment of the present invention.

FIG. 11 is a simplified block diagram of a self-healing electromagnetic radiator system 1100, in accordance with an embodiment of the present invention. A MP sensor 1110 picks up a signal responsive to the operation of a radiating element 1120. The signal picked up by MP sensor 1110 is associated with power directed to substrate modes 1115. This signal is detected and amplified by a detecting circuit 1130 to be fed into an Analog to Digital Converter (ADC) 1140. A digital algorithm 1150 (hereinafter alternatively referred to as digital core) incorporates the digitized sensor's reading through a predefined metric to distinguish the operation state of the radiating system. The metric is defined to minimize the power of the undesired excited modes, i.e. due to degradation in the performance, and maximize the power of the desired modes, i.e. as expected during normal operation.

Based on the value of the metric and the detected state of the system, the digital algorithm decides what the next state should be to improve the performance using one or more of a multitude of search algorithms, such as gradient decent or a bulk search of the actuation space. Using a Digital to Analog Converter (DAC) 1160, the decision made in the digital core is converted back to an analog signal to be applied to the radiating element through a multitude of actuators 1170, which includes two sets of actuators. One set, a bias actuator 1180 adjusts the biasing of the circuitry to control the power levels in the radiator. The other set, a phase controller 1190 includes a phase interpolating unit to adjust the driving phase of the radiator. In an optional embodiment, a bias actuator may be used without a phase controller. Alternatively, in another optional embodiment, a phase controller may be used without a bias actuator. Such a closed-loop, self-healing implementation keeps the system in the predetermined optimal state of operation controlling a radiated power 1195 directed out of system 1100. It is understood that the signal paths would be in parallel when a multitude of sensors are provided, i.e. a multitude of radiating elements, detecting circuits, ADCs, DACs, bias actuators, and a multitude of phase controllers would be used.

Figure 12:
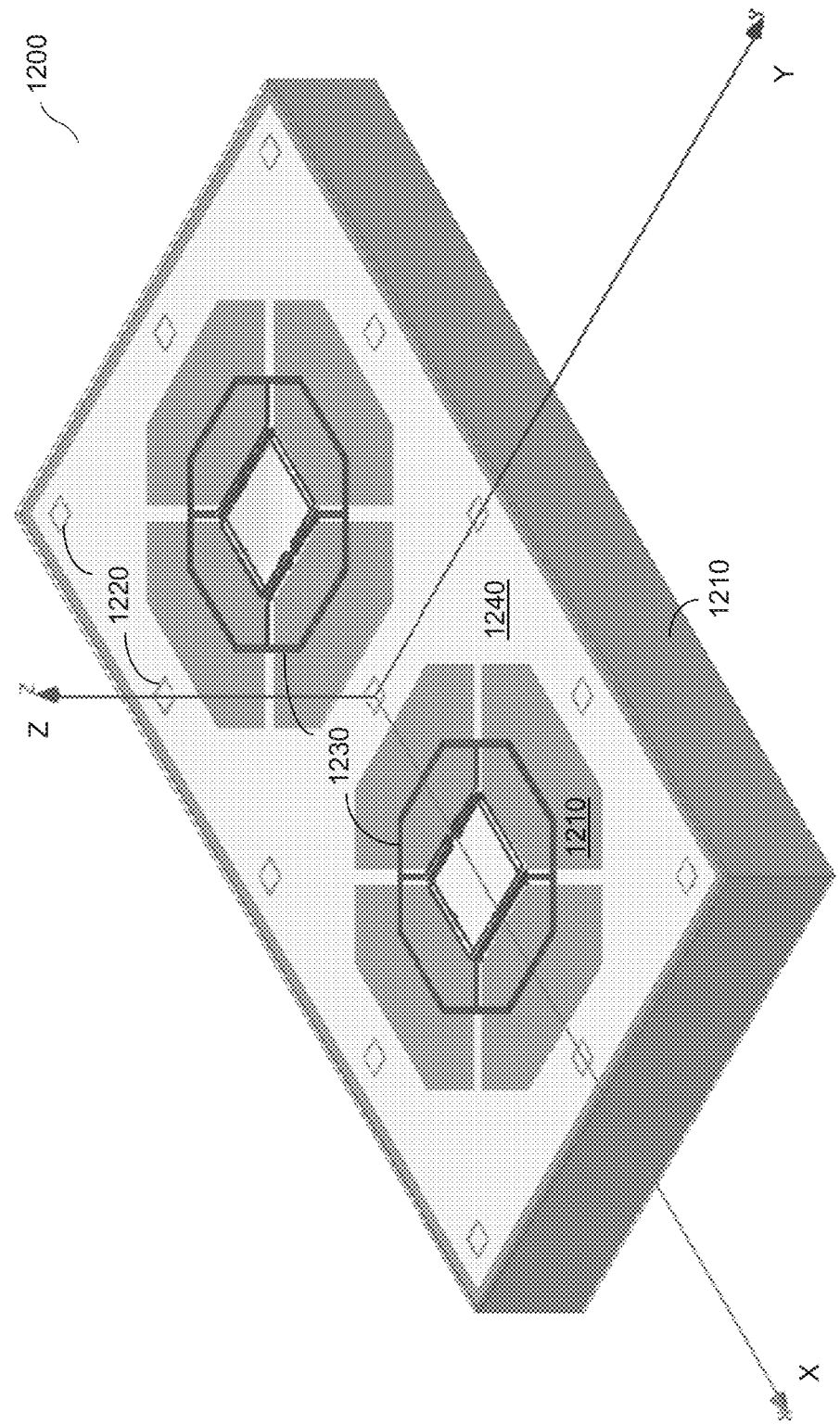
FIG. 12 is a simplified perspective view of an electromagnetic radiator system in an integrated circuit substrate including a multitude of slot-ring sensors and a multitude of radiators, in accordance with an embodiment of the present invention.

FIG. 12 is a simplified perspective view of an electromagnetic radiator system 1200 in an integrated circuit substrate 1210 including a multitude of slot-ring sensors 1220 (hereinafter alternatively referred to as slot-loop sensors) and a multitude of radiators, in accordance with an embodiment of the present invention. As will be described below, the ring or loop need not be circular in shape. Multitude of radiators includes a 2×1 array of loop antenna radiators 1230 radiating at 120 GHz with a ground plane 1240 surrounding the loops to provide the path for the return current. Ground plane 1240 and loop antennas 1230 may be formed from different metal layers in the integrated circuit's semiconductor substrate. Due to the presence of ground plane 1240, slot-ring antennas 1220 are implemented by chopping, or cutting entirely through the ground plane at desired locations. In this example, 13 slot-ring antennas are placed symmetrically around the loops and act as MP sensors.

Figure 13C:
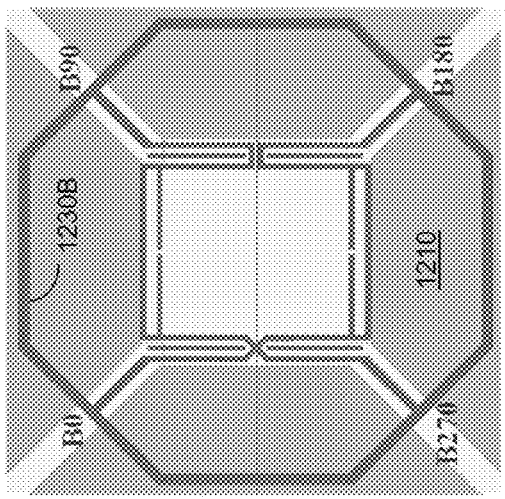
FIG. 13B and FIG. 13C are simplified plan views of each of the multitude of radiators shown in FIG. 13A, in accordance with an embodiment of the present invention.
Figure 13D:
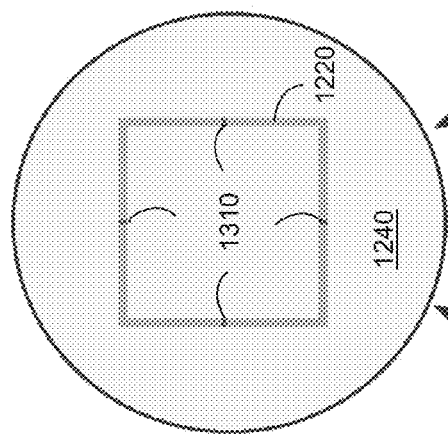
FIG. 13D is a simplified plan view of one of the multitude of slot-ring sensors shown in FIG. 13A, in accordance with an embodiment of the present invention.
Figure 13B:
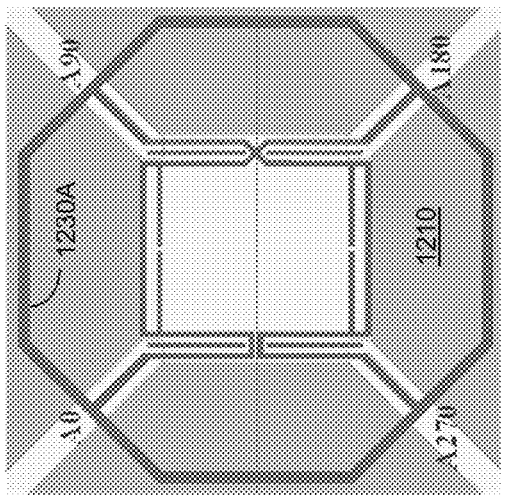
Figure 13A:
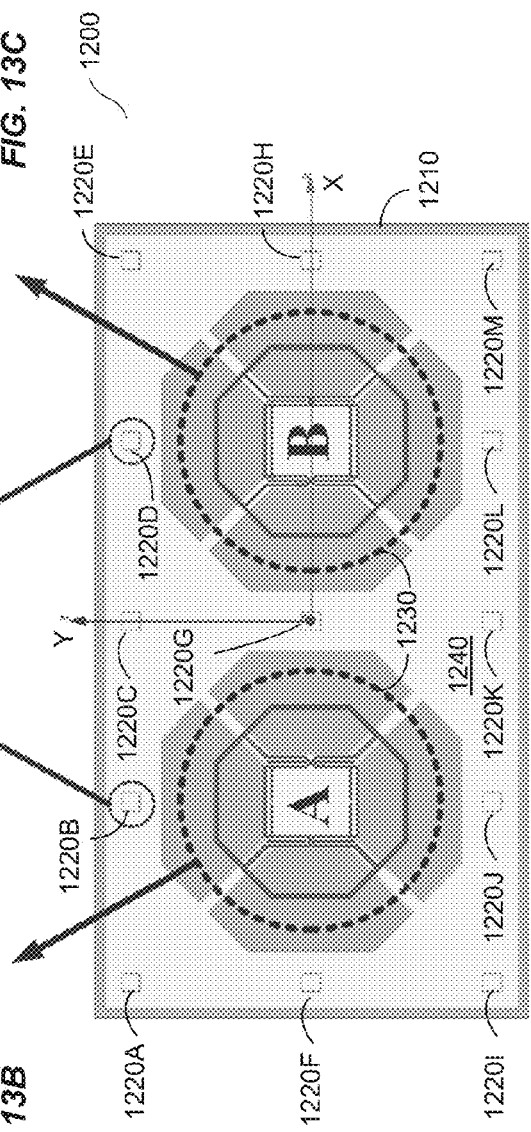
FIG. 13A is a simplified plan view of the electromagnetic radiator system shown in FIG. 12, in accordance with an embodiment of the present invention.

FIG. 13A is a simplified plan view of electromagnetic radiator system 1200 shown in FIG. 12, in accordance with an embodiment of the present invention. FIG. 13A includes 13 slot-ring sensors labeled 1220A to 1220M corresponding to the multitude of slot-ring sensors 1220 shown in FIG. 12. The positions of the slot-ring sensors relative the axes shown in FIG. 13A are indicated in Table 3 below and will be used in the descriptions of FIG. 19 and FIG. 22 below.

TABLE 3

Figure 19:
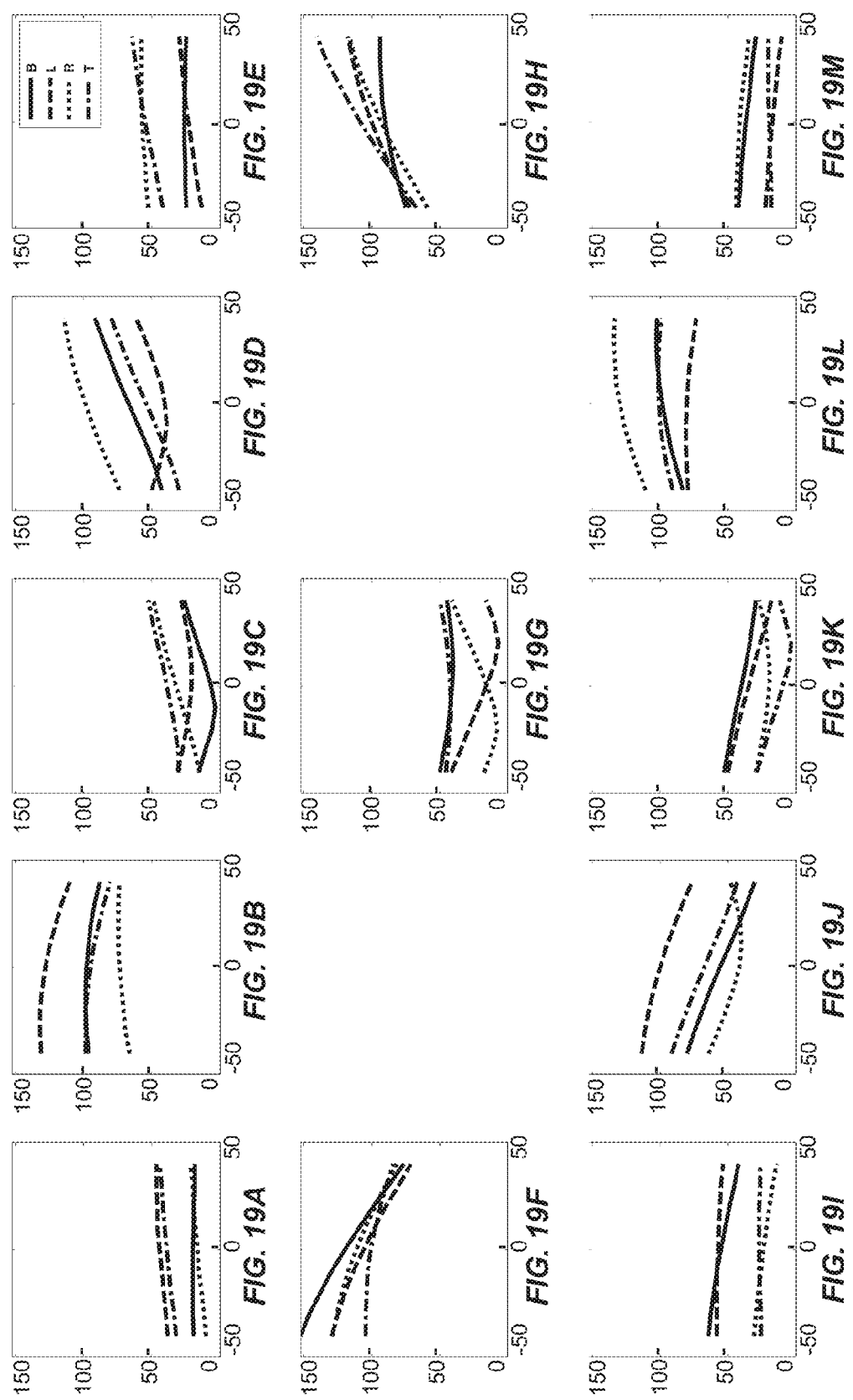
FIG. 19A to FIG. 19M are plots of the simulation results showing the voltage picked-up at each port of each sensor of the electromagnetic radiator system shown in FIG. 12 versus the relative phase difference, θ, between the two radiators when both radiators are driven counter-clockwise.

| slot-ring sensor | Position | FIG. 19 | FIG. 22 |
|---|---|---|---|
| 1220A | Top-Left | FIG. 19A | FIG. 22A |
| 1220B | Top-Mid-Left | FIG. 19B | FIG. 22B |
| 1220C | Top | FIG. 19C | FIG. 22C |
| 1220D | Top-Mid-Right | FIG. 19D | FIG. 22D |
| 1220E | Top-Right | FIG. 19E | FIG. 22E |
| 1220F | Left | FIG. 19F | FIG. 22F |
| 1220G | Center | FIG. 19G | FIG. 22G |
| 1220H | Right | FIG. 19H | FIG. 22H |
| 1220I | Bottom-Left | FIG. 19I | FIG. 22I |
| 1220J | Bottom-Mid-Left | FIG. 19J | FIG. 22J |
| 1220K | Bottom | FIG. 19K | FIG. 22K |
| 1220L | Bottom-Mid-Right | FIG. 19L | FIG. 22L |
| 1220M | Bottom-Right | FIG. 19M | FIG. 22M |

FIG. 13B and FIG. 13C are simplified plan views of each of the multitude of radiators shown in FIG. 13A, in accordance with an embodiment of the present invention, and show a left loop antenna radiator 1230A (hereinafter alternatively referred to as radiator A) and a right loop antenna radiator 1230B (hereinafter alternatively referred to as radiator B) in FIG. 13B and FIG. 13C, respectively. Each radiator is driven at four ports labeled A0, A90, A180, and A270 for radiator A 1230A and B0, B90, B180, and B270 for radiator B 1230B by a quadrature voltage controlled oscillator QVCO (not shown) on integrated circuit substrate 1210. The following notation is provided for the phase of the signals driving each port.

Radiator A:

$$A0 = p0 + \Phi_{QA}/2$$

$$A90 = p90 - \Phi_{QA}/2$$

$$A180 = p180 + \Phi_{QA}/2$$

$$A270 = p270 - \Phi_{QA}/2$$

Radiator B:
$$B0 = p0 + \Phi_{QB}/2 + \theta$$

$$B90 = p90 - \Phi_{QB}/2 + \theta$$

$$B180 = p180 + \Phi_{QB}/2 + \theta$$

$$B270 = p270 - \Phi_{QB}/2 + \theta$$

In this notation, $\Phi_{QA}$ and $\Phi_{QB}$ correspond to the quadrature phase error of each radiator's QVCO and θ shows the relative phase error between the two radiators. When the operation of electromagnetic radiator system 1200 is correct, there would be no quadrature phase error nor relative phase error and thus $\theta = \Phi_{QA} = \Phi_{QB} = 0°$.

FIG. 13D is a simplified plan view of one of the multitude of slot-ring sensors 1220 shown in FIG. 13A, in accordance with an embodiment of the present invention. Each slot-ring sensor 1220 includes four equally sized straight sides that are joined at the ends forming a square shaped ring. Each side is a straight slot formed including a longitudinal direction longer than a width of the slot. Each slot-ring sensor 1220 is loaded by four sensing circuits at four ports 1310 located at the center of each of the four sides.

Figure 14:
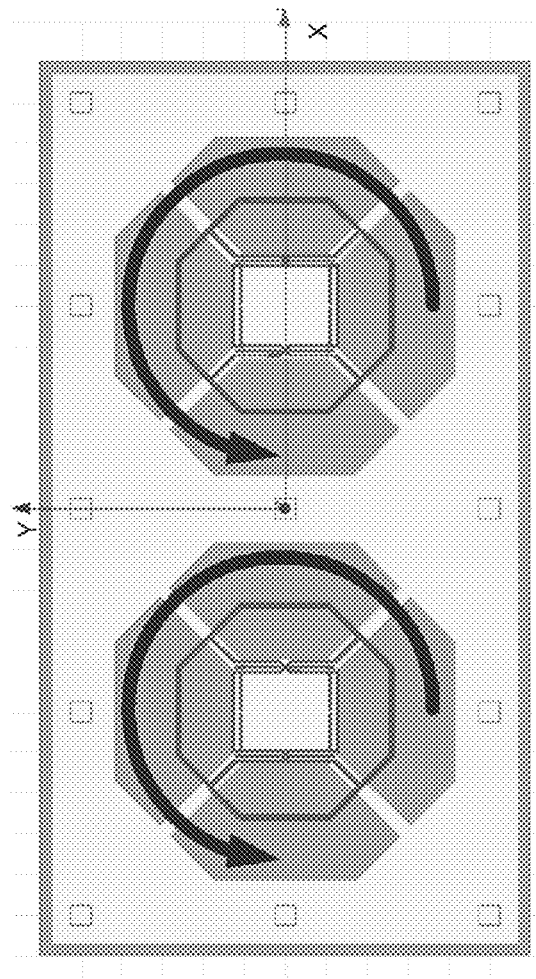
FIG. 14 is a simplified plan view of the electromagnetic radiator system shown in FIG. 12 with the radiators driven in-phase for optimum broadside radiation, in accordance with an embodiment of the present invention.

Each radiator can be driven either clockwise (CW) or counter-clockwise (CCW). FIG. 14 is a simplified plan view of electromagnetic radiator system 1200 shown in FIG. 12 with the radiators driven in-phase for optimum broadside radiation, in accordance with an embodiment of the present invention. Each radiator can be driven either clockwise (CW) or counter-clockwise (CCW). As shown in FIG. 14, for CCW operation, p0=0°, p90=90°, p180=180°, and p270=270°. Similarly, for CW operation (not shown) p0=0°, p90=−90°, p180=−180°, p270=−270°.

Figure 15B:
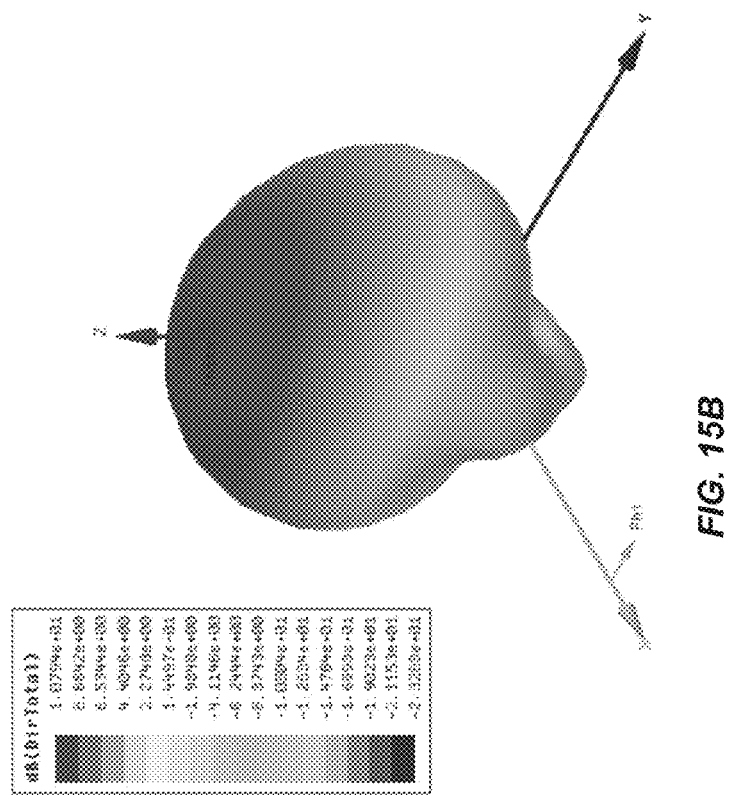
FIG. 15A and FIG. 15B are simulation results of the gain and directivity respectively of the electromagnetic radiator system with the radiators driven as described in FIG. 14.
Figure 15A:
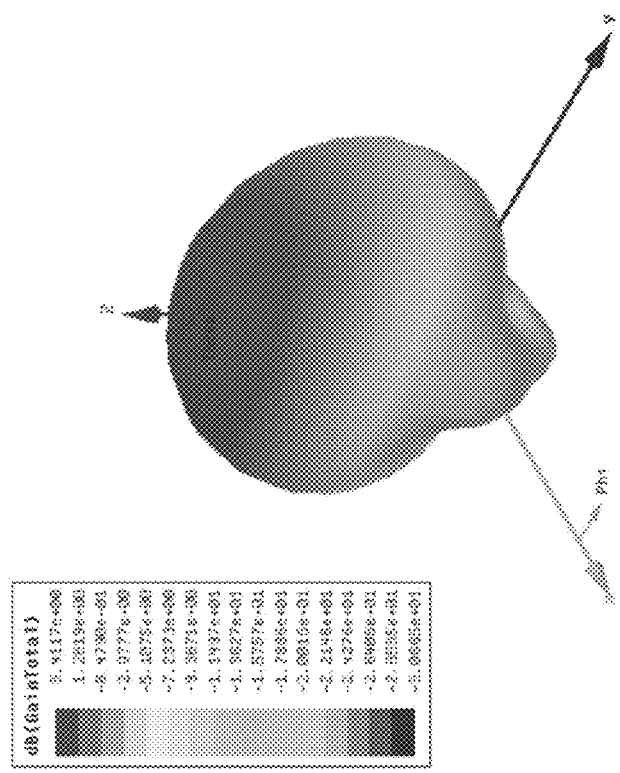

FIG. 15A and FIG. 15B are simulation results of the gain and directivity respectively of electromagnetic radiator system 1200 with the radiators driven as described in FIG. 14. FIG. 15A and FIG. 15B show a maximum gain of 3.4 dB and directivity of 10.8 dB when both radiators are driven CCW.

Figure 16:
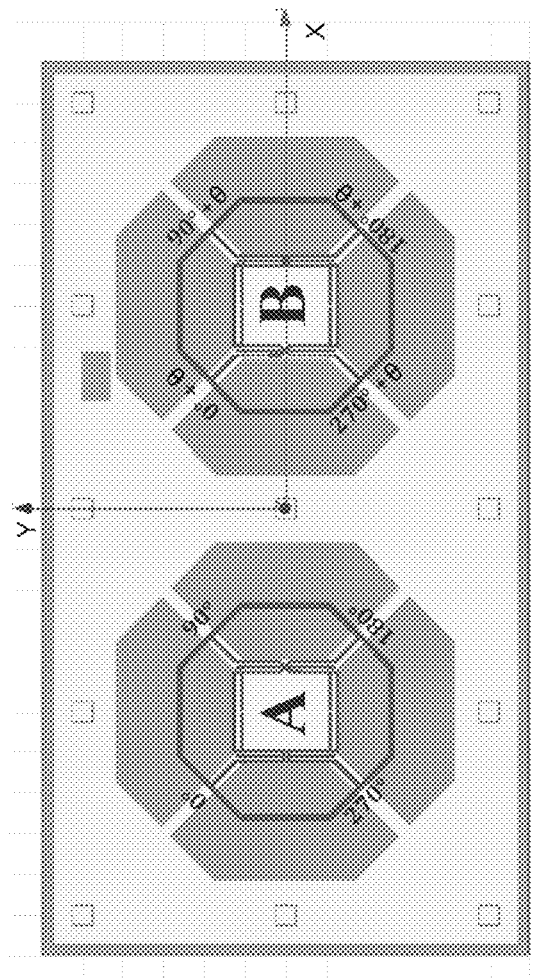
FIG. 16 is a simplified plan view of the electromagnetic radiator system shown in FIG. 12 with the radiators driven with a relative phase error between the two radiators, in accordance with an embodiment of the present invention.

FIG. 16 is a simplified plan view of electromagnetic radiator system 1200 shown in FIG. 12 with the radiators driven with a relative phase error, θ, between the two radiators, in accordance with an embodiment of the present invention. FIG. 17A and FIG. 17B are simulation results of the gain and directivity respectively of electromagnetic radiator system 1200 with the radiators driven as described in FIG. 16 with +/−40° of relative phase error. FIG. 17A is with θ=+40°, while FIG. 17B is with θ=−40°. If there is a relative phase error between the two radiators while the quadrature errors of both of them are still zero, FIG. 17A and FIG. 17B show the array gain will drop by ~0.4 dB with this relative phase error while the quadrature errors of both of them are still zero, i.e. $\Phi_{QA} = \Phi_{QB} = 0°$. This amount of deviation from the optimal performance of the radiator can be detected from the magnitude of the signals that are picked up by each MP sensor to heal the system back to the optimum configuration for radiation as described above.

FIG. 18 is a simplified plan view of one of the multitude of slot-ring sensors 1220 shown in FIG. 12 showing port identification coding T, B, L, and R relative to the X and Y coordinates used in the following EM simulations. FIG. 19A to FIG. 19M are plots of the simulation results showing the voltage signal picked-up in mV along the Y-axis of each plot, at each port (T, B, L, and R) of each sensor of electromagnetic radiator system 1200 shown in FIG. 12, versus the relative phase difference, θ in degrees, between the two radiators along the X-axis of each plot, when both radiators are driven counter-clockwise with a 120 GHz signal. The locations of the plots shown in FIG. 19A to FIG. 19M correspond to the locations of the sensors on electromagnetic radiator system 1200 shown in FIG. 12 and Table 3. Each plot in FIG. 19A to FIG. 19M corresponds to one MP sensor and on each sensor's plot the dashed line curve shows the signal picked up at the port on the left, L, the dotted line curve corresponds to the signal across the port on the right, R, the dotted plus dashed line curve relates to the port on the top, T, and the solid line curve is that of the port on the bottom, B as indicated in FIG. 18.

The plots in FIG. 19A to FIG. 19M show several results. First, there are two pairs of signals picked up by the central MP sensor which follow symmetric patterns as θ varies {(dashed, dotted) and (dotted+dashed, solid)}. This symmetric behavior can be used to detect the relative phase error, θ, by comparing the signals in each pair.

Figure 20:
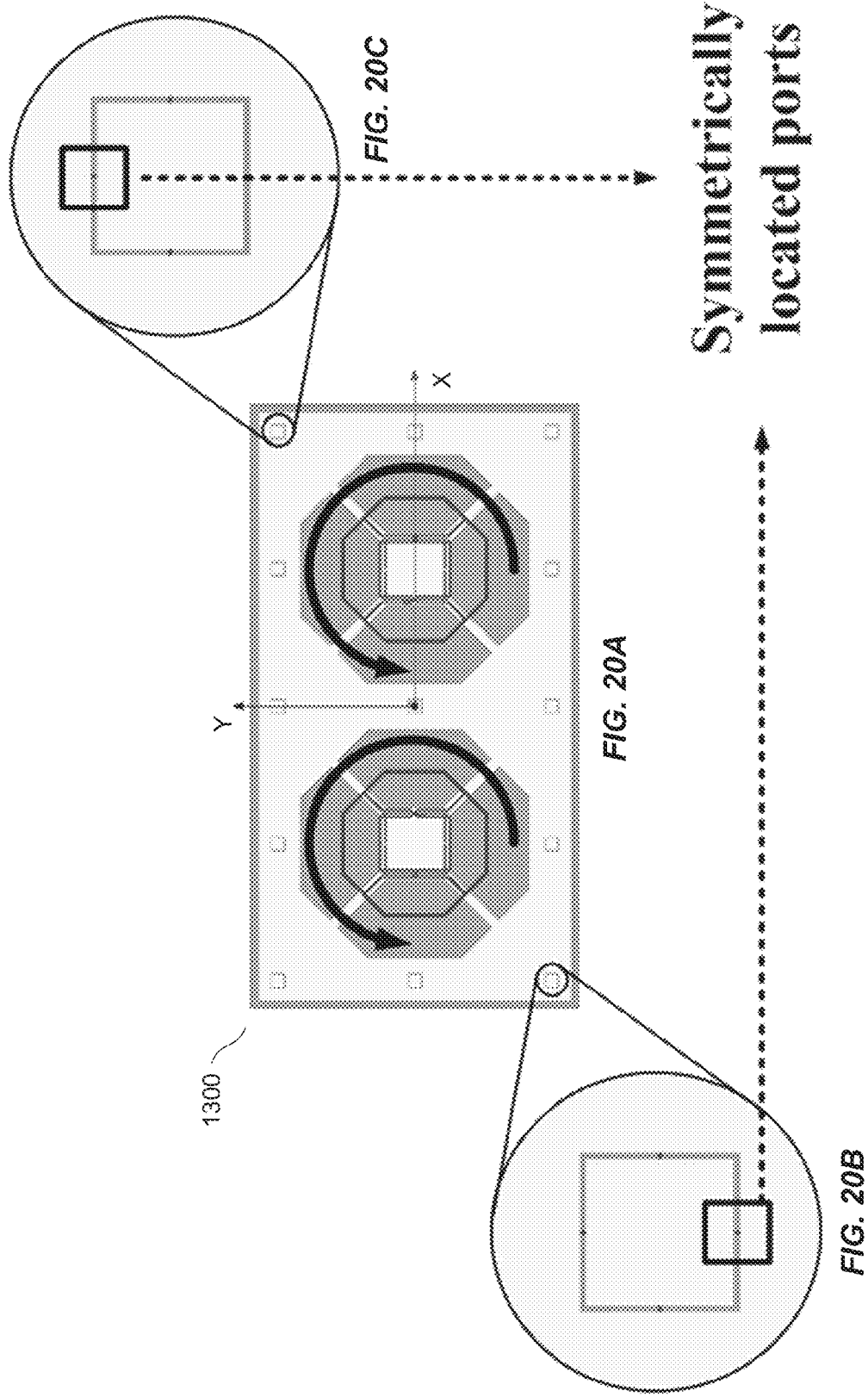
FIG. 20A is a simplified plan view of the electromagnetic radiator system shown in FIG. 12 driven as shown in FIG. 14, in accordance with an embodiment of the present invention.
FIG. 20B to FIG. 20C are simplified plan views of two of the multitude of slot-ring sensors shown in FIG. 13A, in relation to FIG. 20A, including examples of symmetrically located ports, in accordance with an embodiment of the present invention.

Another result is the symmetry of all the sensing ports with respect to the center of the chip as θ varies in either direction, i.e. for each port of each MP sensor there is one other port from another sensor which is located symmetrically on the other side of the chip with respect to the center and that picks up the same signal. FIG. 20A is a simplified plan view of electromagnetic radiator system 1200 shown in FIG. 12 driven as shown in FIG. 14, in accordance with an embodiment of the present invention. FIG. 20B to FIG. 20C are simplified plan views of two of the multitude of slot-ring sensors shown in FIG. 13A, in relation to FIG. 20A, including examples of symmetrically located ports, in accordance with an embodiment of the present invention. For example, as θ increases towards positive values the voltage at the top port of the top-right sensor (dotted+dashed line curve) is exactly same as the voltage at the bottom port of the bottom-left sensor (solid line curve) when θ decreases towards negative values. This happens because these two ports are located symmetrically with respect to the center of the array of radiators, which are in-turn positioned symmetrically on the chip. This is true for every single port on all the sensors. This symmetric behavior of the signals due to the symmetrically located ports is another tool which may be used to sense the degradation in the performance of electromagnetic radiator system 1200.

Figure 21:
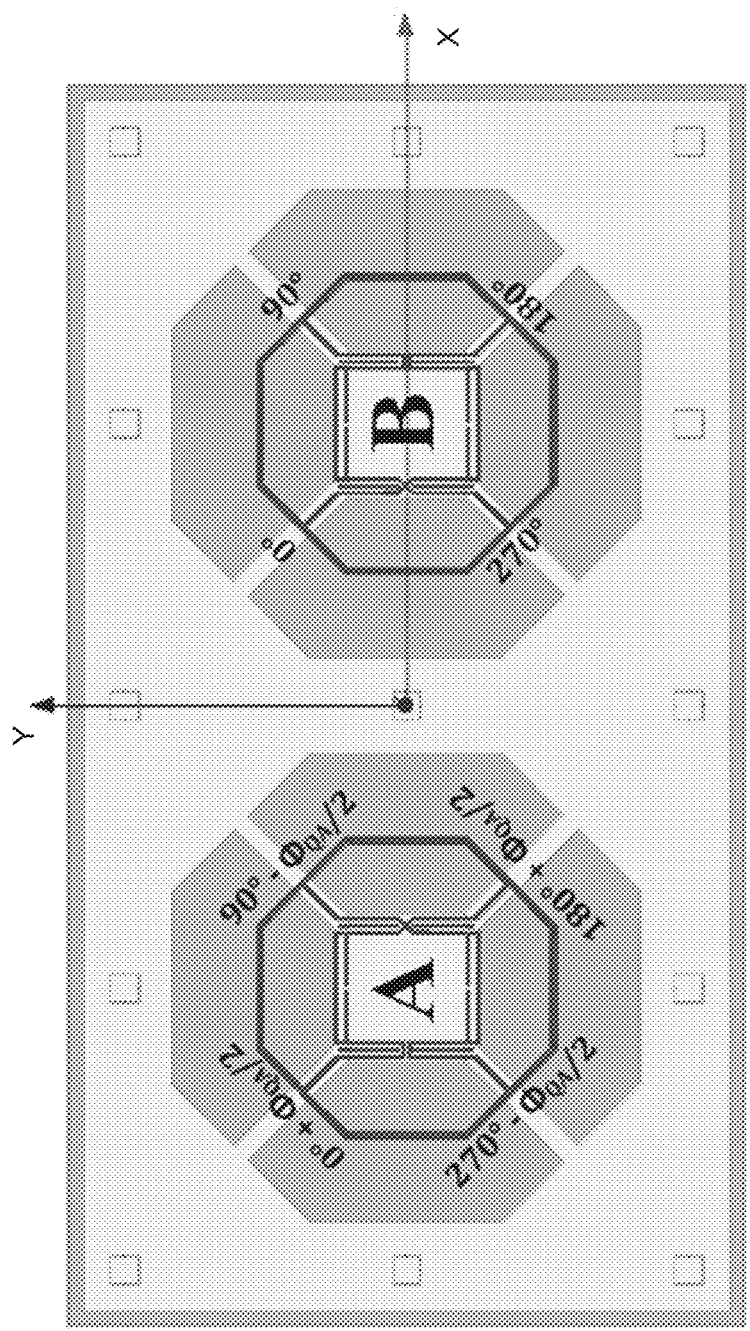
FIG. 21 is a simplified plan view of the electromagnetic radiator system shown in FIG. 12 when both radiators are driven counter-clockwise with a quadrature phase error, $\Phi_{QA}$, in radiator A, in accordance with an embodiment of the present invention.

The effect of quadrature phase error is now considered. FIG. 21 is a simplified plan view of the electromagnetic radiator system shown in FIG. 12 when both radiators are driven counter-clockwise with a quadrature phase error, $\Phi_{QA}$, in radiator A, in accordance with an embodiment of the present invention.

FIG. 22A to FIG. 22M are plots of the simulation results showing the voltage generated in mV along the Y-axis of each plot, at each port (T, B, L, and R) of each sensor of the electromagnetic radiator system shown in FIG. 12 versus the quadrature phase error, $\Phi_{QA}$ in degrees, in radiator A along the X-axis of each plot, when both radiators are driven counter-clockwise. The locations of the plots shown in FIG. 22A to FIG. 22M correspond to the locations of the sensors on electromagnetic radiator system 1200 shown in FIG. 12 and Table 3. Each plot in FIG. 22A to FIG. 22M corresponds to one MP sensor and on each sensor's plot the dashed line curve shows the signal picked up at the port on the left, L, the dotted line curve corresponds to the signal across the port on the right, R, the dotted plus dashed line curve relates to the port on the top, T, and the solid line curve is that of the port on the bottom, B as indicated in FIG. 18. FIG. 22A to FIG. 22M show this quadrature phase error type of deviation from normal operation may also be detected through the MP sensors. For example, comparing the quadrature phase error signals (FIG. 22A to FIG. 22M) of left, L, and right, R sensor ports with the previously described relative phase error signals (FIG. 19A to FIG. 19M) of left, L, and right, R sensor ports shows a difference in their trend. When there is a relative phase error (FIG. 19A to FIG. 19M), the voltage magnitudes on all the ports of the left, FIG. 19F, and right, FIG. 19H, sensors vary in two different directions, i.e. on one sensor the magnitudes of signals increase while the signals decrease on the other sensor. In contrast, in the quadrature phase error (FIG. 22A to FIG. 22M) example, all the signals follow the same trend on both left and right sensor ports.

Figure 23B:
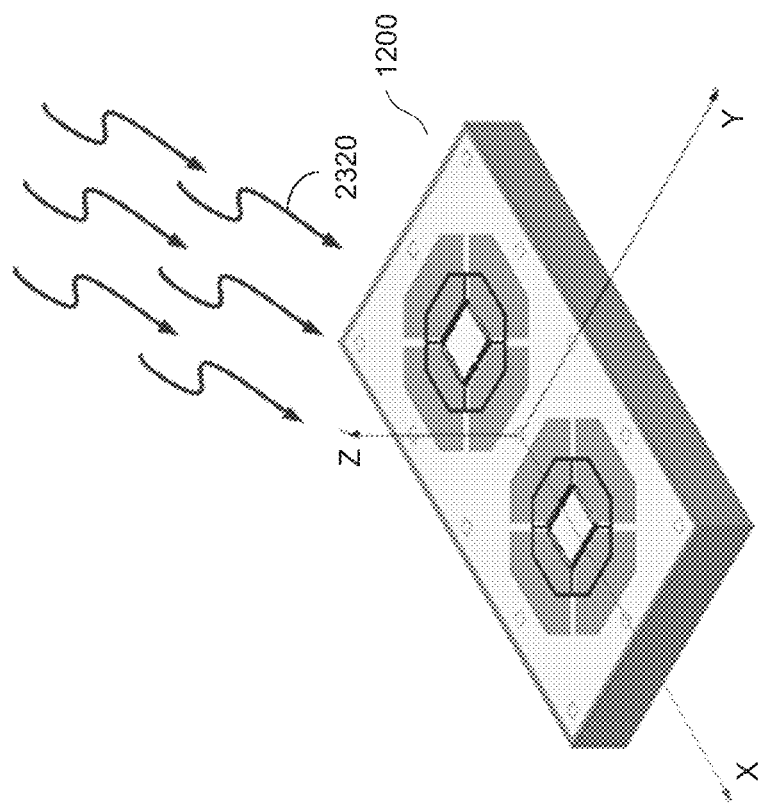
FIG. 23A and FIG. 23B are simplified plan views of the electromagnetic radiator system shown in FIG. 12 respectively showing circuit leakage and external radiation mechanisms that may affect sensor sensitivity.
Figure 23A:
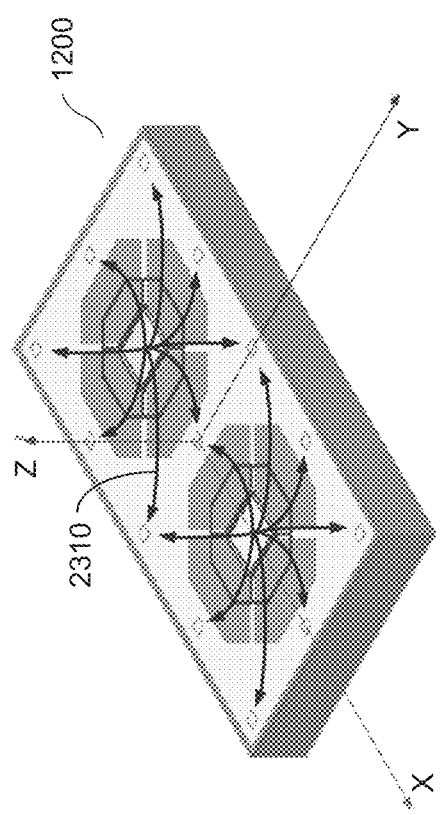

FIG. 23A and FIG. 23B are simplified plan views of electromagnetic radiator system 1200 shown in FIG. 12 respectively showing a circuit leakage 2310 and an external radiation 2320, mechanisms that may affect sensor sensitivity. The sensitivity of MP sensors to the mechanisms that can potentially affect their performance is very low. Two of such mechanisms are 1) leakage 2310 from strongly-driven circuitry to the sensors through substrate and 2) presence of external radiation 2320 or external electromagnetic waves in the environment.

FIG. 24A is a simplified perspective view of an electromagnetic radiator system 2400 in an integrated circuit substrate 2410 including a pair of radiators 2420 similar to FIG. 12 and including six slot-ring sensors 2430 and three pairs of metallic contacts 2440 connected to integrated circuit substrate 2410, in accordance with an embodiment of the present invention to evaluate circuit leakage to the slot-ring sensors 2430. Three pairs of metallic contacts 2440 to integrated circuit substrate 2410 have been made in the regions with large voltage swing; one pair in the center of each of the two radiators and one pair in the central region which corresponds to a distribution network. FIG. 24B is a simplified perspective view of one of the pairs of metallic contacts 2440 to integrated circuit substrate 2410 shown in FIG. 24A, in accordance with an embodiment of the present invention.

Figure 25:
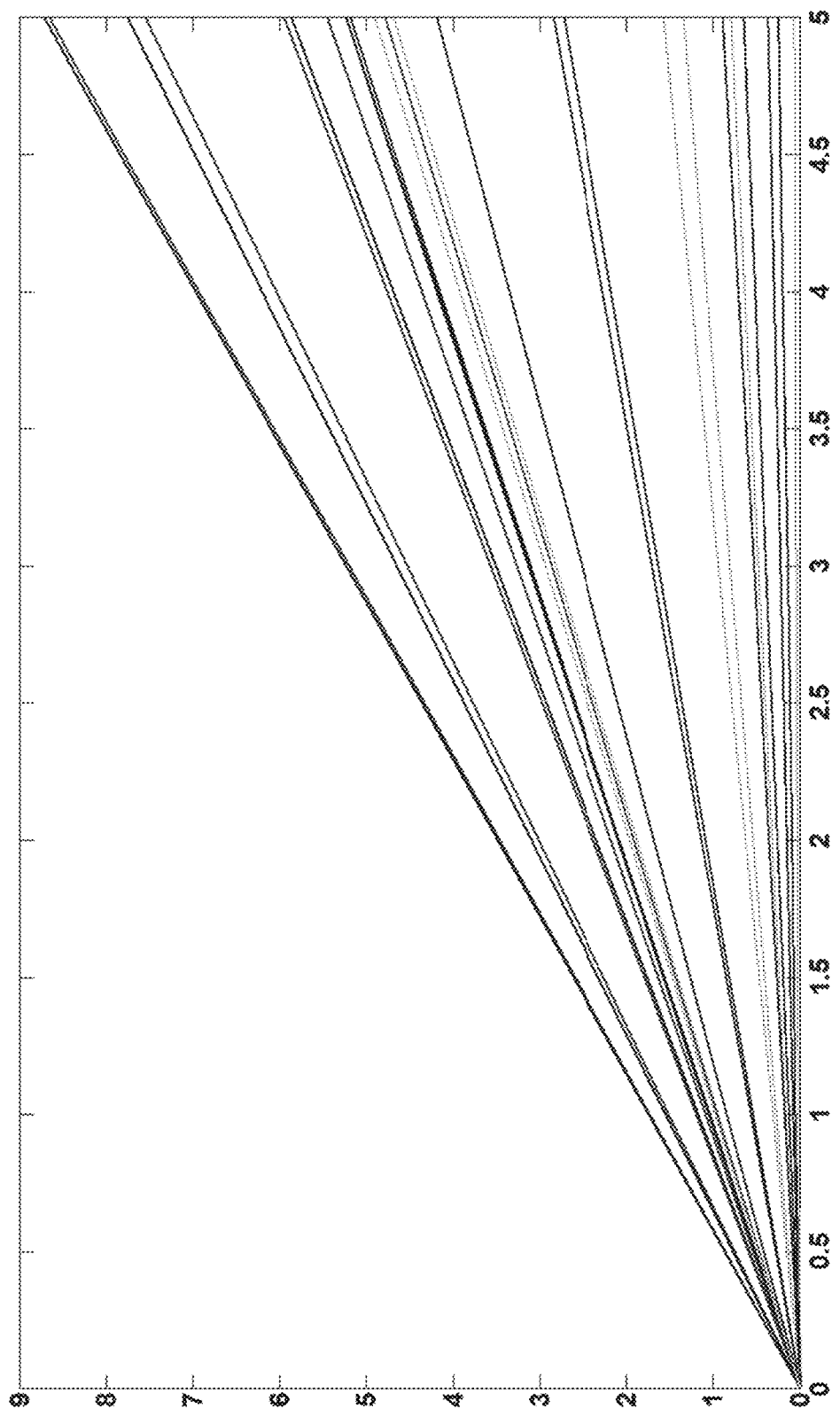
FIG. 25 is a plot of the simulation results showing the voltage generated at each port of each sensor of the electromagnetic radiator system shown in FIG. 24A when all three pairs of ports are driven with quadrature signals while the radiators are off

FIG. 25 is a plot of the simulation results showing the voltage in μV generated or picked-up along the Y-axis of the plot versus the driving amplitude in V at the substrate contacts along the X-axis, at each port of each sensor of electromagnetic radiator system 2400 shown in FIG. 24A when all three pairs of metallic contacts 2440 are driven with quadrature signals while the pair of radiators are off. FIG. 25 shows the sensor's sensitivity to circuit leakage.

FIG. 25 shows that the maximum sensitivity of the MP sensors to the driving metallic contacts' amplitude is ~1.8 μV/V meaning the leakage is at least four orders of magnitude smaller than the desired signal, which amplitude is tens of mV during the normal operation of the radiators.

Figure 26:
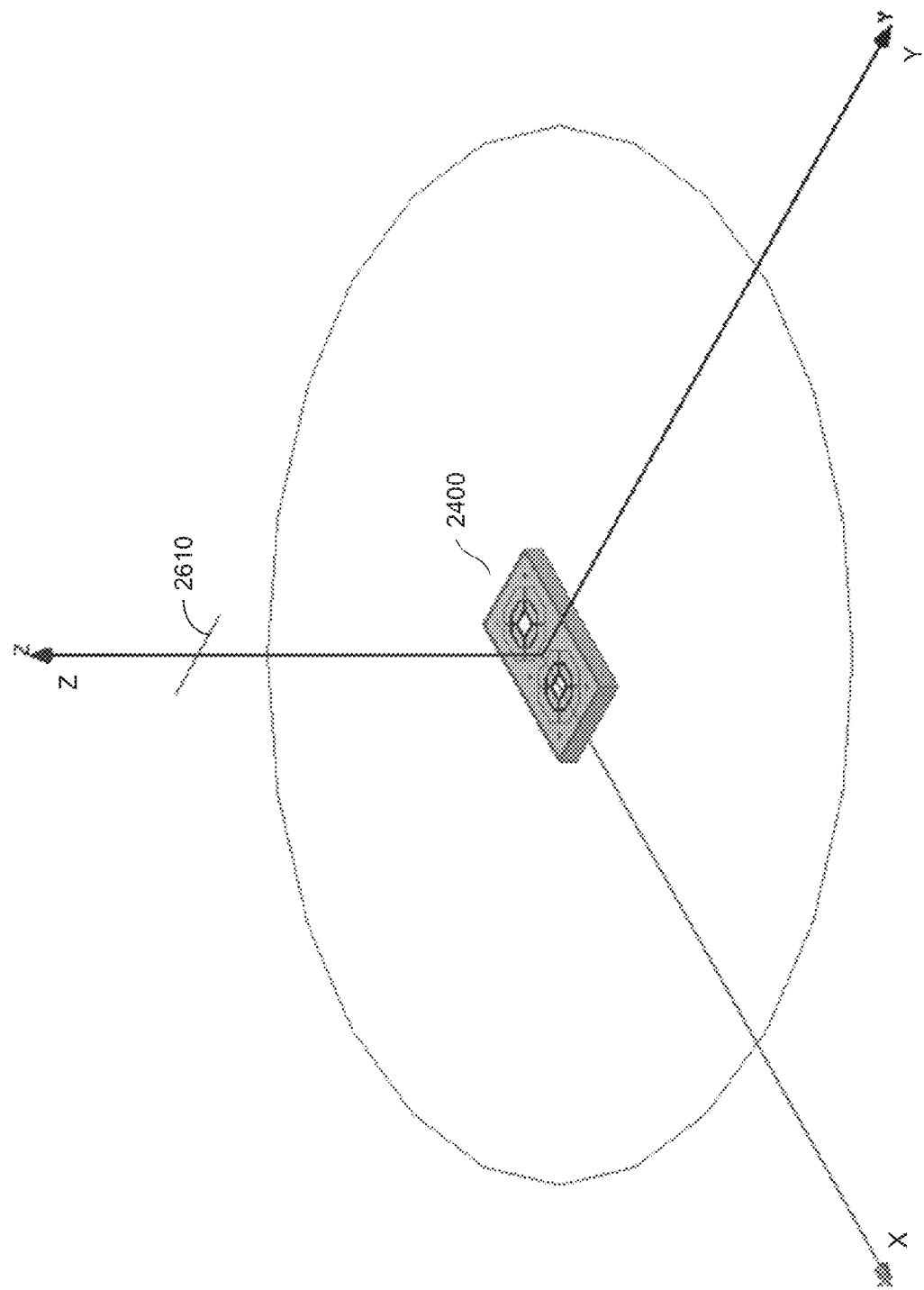
FIG. 26 is a simplified perspective view of the electromagnetic radiator system shown in FIG. 24A under a simulated external radiation source.
Figure 27:
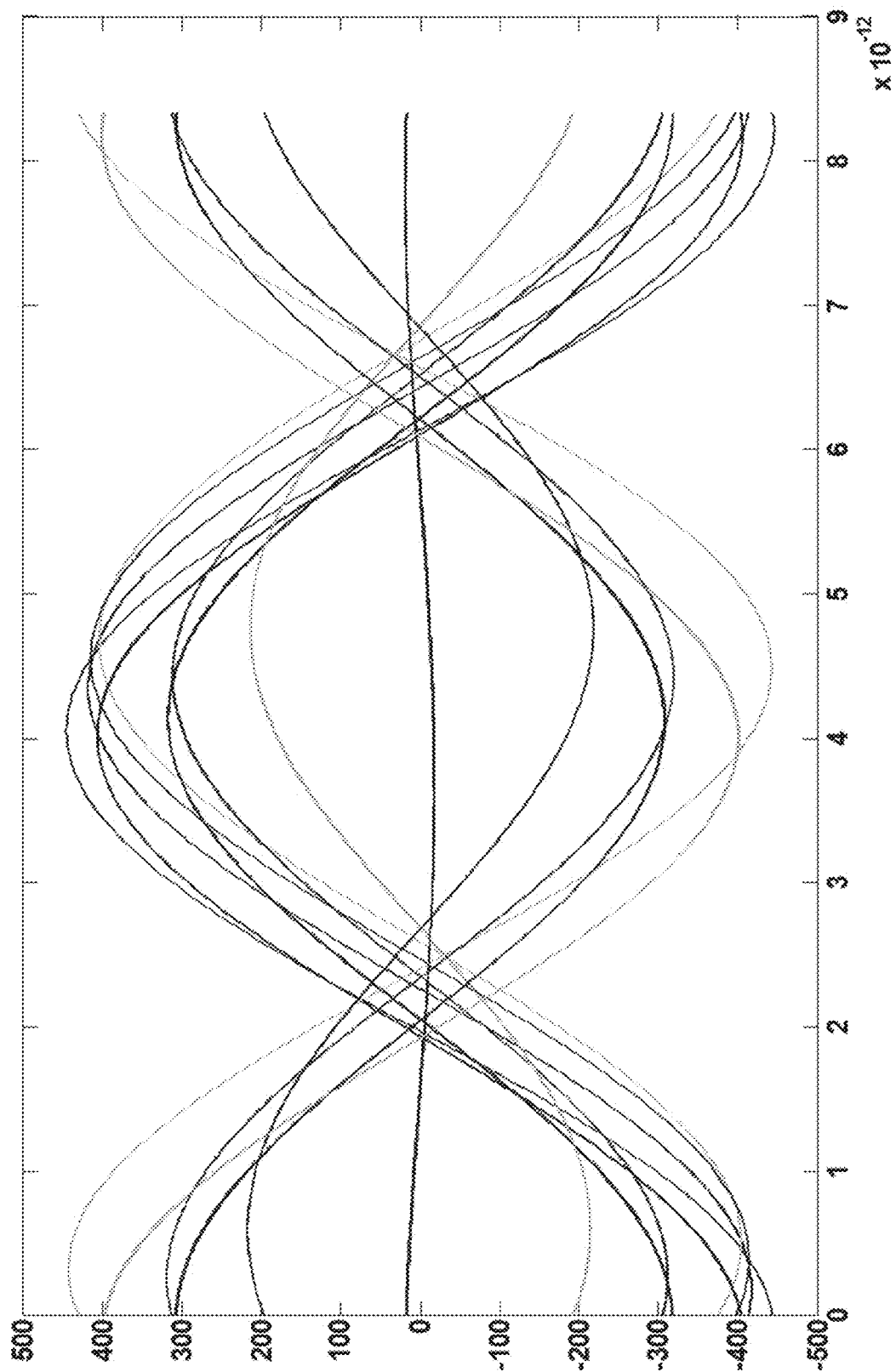
FIG. 27 is a plot of the simulation results showing the time domain voltage signals picked up at each port of each sensor of the electromagnetic radiator system shown in FIG. 24A when the simulated external radiation source shown in FIG. 26 is on while the pair of radiators in the integrated circuit substrate are off.

FIG. 26 is a simplified perspective view of electromagnetic radiator system 2400 shown in FIG. 24A under a simulated external radiation source 2610 to evaluate the performance of the sensors in the presence of external EM radiation. External radiation source 2610 in this simulation is a λ/2-dipole placed 5 mm above electromagnetic radiator system 2400. The total input power from external radiation source 2610 is 0 dBm which is much higher than any expected external interference. The magnitude of the Poynting vector on the surface of electromagnetic radiator system 2400 is ~15 W/m². FIG. 27 is a plot of the simulation results showing the time domain voltage signals in μV picked up along the Y-axis of the plot versus time in pS along the X-axis, at each port of each sensor of electromagnetic radiator system 2400 shown in FIG. 24A when simulated external radiation source 2610 shown in FIG. 26 is on while pair of radiators 2420 in integrated circuit substrate 2410 are off. FIG. 27 shows the sensor's sensitivity to external radiation. FIG. 27 shows that the amplitude of the largest signal at the slot-ring sensors 2430 is less than 0.5 mV, which is two orders of magnitude smaller than the desired signal.

As mentioned above, various types of antennas may be used as MP sensors to collect information regarding substrate modes and some examples will be discussed below. The term substrate mode may be equivalent to surface mode particulary when the substrate is thin, therefore MP sensors will also pick up surface mode field parts.

Figure 28:
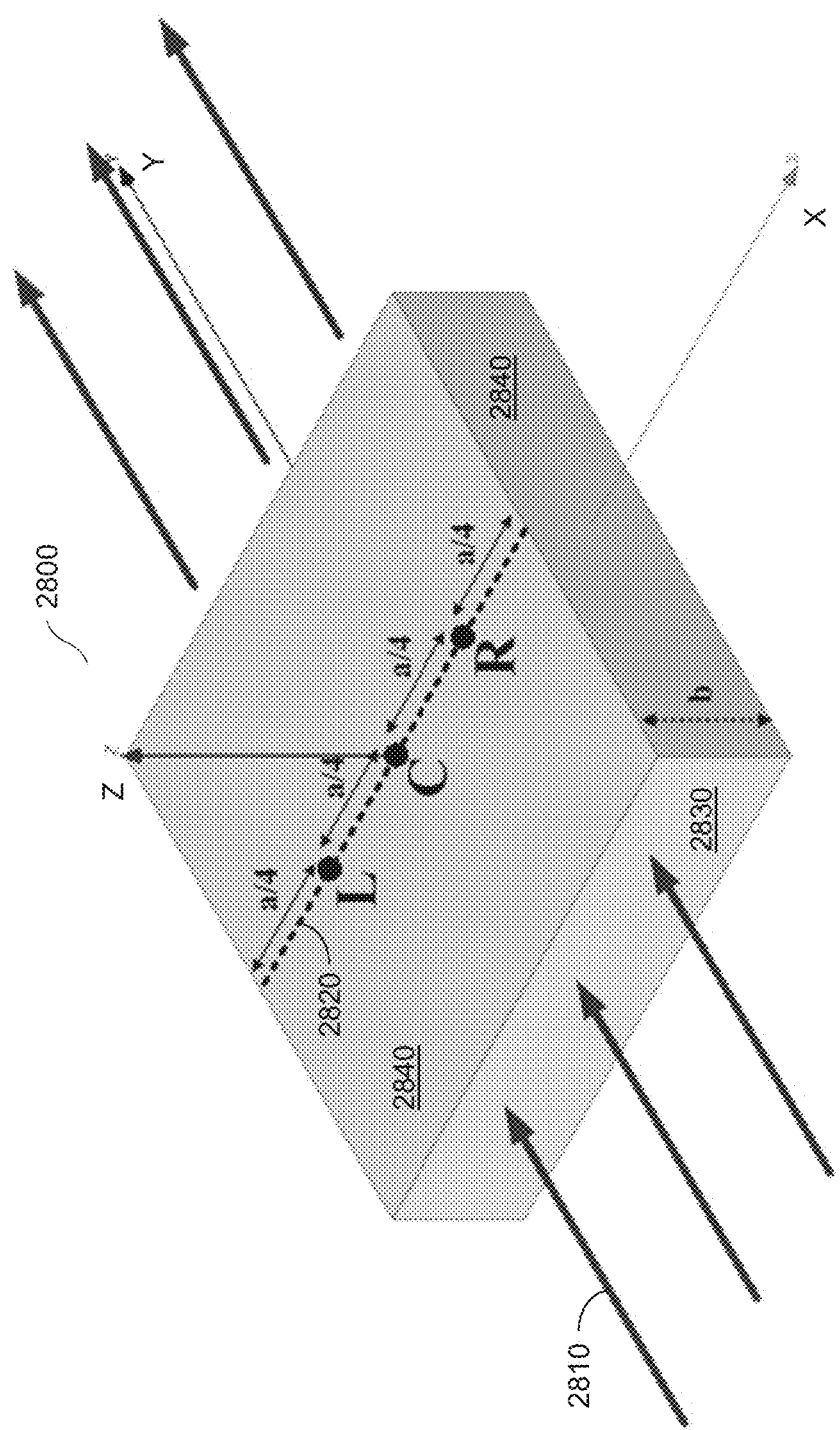
FIG. 28 is a simplified perspective view of a simulated rectangular waveguide used to demonstrate the operation of different types of sensors.
Figure 29A:
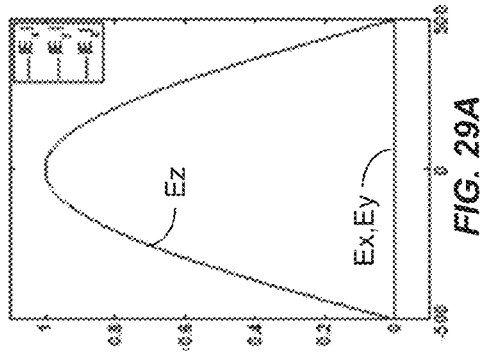
FIG. 29A to FIG. 29T are plots of the simulation results showing the first ten propagating modes and their E-field and H-field components (normalized to the largest component of each) along a row on the top metal surface shown in FIG. 28.

FIG. 28 is a simplified perspective view of a simulated rectangular waveguide 2800 used to demonstrate the operation of different types of sensors. The waveguide is excited with a multitude of different modes 2810 carrying equal power and three MP sensors are placed at points L, C, and R on the waveguide's surface in a row 2820 perpendicular to the direction of mode propagation, which is the Y direction. The waveguide dimensions are indicated as a=1000 μm and b=250 μm. The sensors are spaced apart from each other and from the edge of the waveguide by a distance of a/4. A dielectric material 2830 inside the waveguide is silicon with ∈r=11.9, which is surrounded on four exterior sides by a metal layer 2840. FIG. 29A to FIG. 29T are plots of the simulation results showing the first ten propagating modes and their E-field and H-field components, normalized to the largest component of each, along row 2820 on the top metal surface shown in FIG. 28 according to Table 4 below. Each plot in FIG. 29A to FIG.

29T shows normalized magnitude on the Y-axis of the plot versus position in the x direction in μm along the X-axis of the plot.

TABLE 4

Figure 29B:
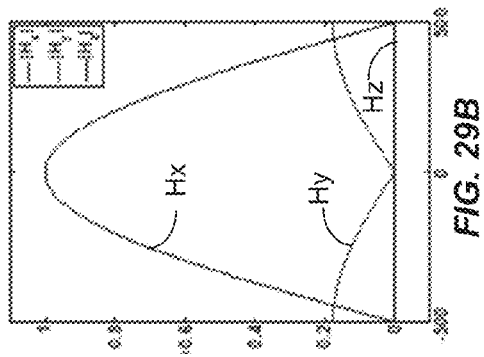
Figure 29C:
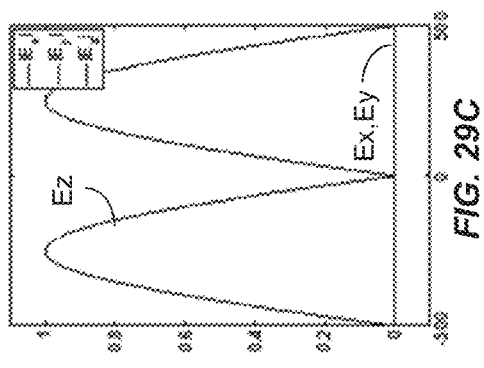
Figure 29D:
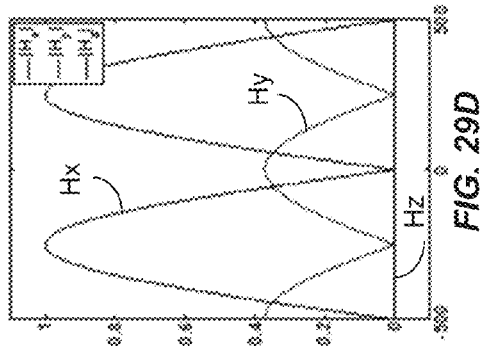
Figure 29E:
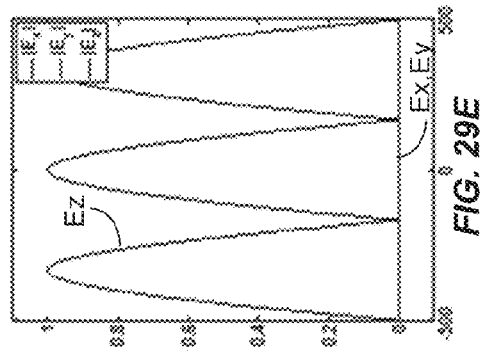
Figure 29F:
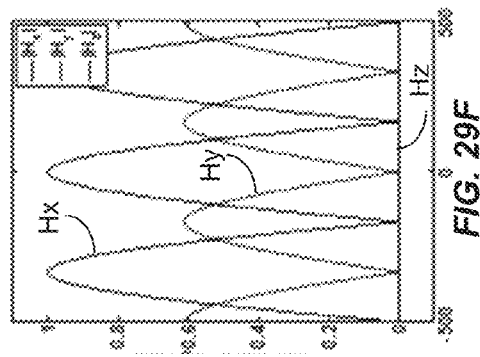
Figure 29G:
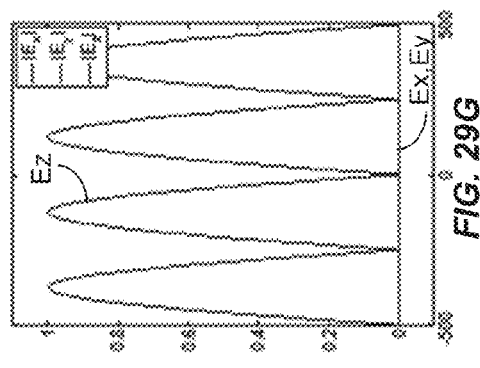
Figure 29H:
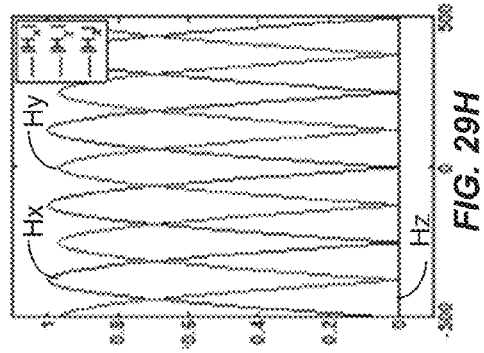
Figure 29I:
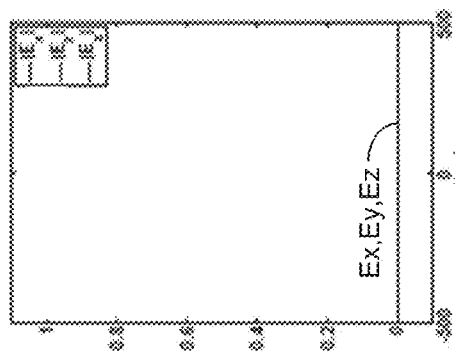
Figure 29J:
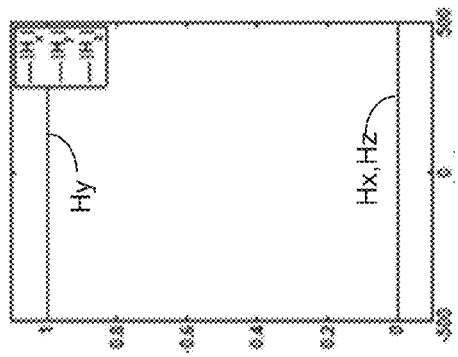
Figure 29K:
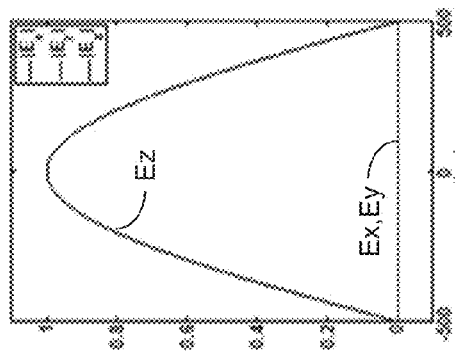
Figure 29L:
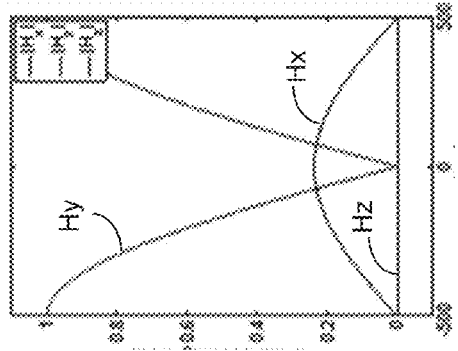
Figure 29M:
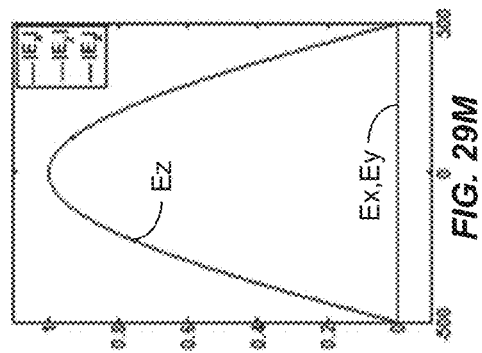
Figure 29N:
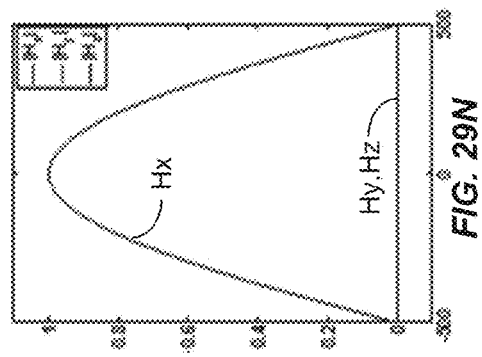
Figure 29O:
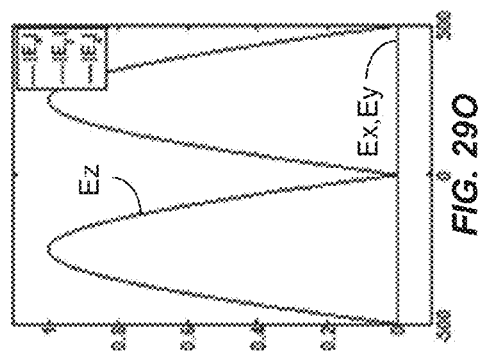
Figure 29P:
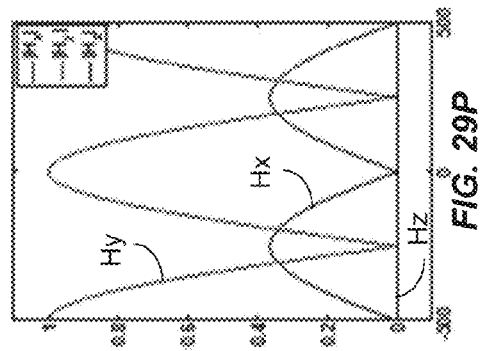

| Mode | E-field component | H-field component |
| --- | --- | --- |
| $TE_{10}$ | FIG. 29A | FIG. 29B |
| $TE_{20}$ | FIG. 29C | FIG. 29D |
| $TE_{30}$ | FIG. 29E | FIG. 29F |
| $TE_{40}$ | FIG. 29G | FIG. 29H |
| $TE_{01}$ | FIG. 29I | FIG. 29J |
| $TE_{11}$ | FIG. 29K | FIG. 29L |
| $TM_{11}$ | FIG. 29M | FIG. 29N |
| $TE_{21}$ | FIG. 29O | FIG. 29P |
| $TM_{21}$ | FIG. 29Q | FIG. 29R |
| $TE_{60}$ | FIG. 29S | FIG. 29T |

FIG. 30A is a simplified perspective view of three linear slot antennas provided as MP sensors 3010 with their longitudinal axes oriented in the Y direction of simulated rectangular waveguide 2800 shown in FIG. 28, in accordance with an embodiment of the present invention. FIG. 30B is a simplified perspective view of one of the three linear slot antenna provided as MP sensors 3010 shown in FIG. 30A, in accordance with an embodiment of the present invention. MP sensors 3010 each include a sensor port 3020 at their mid-point. The sensor ports are terminated with 50Ω loads.

FIG. 31A to FIG. 31J are plots of the simulation results showing the voltage in mV along the Y-axis of each plot picked up by each of linear slot sensors 3010, L, C, and R shown in FIG. 30A plotted versus the frequency of excitation in GHz along the X-axis of each plot for each of the first ten propagating modes according to table 5 below. The scales of the axes are the same for all the plots to make comparisons easier.

TABLE 5

Figure 31A:
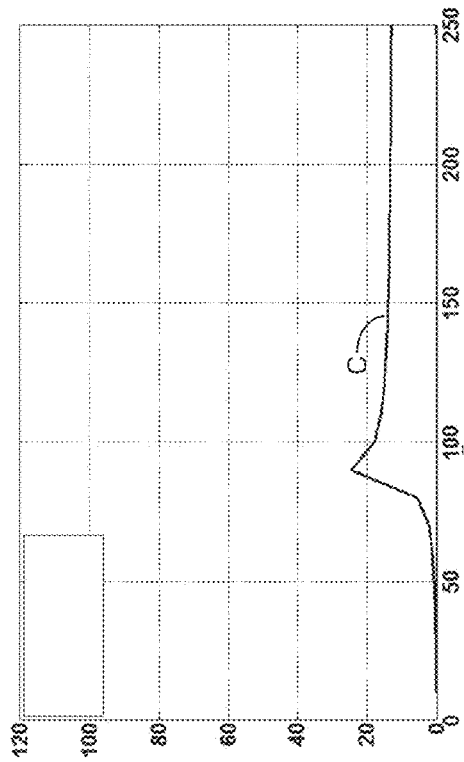
Figure 31B:
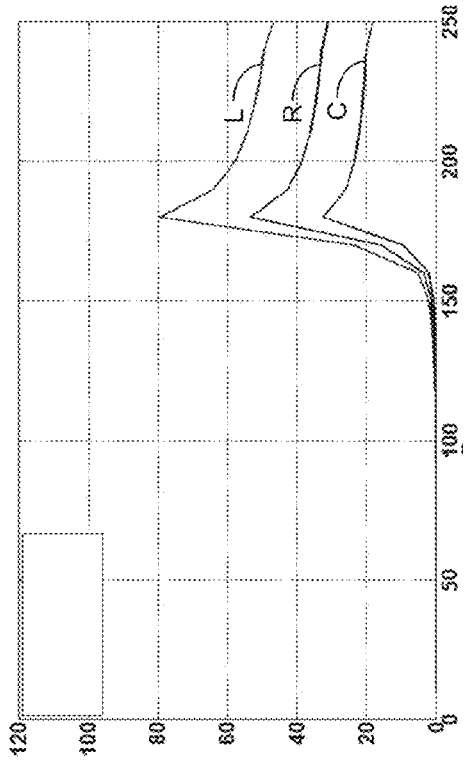
Figure 31C:
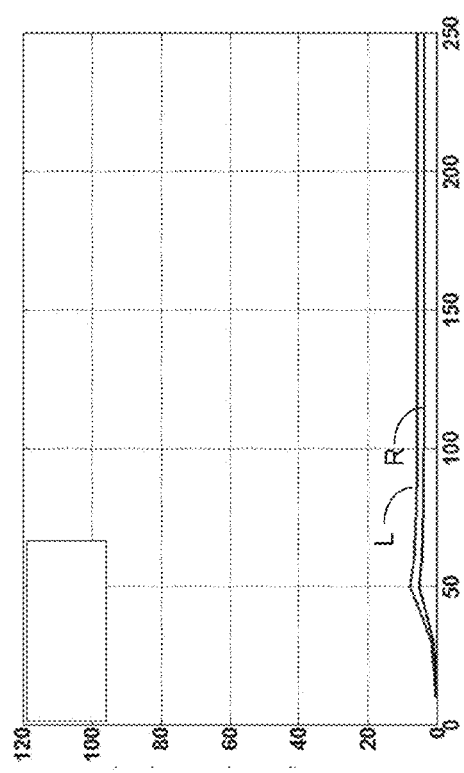
Figure 31D:
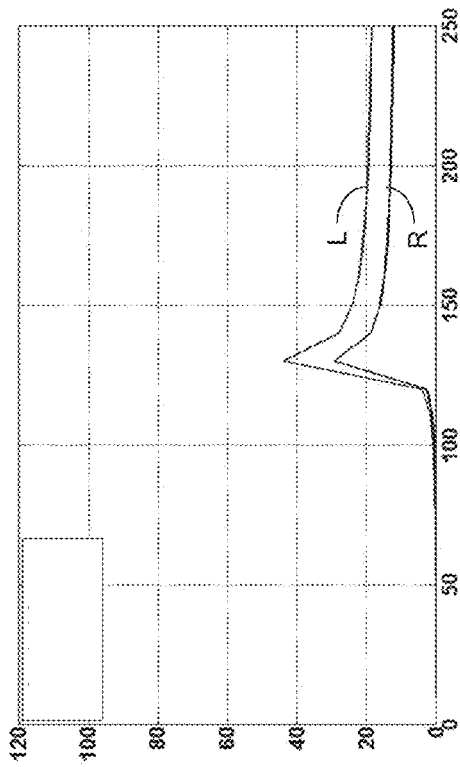
Figure 31E:
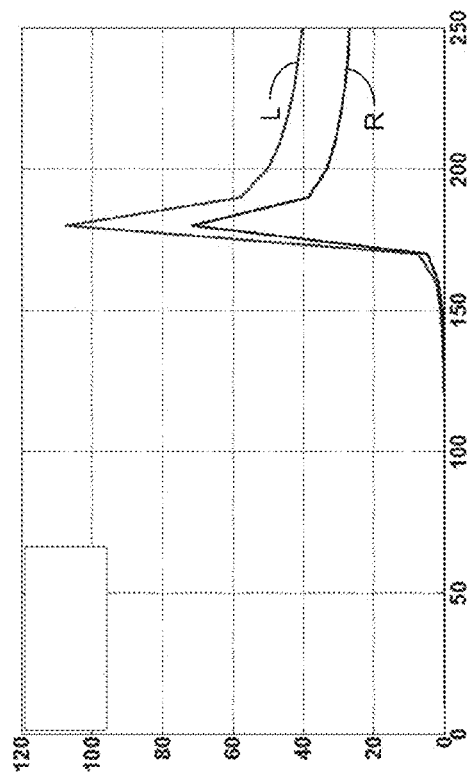
Figure 31G:
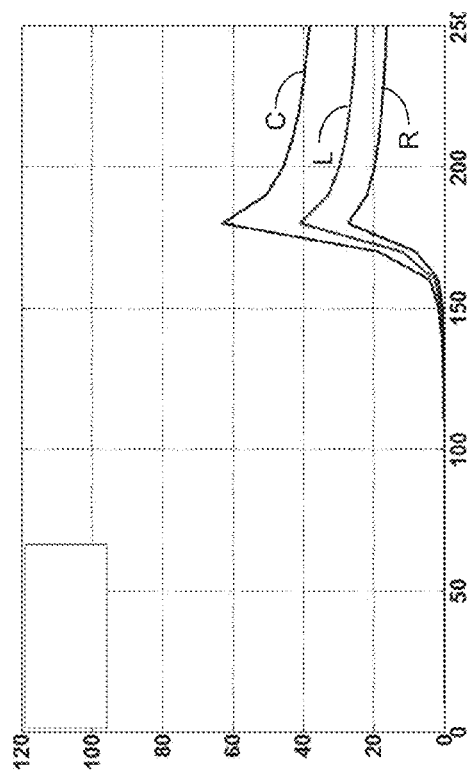
Figure 31F:
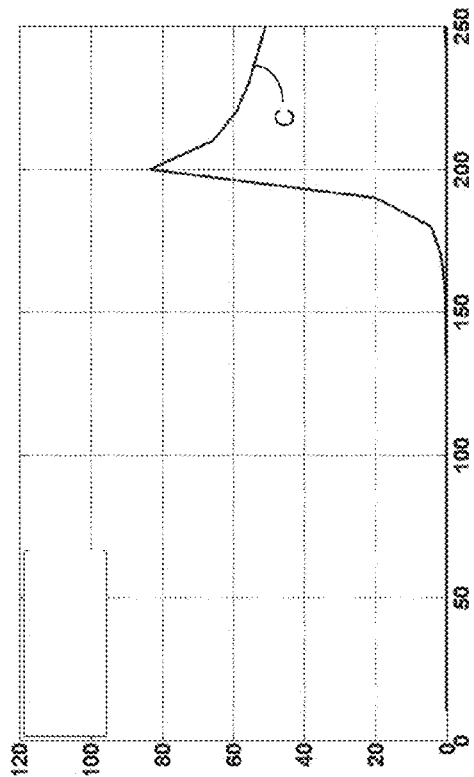
Figure 31H:
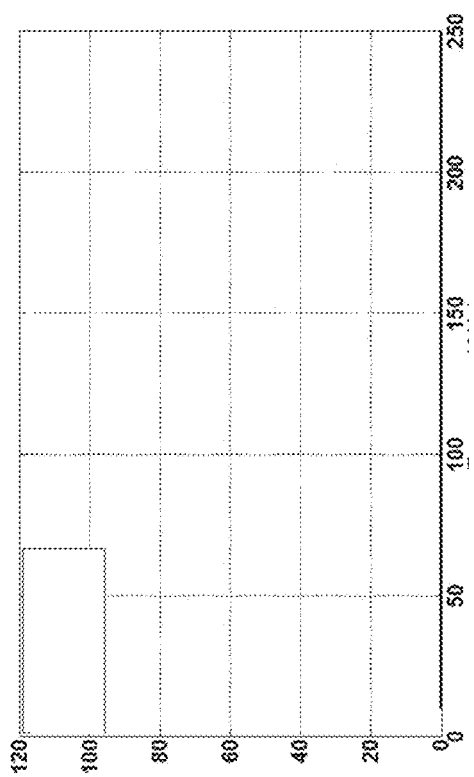

| Mode | FIG. |
| --- | --- |
| $TE_{10}$ | FIG. 31A |
| $TE_{20}$ | FIG. 31B |
| $TE_{30}$ | FIG. 31C |
| $TE_{40}$ | FIG. 31D |
| $TE_{01}$ | FIG. 31E |
| $TE_{11}$ | FIG. 31F |
| $TM_{11}$ | FIG. 31G |
| $TE_{21}$ | FIG. 31H |
| $TM_{21}$ | FIG. 31I |
| $TE_{50}$ | FIG. 31J |

For each mode, the sensors do not pick up any signals at the frequencies below the cut-off frequency associated with the mode. As the frequency increases and the excited mode starts to propagate along the waveguide, linear slot sensors 3010 begin to pick up non-zero signals. Comparing the amplitude of these signals with the field patterns for each mode shows that the strength of the signals picked up by these sensors is proportional to the magnitude of the $H_y$ component of the electromagnetic waves. For example, for $TE_{11}$ mode (FIG. 31F), the sensor located at the center does not pick up any signal while left and right sensors pick up considerably larger signals since $|H_y|$ is a maximum at those two points. Similarly, for $TM_{11}$ (FIG. 31F) and $TM_{21}$ (FIG. 31I) modes, sensors do not pick up any signal since there is no magnetic field component in the direction of propagation for TM modes, i.e. $H_y=0$ for TM modes. Similar argument justifies the relative strength of the sensors' outputs for all the modes and can be easily verified by comparing the sensors outputs and $|H_y|$ for each mode. The behavior of Y-oriented slot antennas shows that, in this example, they act as TE mode sensors since there is no $H_y$ component in the TM modes. Therefore, whatever signal is observed at the sensors is only related to the excited TE modes.

FIG. 32A is a simplified perspective view of three linear slot antenna 3210 provided as MP sensors with their longitudinal axes oriented in the X direction of simulated rectangular waveguide 2800 shown in FIG. 28, in accordance with an embodiment of the present invention. FIG. 32B is a simplified perspective view of one of the three linear slot antenna provided as MP sensors 3210 shown in FIG. 32A, in accordance with an embodiment of the present invention. MP sensors 3210 each include a sensor port 3220 at their mid-point. The sensor ports are terminated with 50Ω loads.

FIG. 33A to FIG. 33J are plots of the simulation results showing the voltage in mV along the Y-axis of each plot picked up by each of the linear slot sensors 3210, L, C, and R shown in FIG. 32A plotted versus the frequency of excitation in GHz along the X-axis of each plot for each of the first ten propagating modes according to table 6 below. The scales of the axes are the same for all the plots to make comparisons easier.

TABLE 6

Figure 33A:
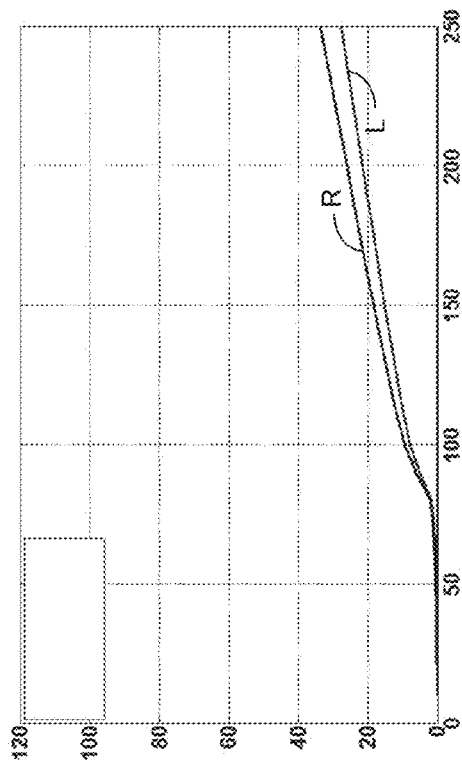
Figure 33B:
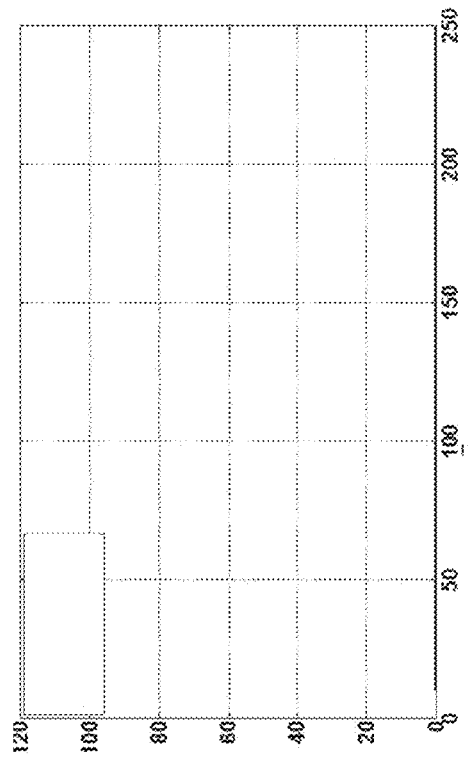
Figure 33C:
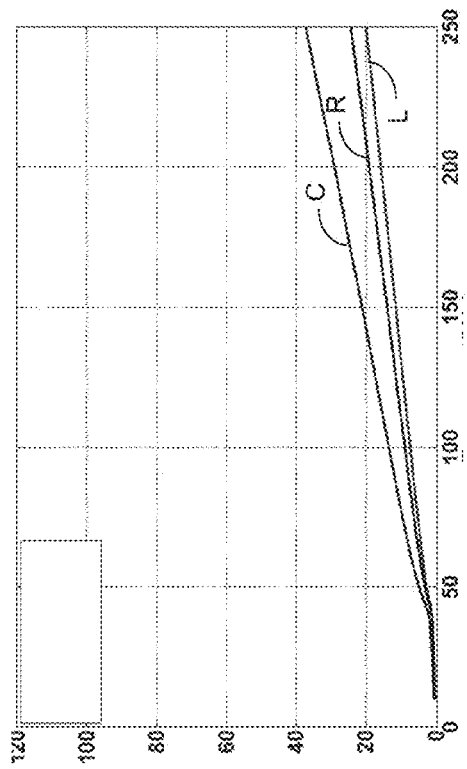
Figure 33D:
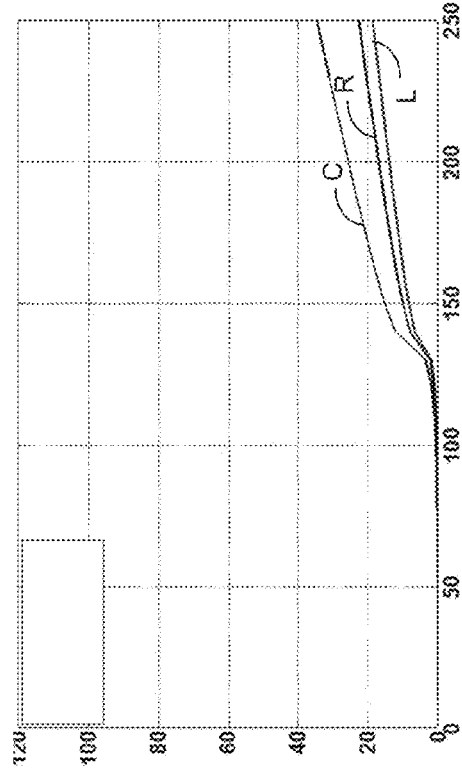
Figure 33J:
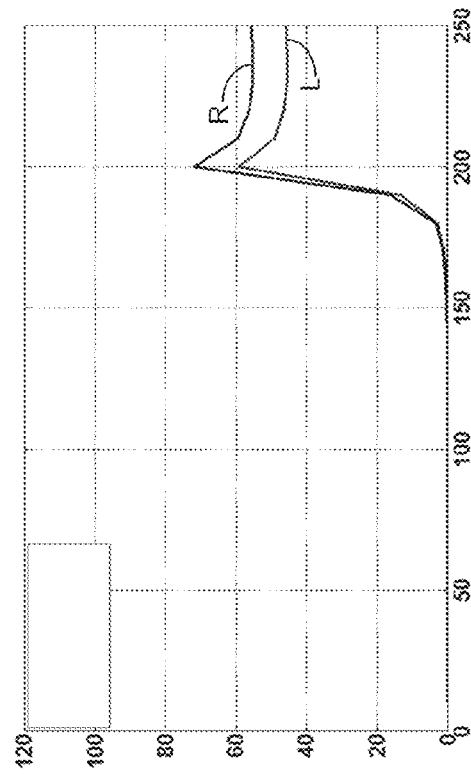
Figure 33I:
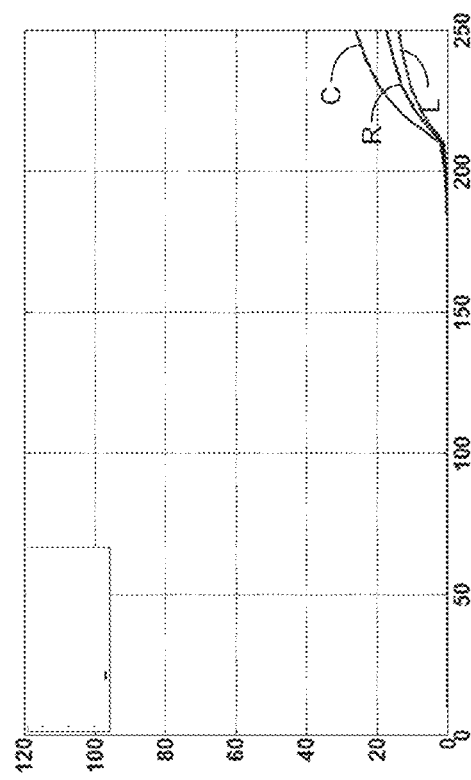

| Mode | FIG. |
| --- | --- |
| $TE_{10}$ | FIG. 33A |
| $TE_{20}$ | FIG. 33B |
| $TE_{30}$ | FIG. 33C |
| $TE_{40}$ | FIG. 33D |
| $TE_{01}$ | FIG. 33E |
| $TE_{11}$ | FIG. 33F |
| $TM_{11}$ | FIG. 33G |
| $TE_{21}$ | FIG. 33H |
| $TM_{21}$ | FIG. 33I |
| $TE_{50}$ | FIG. 33J |

Similar to Y-oriented slot antennas described in FIG. 30A to FIG. 31J, comparison between the outputs of X-oriented slot antenna sensors 3210 shown in FIG. 33A to FIG. 33J and the field patterns shown in FIG. 29A to FIG. 29T reveals that X-oriented slot antennas 3210 only pick up $H_X$ component of the propagating wave. For example, for $TE_{40}$ mode (FIG. 33D) all three sensors are located exactly where the $H_X$ is zero so they do not pick up any signal. Also, for $TE_{01}$ mode (FIG. 33E), $|H_x|$ is equal to zero in the X-axis direction and thus the outputs of all three sensors are zero for this mode. The sensor outputs for other modes can be justified in the same manner as well.

According to another embodiment, a dipole antenna is another type of MP sensor that may be used to distinguish between different modes. For the case of rectangular waveguide 2800, since the tangential components of electric field on the top metallic surface are zero, the dipole is formed on a lower metal layer located 10 μm below the top surface so that $E_x$ and $E_y$ receive nonzero values. FIG. 34A to FIG. 34T are plots of the simulation results showing the first ten propagating modes and their E-field and H-field components, normalized to the largest component of each, 10 μm below row 2820 on the top metal surface shown in FIG. 28 according to Table 4 below. Each plot in FIG. 34A to FIG. 34T shows normalized magnitude on the Y-axis of the plot versus position in the x direction in μm along the X-axis of the plot.

TABLE 7

Figure 34D:
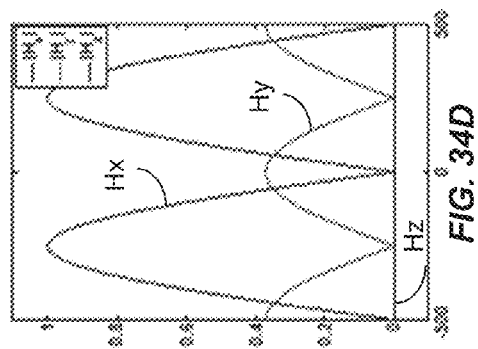
FIG. 34A to FIG. 34T are plots of the simulation results showing the first ten propagating modes and their E-field and H-field components, normalized to the largest component of each, 10 μm below the row on the top metal surface shown in FIG. 28.
Figure 34C:
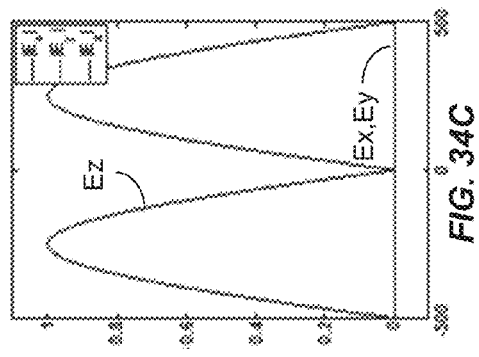
Figure 34B:
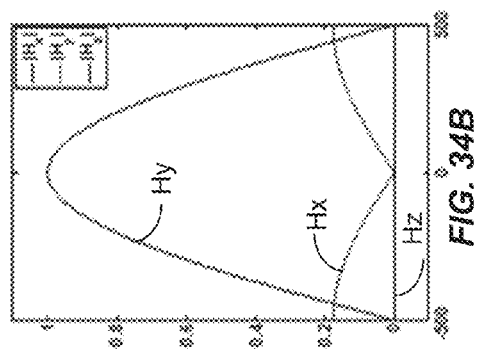
Figure 34A:
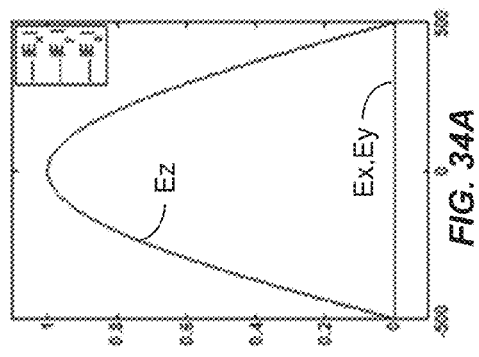
Figure 34E:
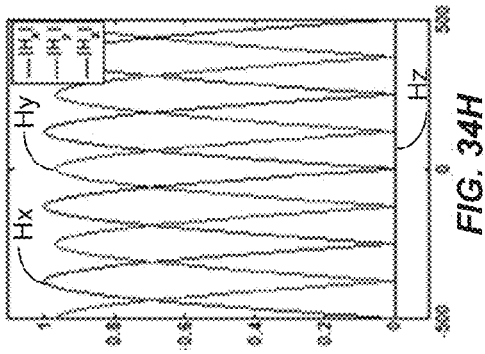
Figure 34F:
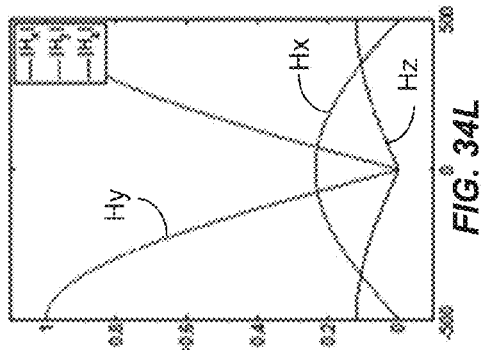
Figure 34G:
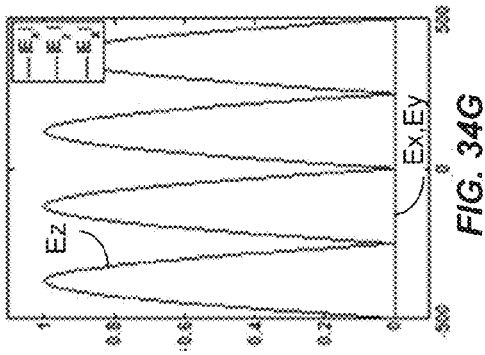
Figure 34H:
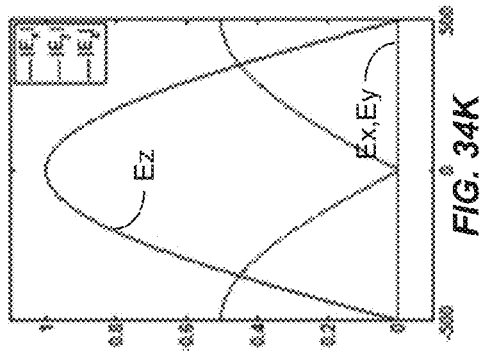
Figure 34I:
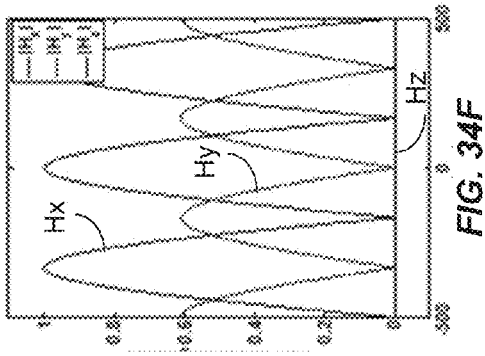
Figure 34J:
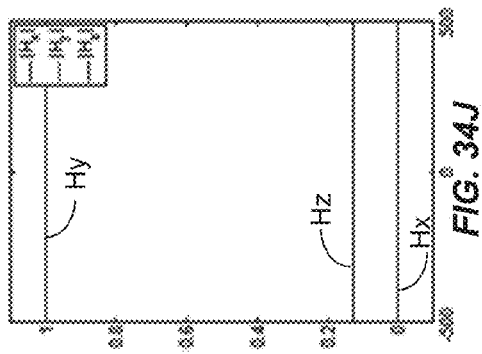
Figure 34K:
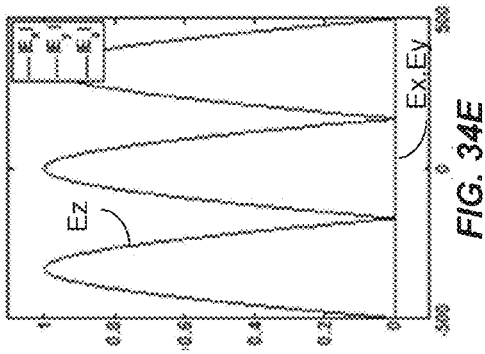
Figure 34L:
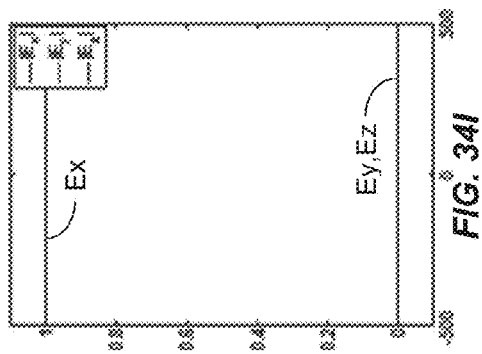

| Mode | E-field component | H-field component |
| --- | --- | --- |
| $TE_{10}$ | FIG. 34A | FIG. 34B |
| $TE_{20}$ | FIG. 34C | FIG. 34D |
| $TE_{30}$ | FIG. 34E | FIG. 34F |
| $TE_{40}$ | FIG. 34G | FIG. 34H |
| $TE_{01}$ | FIG. 34I | FIG. 34J |
| $TE_{11}$ | FIG. 34K | FIG. 34L |
| $TM_{11}$ | FIG. 34M | FIG. 34N |
| $TE_{21}$ | FIG. 34O | FIG. 34P |
| $TM_{21}$ | FIG. 34Q | FIG. 34R |
| $TE_{50}$ | FIG. 34S | FIG. 34T |

FIG. 35A is a simplified perspective view of three dipole antenna provided as MP sensors 3510 with their longitudinal axes oriented in the Y direction of simulated rectangular waveguide 2800 shown in FIG. 28, in accordance with an embodiment of the present invention. FIG. 35B is a simplified perspective view of one of the three dipole antenna provided as MP sensors 3510 shown in FIG. 35A, in accordance with an embodiment of the present invention. A small section or region of top metal layer 2840 adjacent to the dipole is removed to improve the sensor's sensitivity by pushing the mirror current path farther down from the surface. The ground plane region of metal removed is larger than the dipole region of metal. Alternatively the removed region of ground plane and the dipole may be formed on the same metal layer. Each MP sensor 3510 includes a longitudinal axis longer relative to a narrow width perpendicular to the longitudinal axis. MP sensors 3510 each include a sensor port 3520 at their mid-point. The sensor ports are terminated with 50Ω loads. The dipole is formed by patterning a narrow line section in a metal layer below top metal layer 2840 using a mask and photolithographic techniques.

FIG. 36A to FIG. 36J are plots of the simulation results showing the voltage in mV along the Y-axis of each plot picked up by each of the MP sensors 3510, L, C, and R shown in FIG. 35A plotted versus the frequency of excitation in GHz along the X-axis of each plot for each of the first ten propagating modes according to table 8 below. The scales of the axes are the same for all the plots to make comparisons easier.

TABLE 8

Figure 36C:
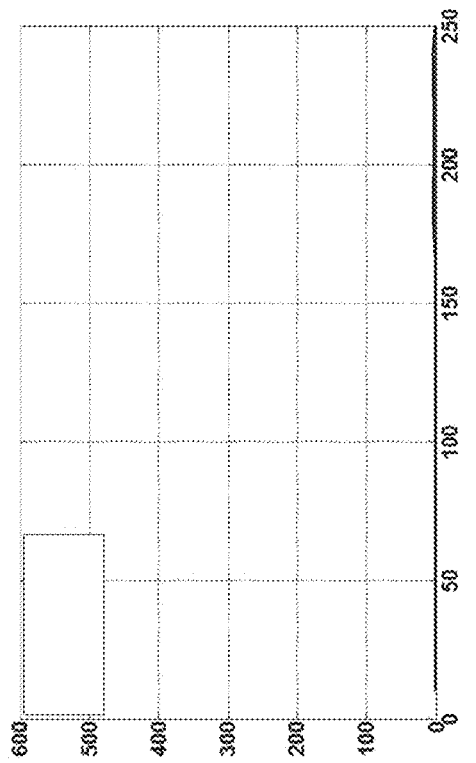
Figure 36D:
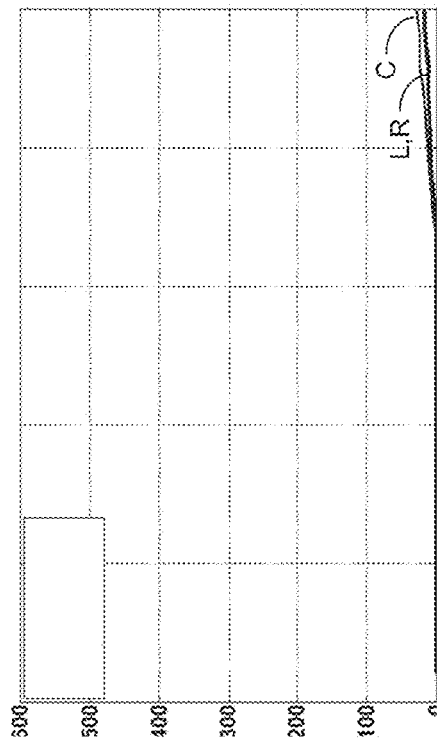
Figure 36E:
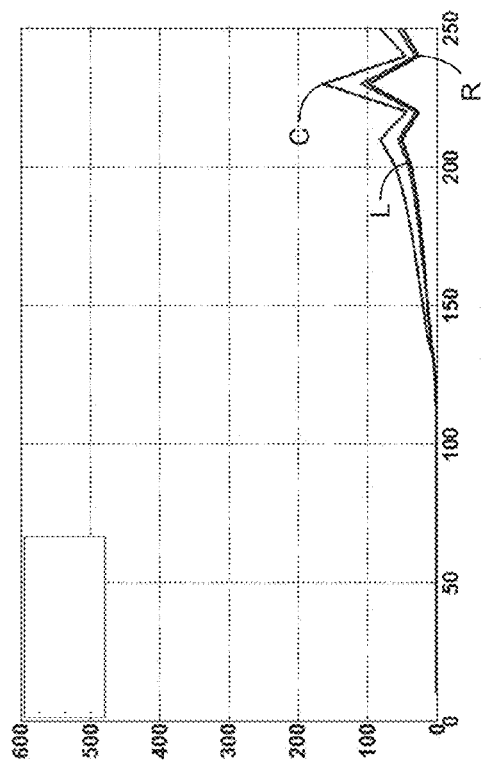
Figure 36F:
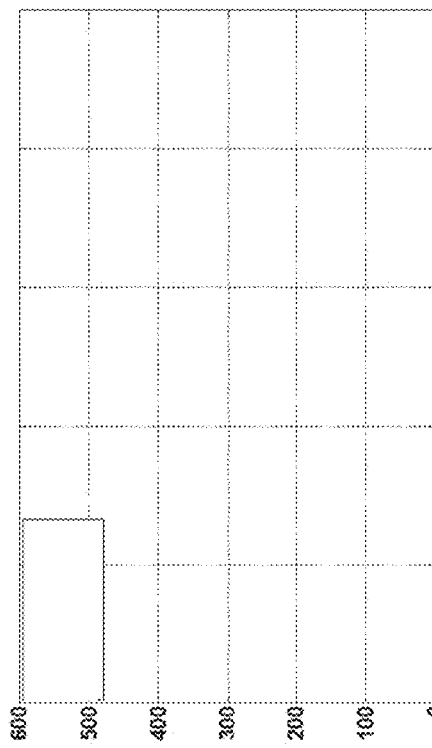

| Mode | FIG. |
| --- | --- |
| $TE_{10}$ | FIG. 36A |
| $TE_{20}$ | FIG. 36B |
| $TE_{30}$ | FIG. 36C |
| $TE_{40}$ | FIG. 36D |
| $TE_{01}$ | FIG. 36E |
| $TE_{11}$ | FIG. 36F |
| $TM_{11}$ | FIG. 36G |
| $TE_{21}$ | FIG. 36H |
| $TM_{21}$ | FIG. 36I |
| $TE_{50}$ | FIG. 36J |

A comparison between the field pattern shown in FIG. 34A to FIG. 34T and the magnitude of the signals picked up by sensors in each excitation mode in FIG. 36A to FIG. 36J reveals that MP sensors 3510 pick up the $E_y$ component of the electromagnetic waves. Since $E_y$ is always zero for TE modes and can be nonzero only for TM modes, MP sensors 3510 acts as a TM mode sensor in this example. As a result we can see that for all the TE modes the strength of the signals is negligible compared to TM modes. For $TM_{21}$ (FIG. 36I), the central sensor does not pick up any signal since $E_y=0$ at the center location while left and right MP sensors 3510 pick up almost equally large signals since $|I_y|$ is maximum at these two points. This conclusion can be also verified by looking at the outputs and field patterns for $TM_{11}$ mode (FIG. 36F). Thus, the information in MP sensors 3510 output is only due to the excited TM modes. In a similar way, an X-oriented dipole antenna is provided in the same manner to provide information on $E_x$ radiation field component, which case is not discussed herein since it exactly follows the same procedure and reasoning as the MP sensors 3510 oriented in the Y direction.

FIG. 37A is a simplified perspective view of three combined TE/TM sensors 3705 with their longitudinal axes oriented in the Y direction of simulated rectangular waveguide 2800 shown in FIG. 28, in accordance with an embodiment of the present invention. FIG. 37B is a simplified perspective view of one of the three combined TE/TM sensors 3705 shown in FIG. 37A, in accordance with an embodiment of the present invention. The TE and TM sensors for the rectangular waveguide described above are combined into one TE/TM sensor which has two output ports 3720 and 3520—one for TE modes and one for TM modes respectively and located at their respective midpoints to detect both modes at the same time and the same location. This is done by reducing the cut-out region of top metal 2840 into a small linear slot antenna 3710 located right above dipole antenna 3510. The slot and the dipole ports are both terminated with 50Ω loads. The Y-oriented slot on top detects the TE modes while the Y-oriented dipole, which is placed 10 μm lower, detects the TM modes.

FIG. 38A to FIG. 38J are plots of the simulation results showing the voltage in mV along the Y-axis of each plot picked up by each of combined TE/TM sensors 3705, CD, CS, LD, LS, RD, and RS shown in FIG. 37A plotted versus the frequency of excitation in GHz along the X-axis of each plot for each of the first ten propagating modes according to table 9 below. FIG. 38A to FIG. 38J show the magnitude of the voltages picked up by the TE/TM sensors plotted using the same scale for all modes. Solid lines show the outputs of dipoles 3510, i.e. TM outputs 3520, while the dashed lines correspond to the slots 3710, i.e. TE outputs 3720.

TABLE 9

Figure 38D:
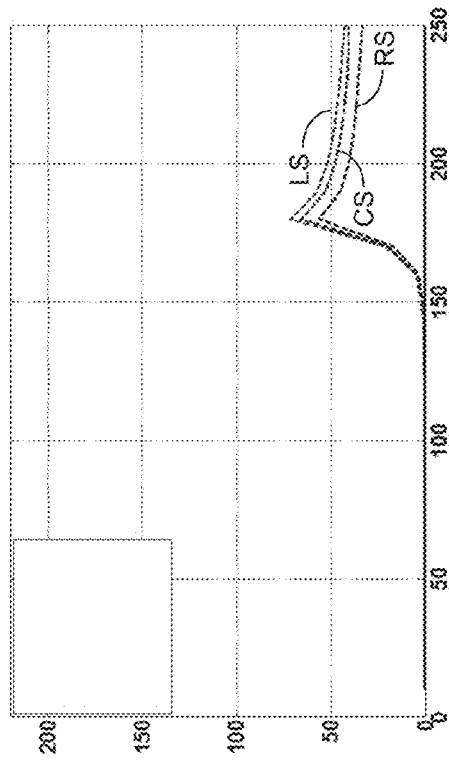
Figure 38F:
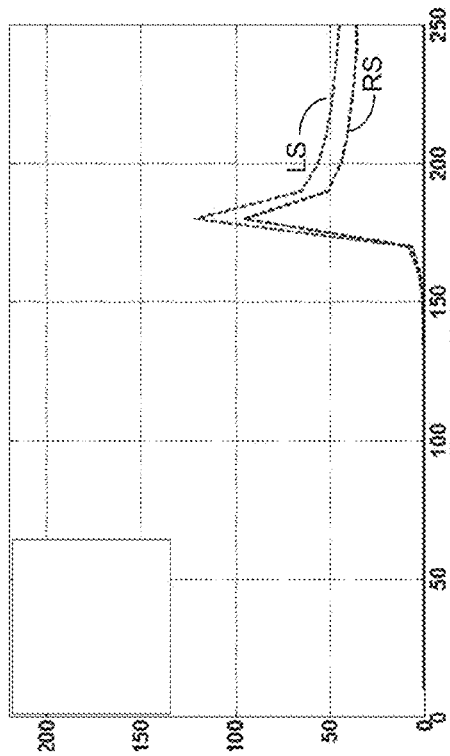
Figure 38C:
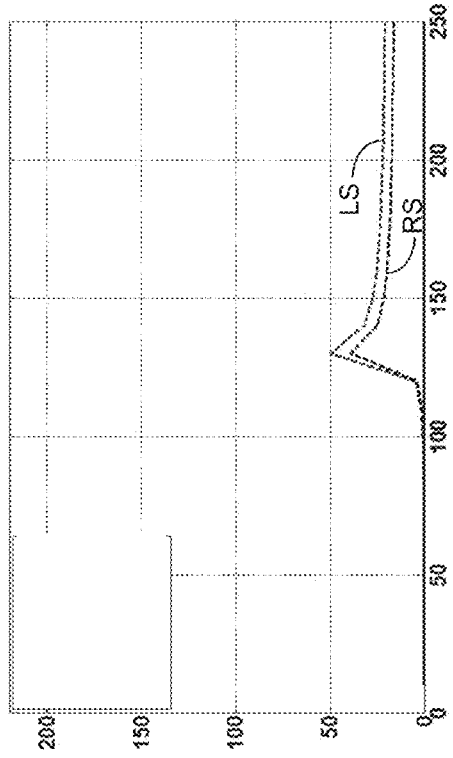
Figure 38E:
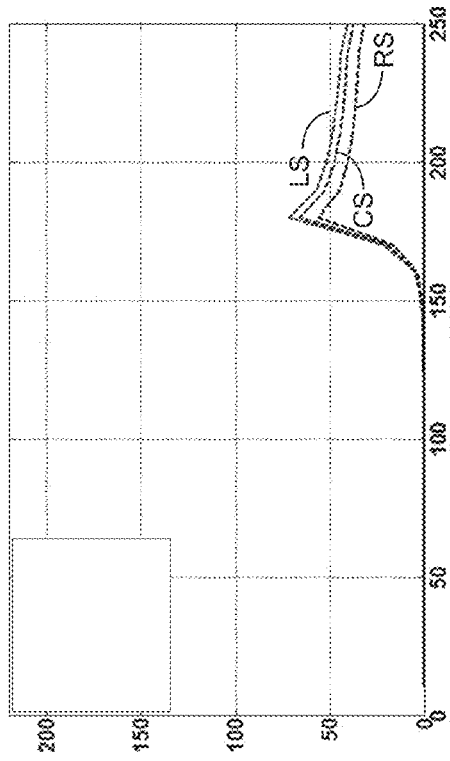
Figure 38G:
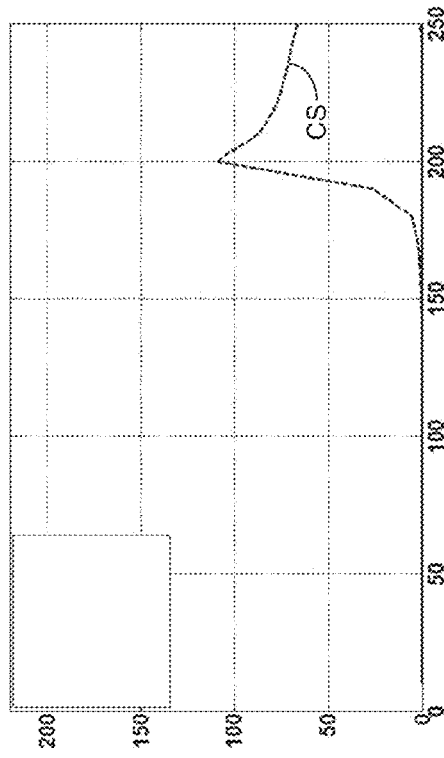
Figure 38H:
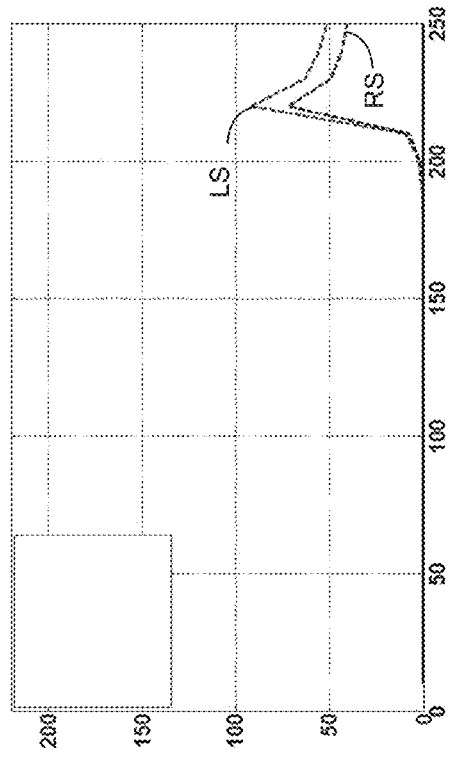
Figure 38I:
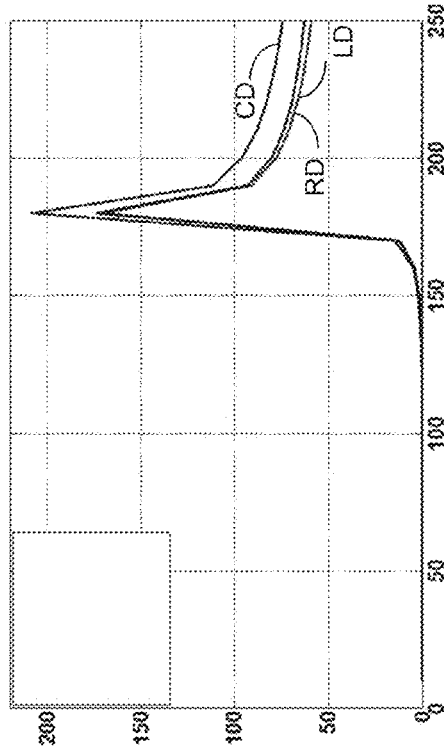
Figure 38J:
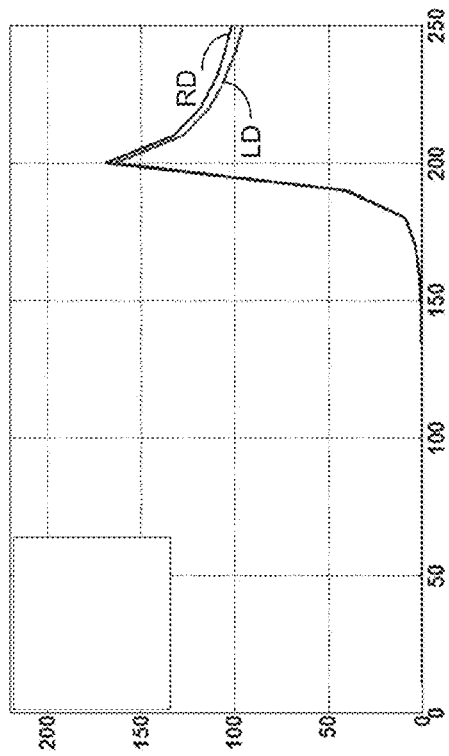

| Mode | FIG. |
| --- | --- |
| $TE_{10}$ | FIG. 38A |
| $TE_{20}$ | FIG. 38B |
| $TE_{30}$ | FIG. 38C |
| $TE_{40}$ | FIG. 38D |
| $TE_{01}$ | FIG. 38E |
| $TE_{11}$ | FIG. 38F |
| $TM_{11}$ | FIG. 38G |
| $TE_{21}$ | FIG. 38H |
| $TM_{21}$ | FIG. 38I |
| $TE_{50}$ | FIG. 38J |

For example, for $TM_{11}$ (FIG. 38F) and $TM_{21}$ (FIG. 38H) modes, all slot output ports 3720, i.e. TE outputs—dashed lines, are zero, while dipole output ports 3520, i.e. TM outputs—solid lines, indicate the strength of the $E_y$ component of these TM modes. Similarly, all the TM outputs are zero when only TE modes are excited and $H_y$ component is picked up by slot antennas 3710. For both cases the relative magnitude of the outputs follows the magnitude of corresponding field component shown in FIG. 34A to FIG. 34T, i.e. $H_y$ for slots and $E_y$ for dipoles.

Figure 40:
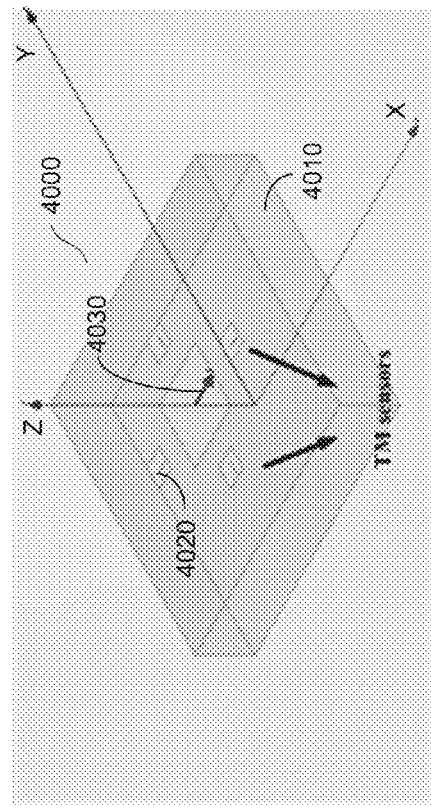
FIG. 40 is a simplified perspective view of an electromagnetic radiator system in an integrated circuit substrate with a multitude of TM sensors, in accordance with an embodiment of the present invention.
Figure 39:
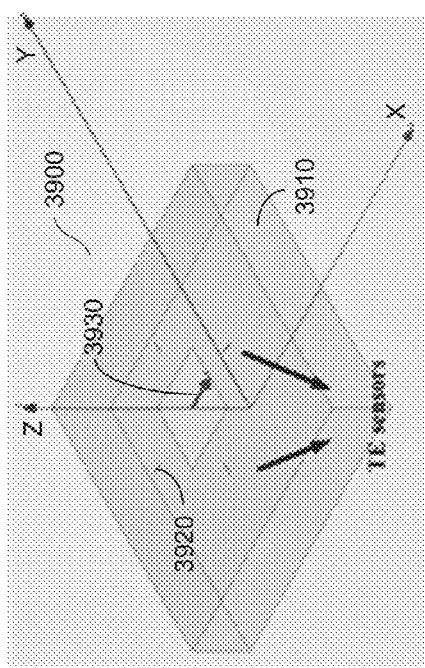
FIG. 39 is a simplified perspective view of an electromagnetic radiator system in an integrated circuit substrate with a multitude of TE sensors, in accordance with an embodiment of the present invention.

According to an embodiment of the present invention, the TE and TM sensors discussed above, may also be implemented on an integrated circuit chip to identify the excited substrate modes. FIG. 39 is a simplified perspective view of an electromagnetic radiator system 3900 in an integrated circuit substrate 3910 with a multitude of TE sensors 3920, in accordance with an embodiment of the present invention. Four TE sensors are formed on the positive and negative sides of the X and Y axes. FIG. 40 is a simplified perspective view of an electromagnetic radiator system 4000 in an integrated circuit substrate 4010 with a multitude of TM sensors 4020, in accordance with an embodiment of the present invention. Four TM sensors are implemented on the positive and negative sides of X and Y axes. Both FIG. 39 and FIG. 40 provide a Hertzian dipole excitation 3930 and 4030 respectively located at the center along the X-axis on the electromagnetic radiator systems. From theory, when a Hertzian dipole excitation exists on the interface between air and the substrate material, surface waves start to propagate in different directions. In X+ and X− directions only TE modes propagate while in Y+ and Y− directions only TM modes propagate. So in our experiment it is expected that $V_{X+}$ and $V_{X-}$ are much larger than $V_{Y+}$ and $V_{Y-}$ for TE sensors while $V_{Y+}$ and $V_{Y-}$ should be much larger than $V_{X+}$ and $V_{X-}$ for TM sensors.

Figure 42:
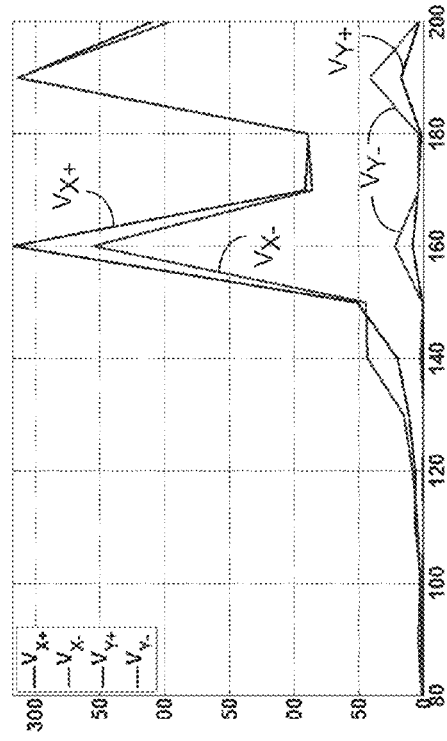
FIG. 42 is a plot of the simulation results showing the voltage picked up by each of the TM sensors shown in FIG. 40 plotted versus the frequency of excitation.
Figure 41:
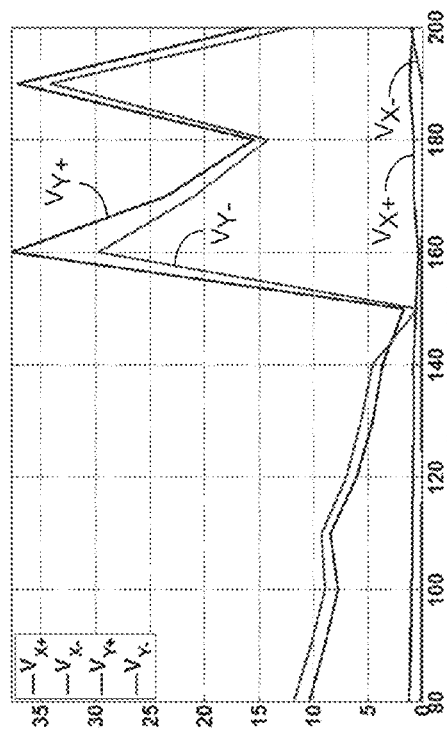
FIG. 41 is a plot of the simulation results showing the voltage picked up by each of the TE sensors shown in FIG. 39 plotted versus the frequency of excitation.

FIG. 41 is a plot of the simulation results showing the voltage in mV along the Y-axis of the plot picked up by each of the TE sensors shown in FIG. 39 plotted versus the frequency of excitation in GHz along the X-axis of the plot. FIG. 42 is a plot of the simulation results showing the voltage in mV along the Y-axis of the plot picked up by each of the TM sensors shown in FIG. 40 plotted versus the frequency of excitation in GHz along the X-axis of the plot. FIG. 41 shows that for TE sensors $V_{Y+}$ and $V_{Y-}$ are almost zero while $V_{X+}$ and $V_{X-}$ take almost equal non-zero values. On the other hand, FIG. 42 for TM sensors shows $V_{X+}$ and $V_{X-}$ are almost zero while $V_{Y+}$ and $V_{Y-}$ take almost equal non-zero values. Thus, the outputs of the sensors match the theory.

Other applications of this self-healing system are to heal not for EM radiation, but other types of radiation such as acoustic radiation. By placing pickup audio sensors strategically compared to the main audio radiator, the far field audio profile may be manipulated and healed to provide the optimum experience, whether that is in terms of frequency balance, power projection (directivity) or some other important metric of interest.

The above embodiments of the present invention are illustrative and not limiting. Various alternatives and equivalents are possible. Although, the invention has been described with reference to an integrated circuit substrate by way of an example, it is understood that the invention is not limited by the process technology. Other additions, subtractions, or modifications are obvious in view of the present disclosure and are intended to fall within the scope of the appended claims.

What is claimed is:

1. A sensing structure comprising:
    at least one radiator formed on or above a substrate and adapted to generate an electromagnetic wave;
    a first sensor formed on or above the substrate and adapted to detect the electromagnetic wave in the substrate; and
    a second sensor formed on or above the substrate and adapted to detect the electromagnetic wave in the substrate, wherein said first and second sensors are positioned symmetrically with respect to the at least one radiator.

2. The sensing structure of claim 1, wherein the first sensor is adapted to detect a characteristic of the electromagnetic wave selected from a group consisting of a substrate mode, surface mode, radiation direction, polarization, phase, and power.

3. The sensing structure of claim 1, wherein the first sensor is adapted to detect a mode associated with the electromagnetic wave selected from a group consisting of a transverse magnetic mode, transverse electric mode, and transverse electromagnetic mode.

4. The sensing structure of claim 1, wherein the first sensor is selected from a group consisting of a slot, a ring, a monopole, and a dipole.

5. The sensing structure of claim 1, wherein the first sensor includes a loop antenna.

6. The sensing structure of claim 1, wherein the first sensor includes a slot formed into a loop.

7. The sensing structure of claim 1 further comprising a ground plane formed on or above the substrate, wherein the first sensor is formed in the ground plane.

8. The sensing structure of claim 1, wherein the first sensor is oriented along a first polarization direction of the electromagnetic wave and wherein the second sensor is oriented along a second polarization direction of the electromagnetic wave different from the first polarization direction.

9. The sensing structure of claim 1 further comprising:
    a first circuit adapted to detect signals generated by the first and second sensors;
    a second circuit adapted to drive the at least one radiator; and
    a third circuit adapted to control the second circuit in response to an output signal of the first circuit.

10. The sensing structure of claim 1 further comprising at least a second radiator formed on or above the substrate.

11. The sensing structure of claim 10, wherein the at least first and second radiators form a phased array of radiators.

12. The sensing structure of claim 10, wherein each of the at least first and second radiators includes a plurality of drive ports.

13. The sensing structure of claim 10, wherein each of the at least first and second radiators includes a first drive port having a first drive phase and a second drive port having a second drive phase different than the first drive phase.

14. The sensing structure of claim 10 further comprising:
    a first metal region formed on or above the substrate and adapted to form a ground plane, wherein a first portion of the ground plane is removed to form a first portion of the first sensor; and
    a second metal region formed on or above the substrate, a portion of the at least first and second radiators formed in the second metal region, a second portion of the ground plane being removed adjacent the at least first and second radiators, the first portion of the ground plane being smaller than the second portion of the ground plane.

15. The sensing structure of claim 14 further comprising a third metal region formed on or above the substrate below the first metal region and adapted to form a second portion of the first sensor smaller than the first portion of the first sensor.

16. The sensing structure of claim 15, wherein the second portion of the first sensor is a dipole and the first portion of the first sensor is larger than the dipole.

17. The sensing structure of claim 14 further comprising a third metal region formed on or above the substrate below the first metal region and adapted to form a second portion of the first sensor, wherein the first portion is a slot and the second portion is a dipole.

18. The sensing structure of claim 10 further comprising:
a first circuit adapted to detect signals generated by the first and second sensors;
a second circuit adapted to drive the at least first and second radiators; and
a third circuit adapted to control the second circuit in response to an output signal of the first circuit.

19. The sensing structure of claim 18, wherein the second circuit is adapted to control power levels of the at least first and second radiators.

20. The sensing structure of claim 18, wherein the second circuit is further adapted to control phases of the at least first and second radiators.

21. The sensing structure of claim 18, wherein the third circuit comprises:
an analog to digital converter;
a digital to analog converter; and
a controller coupled between the analog to digital converter and the digital to analog converter.

22. The sensing structure of claim 1 wherein said substrate is:
a dielectric substrate.

23. The sensing structure of claim 1 wherein said symmetry is defined in a plane substantially perpendicular to a direction of propagation of the electromagnetic wave.
a dielectric substrate.

24. A method for sensing an electromagnetic wave comprising:
generating the electromagnetic wave from at least a first radiator formed on or above a substrate;
sensing the electromagnetic wave in the substrate using a first sensor formed on or above the substrate;
sensing the electromagnetic wave in the substrate using a second sensor formed on or above the substrate, wherein said first and second sensors are positioned symmetrically with respect to the at least first radiator.

25. The method of claim 24, wherein the first sensor is adapted to sense a characteristic the electromagnetic wave selected from a group consisting of a substrate mode, surface mode, radiation direction, polarization, phase, and power.

26. The method of claim 24, wherein the first sensor is adapted to detect a mode associated with the electromagnetic wave selected from a group consisting of a transverse magnetic mode, transverse electric mode, and transverse electromagnetic mode.

27. The method of claim 24, wherein the first sensor is selected from a group consisting of a slot, a ring, a monopole, and a dipole.

28. The method of claim 24, wherein the first sensor includes a loop antenna.

29. The method of claim 24, wherein the first sensor includes a slot formed into a loop.

30. The method of claim 24 further comprising forming a ground plane on or above the substrate, wherein the first sensor is formed in the ground plane.

31. The method of claim 24, wherein the first sensor is oriented along a first polarization direction of the electromagnetic wave, and wherein the second sensor is oriented along a second polarization direction of the electromagnetic wave, different from the first polarization direction.

32. The method of claim 24 further comprising:
generating the electromagnetic wave from at least a second radiator formed on or above the substrate.

33. The method of claim 32, wherein the at least first and second radiators include a phased array of radiators.

34. The method of claim 32, wherein each of the at least first and second radiators form a plurality of drive ports.

35. The method of claim 32, wherein each of the at least first and second radiators includes a first drive port having a first drive phase and a second drive port having a second drive phase different than the first drive phase.

36. The method of claim 32 further comprising:
forming a first metal region on or above the substrate to form a ground plane;
removing a first portion of the ground plane to form a first portion of the first sensor;
forming a second metal region on or above the substrate, a portion of the at least first and second radiators formed in the second metal region; and
removing a second portion of the ground plane adjacent the at least first and second radiators, the first portion of the ground plane being smaller than the second portion of the ground plane.

37. The method of claim 36 further comprising:
forming a third metal region on or above the substrate below the first metal region to form a second portion of the first sensor smaller than the first portion of the first sensor.

38. The method of claim 37, wherein the second portion of the first sensor is a dipole and the first portion of the first sensor is larger than the dipole.

39. The method of claim 36 further comprising forming a third metal region on or above the substrate below the first metal region to form a second portion of the first sensor, wherein the first portion is a slot and the second portion is a dipole.

40. The method of claim 32 further comprising:
detecting a first signal generated by the first sensor; and
driving the one or more radiators in response to the first signal.

41. The method of claim 40, wherein the driving includes controlling a power level applied to the at least first and second radiators.

42. The method of claim 40, wherein the driving includes controlling phases of the at least first and second radiators.

43. The method of claim 40, wherein the controlling comprises:
converting an analog signal from the detected first signal to a digital signal;
executing an algorithm digitally to maintain the electromagnetic waves in predetermined states; and
converting a digital signal from the executed algorithm to an analog signal.

44. The method of claim 24 wherein said substrate is a dielectric substrate.

45. The method of claim 24 wherein said symmetry is defined in a plane substantially perpendicular to a direction of propagation of the electromagnetic wave.

* * * * *

UNITED STATES PATENT AND TRADEMARK OFFICE
CERTIFICATE OF CORRECTION

| | | |
|---|---|---|
| PATENT NO. | : 9,921,255 B2 | Page 1 of 1 |
| APPLICATION NO. | : 13/766667 | |
| DATED | : March 6, 2018 | |
| INVENTOR(S) | : Steven Bowers et al. | |

It is certified that error appears in the above-identified patent and that said Letters Patent is hereby corrected as shown below:

In Claim 23, at Column 23, Line 26, delete the text "a dielectric substrate.".

Signed and Sealed this
Nineteenth Day of June, 2018

Andrei Iancu
*Director of the United States Patent and Trademark Office*